(12) United States Patent
Ko et al.

(10) Patent No.: US 11,948,843 B2
(45) Date of Patent: Apr. 2, 2024

(54) METHOD FOR FORMING HARDMASK FORMATION BY HYBRID MATERIALS IN SEMICONDUCTOR DEVICE

(71) Applicant: TAIWAN SEMICONDUCTOR MANUFACTURING COMPANY, LTD., Hsinchu (TW)

(72) Inventors: Chung-Ting Ko, Kaohsiung (TW); Sung-En Lin, Hsinchu County (TW); Chi-On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 239 days.

(21) Appl. No.: 17/396,506

(22) Filed: Aug. 6, 2021

(65) Prior Publication Data
US 2023/0039630 A1   Feb. 9, 2023

(51) Int. Cl.
| | |
|---|---|
| *H01L 21/8234* | (2006.01) |
| *B82Y 10/00* | (2011.01) |
| *H01L 21/02* | (2006.01) |
| *H01L 21/033* | (2006.01) |
| *H01L 21/308* | (2006.01) |
| *H01L 27/088* | (2006.01) |
| *H01L 29/06* | (2006.01) |
| *H01L 29/165* | (2006.01) |
| *H01L 29/423* | (2006.01) |

(Continued)

(52) U.S. Cl.
CPC .. *H01L 21/823481* (2013.01); *H01L 21/0332* (2013.01); *H01L 21/0337* (2013.01); *H01L 27/088* (2013.01)

(58) Field of Classification Search
CPC ......... H01L 21/02164; H01L 21/02181; H01L 21/022; H01L 29/0673; H01L 29/42392; H01L 29/66439; H01L 29/775; H01L 29/78696; H01L 21/0332; H01L 21/0337; H01L 21/3083; H01L 29/6681; H01L 21/0214; H01L 21/02148; H01L 21/02356; H01L 21/823481; H01L 29/7843
See application file for complete search history.

(56) References Cited

U.S. PATENT DOCUMENTS 9,209,247 B2   12/2015   Colinge et al.
9,236,267 B2    1/2016   De et al.
(Continued)

*Primary Examiner* — Sonya McCall-Shepard
(74) *Attorney, Agent, or Firm* — Maschoff Brennan

(57) ABSTRACT

A semiconductor device includes a substrate, first and second semiconductor strips, a dummy fin structure, first and second channel layers, a gate structure, and crystalline and amorphous hard mask layers. The first and second semiconductor strips extend upwardly from the substrate and each has a length extending along a first direction. The dummy fin structure is laterally between the first and second semiconductor strips. The first and second channel layers extend in the first direction above the first and second semiconductor strips and are arranged in a second direction substantially perpendicular to the substrate. The crystalline hard mask layer extends upwardly from the dummy fin structure and has an U-shaped cross section. The amorphous hard mask layer is in the crystalline hard mask layer. The amorphous hard mask layer has an U-shaped cross section conformal to the U-shaped cross section of the crystalline hard mask layer.

20 Claims, 44 Drawing Sheets

(51) Int. Cl.
    *H01L 29/66*     (2006.01)
    *H01L 29/775*    (2006.01)
    *H01L 29/78*     (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0067446 A1* | 2/2019 | Ching ................. H01L 27/0924 |
| 2021/0028068 A1* | 1/2021 | Dentoni Litta .............................. H01L 21/823828 |

* cited by examiner

METHOD FOR FORMING HARDMASK FORMATION BY HYBRID MATERIALS IN SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
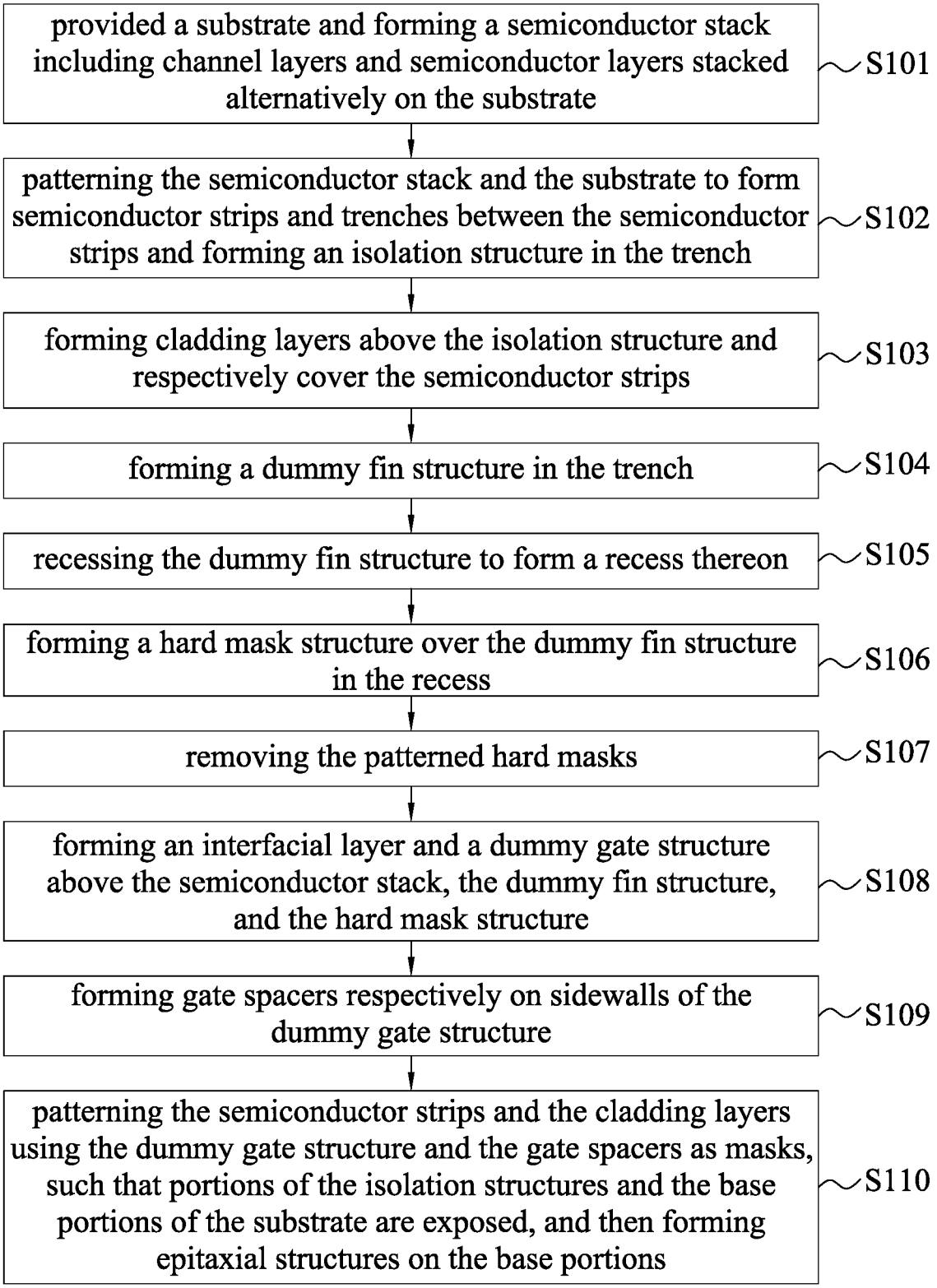
FIGS. 1A and 1B illustrate a block diagram of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanowire channels, bar-shaped channels, and/or other suitable channel configurations. In some embodiments, the channel region of a GAA device may have multiple horizontal nanowires or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure. In addition, the embodiments of the disclosure may also be applied, however, to a variety of metal oxide semiconductor transistors (e.g., complementary-field effect transistor (CFET) and fin field effect transistor (FinFET)).

Figure 1B:
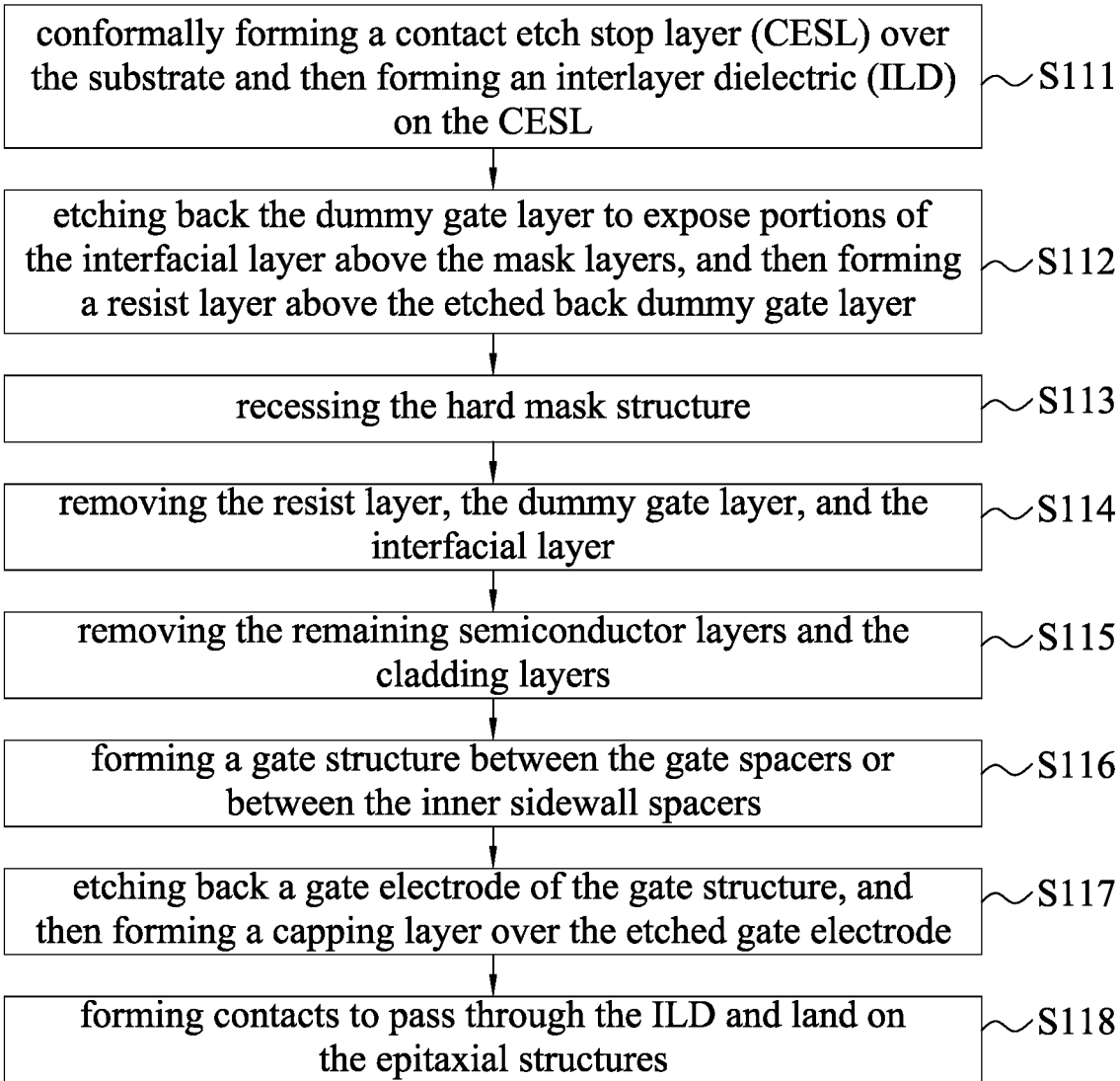

Referring now to FIGS. 1A and 1B, illustrated are an exemplary method M for fabrication of a semiconductor device in accordance with some embodiments. The method M includes a relevant part of the entire manufacturing process. It is understood that additional operations may be provided before, during, and after the operations shown by FIGS. 1A and 1B, and some of the operations described below can be replaced or eliminated for additional embodiments of the method. The order of the operations/processes may be interchangeable. The method M includes fabrication of a GAA device. However, the fabrication of GAA device is merely example for describing the manufacturing process according to some embodiments of the present disclosure.

FIGS. 2-31 illustrate a semiconductor device 100 at various stages of the method M according to some embodiments of the present disclosure. In some embodiments, the semiconductor device shown in FIGS. 2-31 may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2:
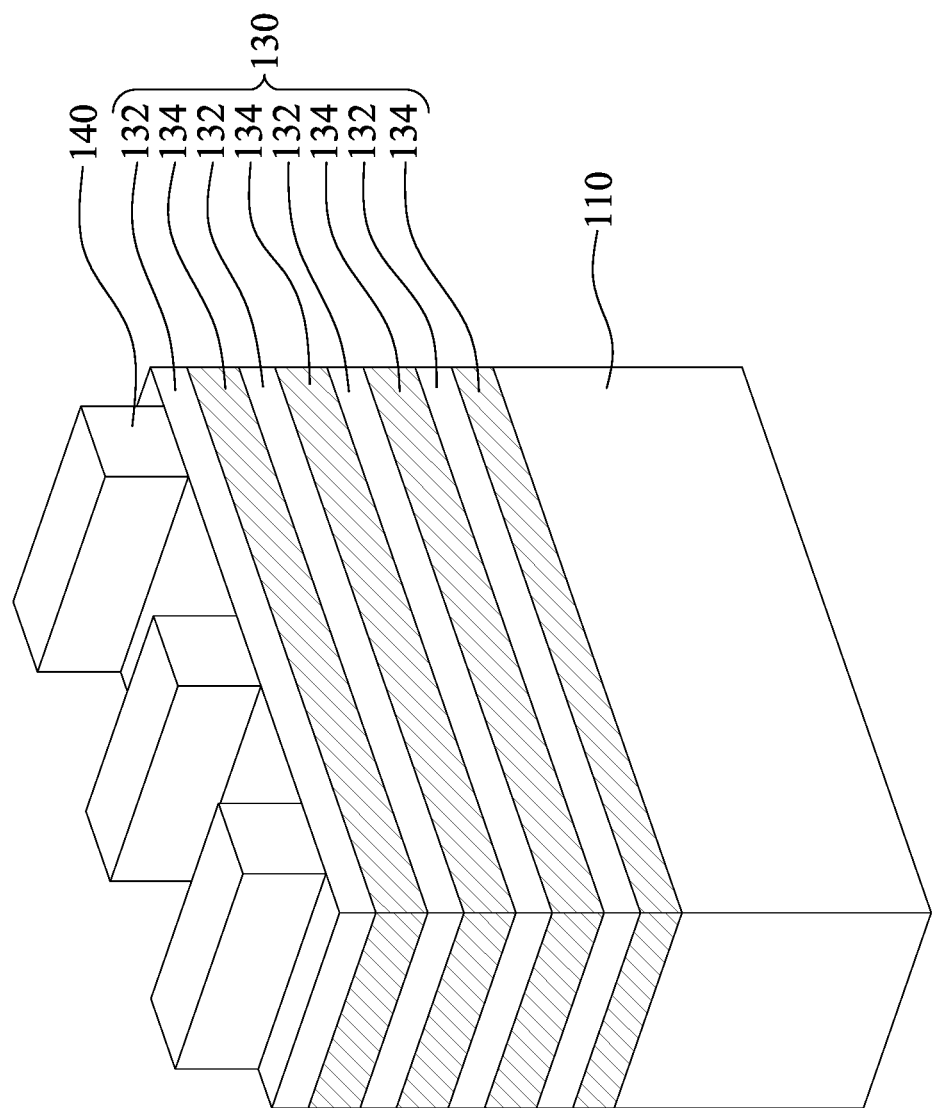
FIGS. 2-6, 7A, 8A, 9A, 10A, 11A, 12A, 13-24, 25A, 26A, 27A, 28A, 29A, 30A, and 31 illustrate a semiconductor device at various stages of the method in FIGS. 1A and 1B according to some embodiments of the present disclosure.

The method M begins at block S101 where a substrate is provided and a semiconductor stack is formed on the substrate 110, in which the semiconductor stack includes channel layers and semiconductor layers stacked alternatively. Referring to FIG. 2, in some embodiments of block S101, a substrate 110, which may be a part of a wafer, is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A semiconductor stack 130 is formed on the substrate 110 through epitaxy, such that the semiconductor stack 130 forms crystalline layers. The semiconductor layers 134 are referred to as channels layers of the semiconductor device. The semiconductor stack 130 includes semiconductor layers 132 and 134 stacked alternatively. In some embodiments, the germanium percentage of the semiconductor layers 132 is in the range between about 20 percent and about 30 percent. In some embodiments, the thickness of the semiconductor layers 132 is in the range between about 5 nm and about 15 nm. The semiconductor layers 134 may be pure silicon layers that are free from germanium. The semiconductor layers 134 may also be substantially pure silicon layers, for example, with a germanium percentage lower than about 1 percent. Furthermore, the semiconductor layers 134 may be intrinsic, which are not doped with p-type and n-type impurities. There may be two, three, four, or more of the semiconductor layers 134. In some embodiments, the thickness of the semiconductor layers 134 is in the range between about 3 nm and about 10 nm. In some other embodiments, however, the semiconductor layers 134 can be silicon germanium or germanium for p-type semiconductor device, or can be III-V materials, such as InAs, InGaAs, InGaAsSb, GaAs, InPSb, or other suitable materials.

A patterned hard mask 140 is formed over the semiconductor stack 130. In some embodiments, the patterned hard mask 140 is formed of silicon nitride, silicon oxynitride, silicon carbide, silicon carbo-nitride, or the like. The patterned hard mask 140 covers a portion of the semiconductor stack 130 while leaves another portion of the semiconductor stack 130 uncovered.

Figure 3:
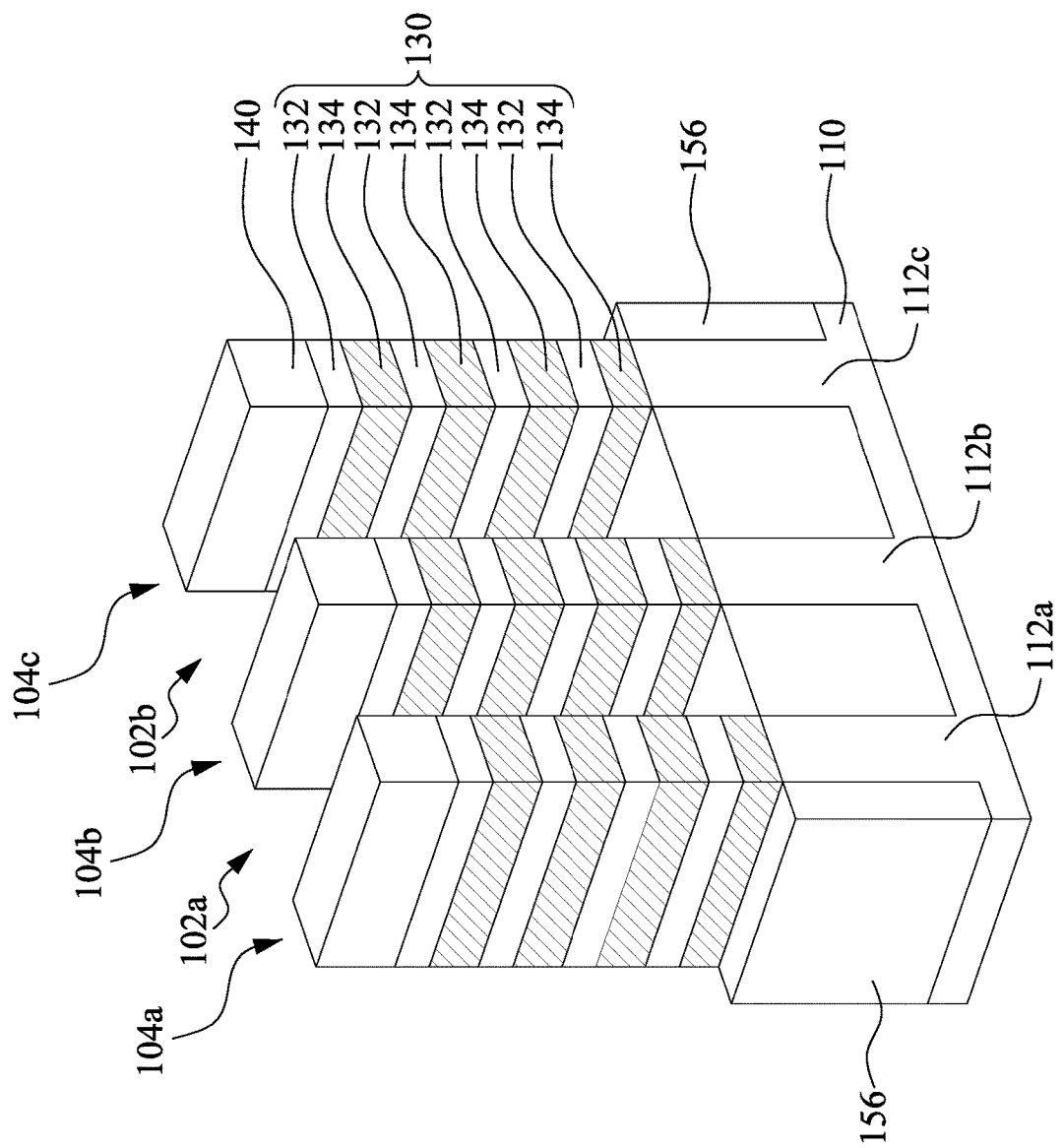

Returning to FIG. 1A, the method M then proceeds to block S102 where the semiconductor stack and the substrate are patterned to form a plurality of semiconductor strips and trenches between the semiconductor strips, and then an isolation structure is formed in the trench. With reference to FIG. 3, in some embodiments of block S102, the semiconductor stack 130 and the substrate 110 of FIG. 2 are patterned using the patterned hard mask 140 as a mask to form trenches 102a and 102b. Accordingly, a plurality of semiconductor strips 104a, 104b, and 104c are formed. In FIG. 3, the trench 102b has a greater width than the trench 102a. In other words, a distance between the semiconductor strips 104b and 104c is greater than a distance between the semiconductor strips 104a and 104b. In some embodiments, the trench 102b has a width substantially the same as the trench 102a. The trenches 102a and 102b extend into the substrate 110, and have lengthwise directions substantially parallel to each other. The trenches 102 form base portions 112a, 112b, and 112c in the substrate 110, where the base portions 112a, 112b, and 112c protrude from the substrate 110, and the semiconductor strips 104a, 104b, and 104c are respectively formed above the base portions 112a, 112b, and 112c of the substrate 110. The remaining portions of the semiconductor stack 130 are accordingly referred to as the semiconductor strips 104a, 104b, and 104c alternatively.

Isolation structures 156, which may be shallow trench isolation (STI) regions, are formed in the trenches 102a and 102b. The formation may include filling the trenches 102 with a dielectric layer(s), for example, using flowable chemical vapor deposition (FCVD), and performing a chemical mechanical polish (CMP) to level the top surface of the dielectric material with the top surface of the hard mask 140. The isolation structures 156 are then recessed. In some embodiments, each of the isolation structures 156 may include a first liner layer, a second liner layer, and a filling material. The first liner layer is in contact with the substrate 110 and may be a dielectric layer, such as silicon oxide, silicon nitride, silicon oxynitride, SiCN, $SiC_xO_yN_z$, or combinations thereof. The second liner layer is on and in contact with the first liner layer and may be a semiconductor layer such as a silicon layer. The filling material is on and in contact with the second liner layer and may be a dielectric material, such as silicon oxide, silicon nitride, silicon oxynitride, SiCN, $SiC_xO_yN_z$, or combinations thereof. In some other embodiments, the second liner layer is omitted. In still some other embodiments, the first and second liner layers and are omitted. The STI region may also be interchangeably referred to as an isolation dielectric in this context.

Figure 4:
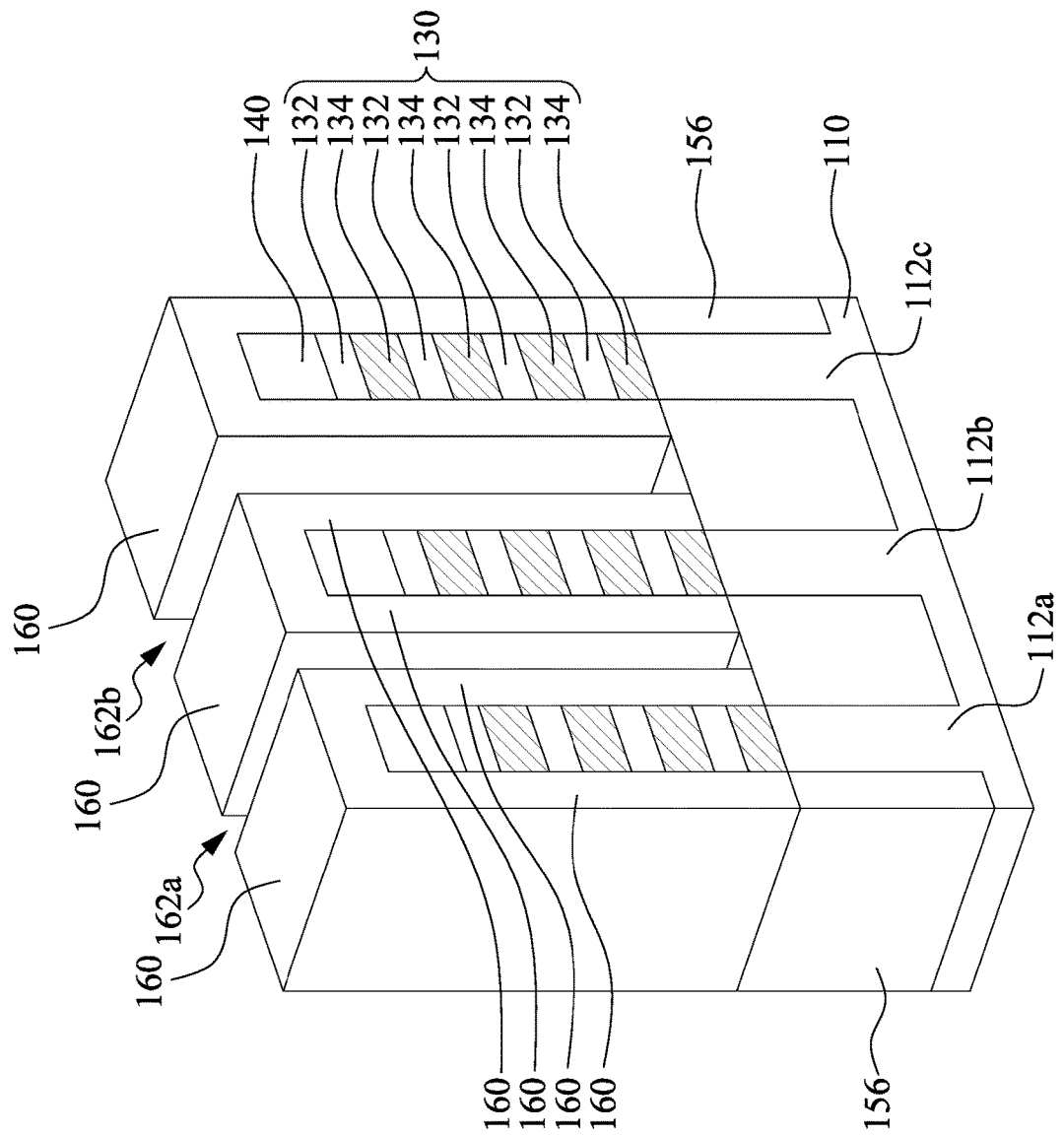

Returning to FIG. 1A, the method M then proceeds to block S103 where cladding layers are formed above the isolation structure and respectively cover the semiconductor strips. With reference to FIG. 4, in some embodiments of block S103, cladding layers 160 are formed above the isolation structures 156 and respectively cover the semiconductor strips 104 (see FIG. 3). In some embodiments, the cladding layers 160 are made of semiconductor materials, such as SiGe or other suitable materials. In some embodiments, the cladding layers 160 and the semiconductor layers 132 may have substantially the same or similar materials/components, such the cladding layers 160 and the semiconductor layers 132 have similar etching rates under the same etchant. The cladding layers 160 are separated from each other, such that trenches 162a and 162b are formed therebetween. In FIG. 4, the trench 162b has a greater width than the trench 162a. In some embodiments, the trench 162b has a width substantially the same as the trench 162a.

Figure 5:
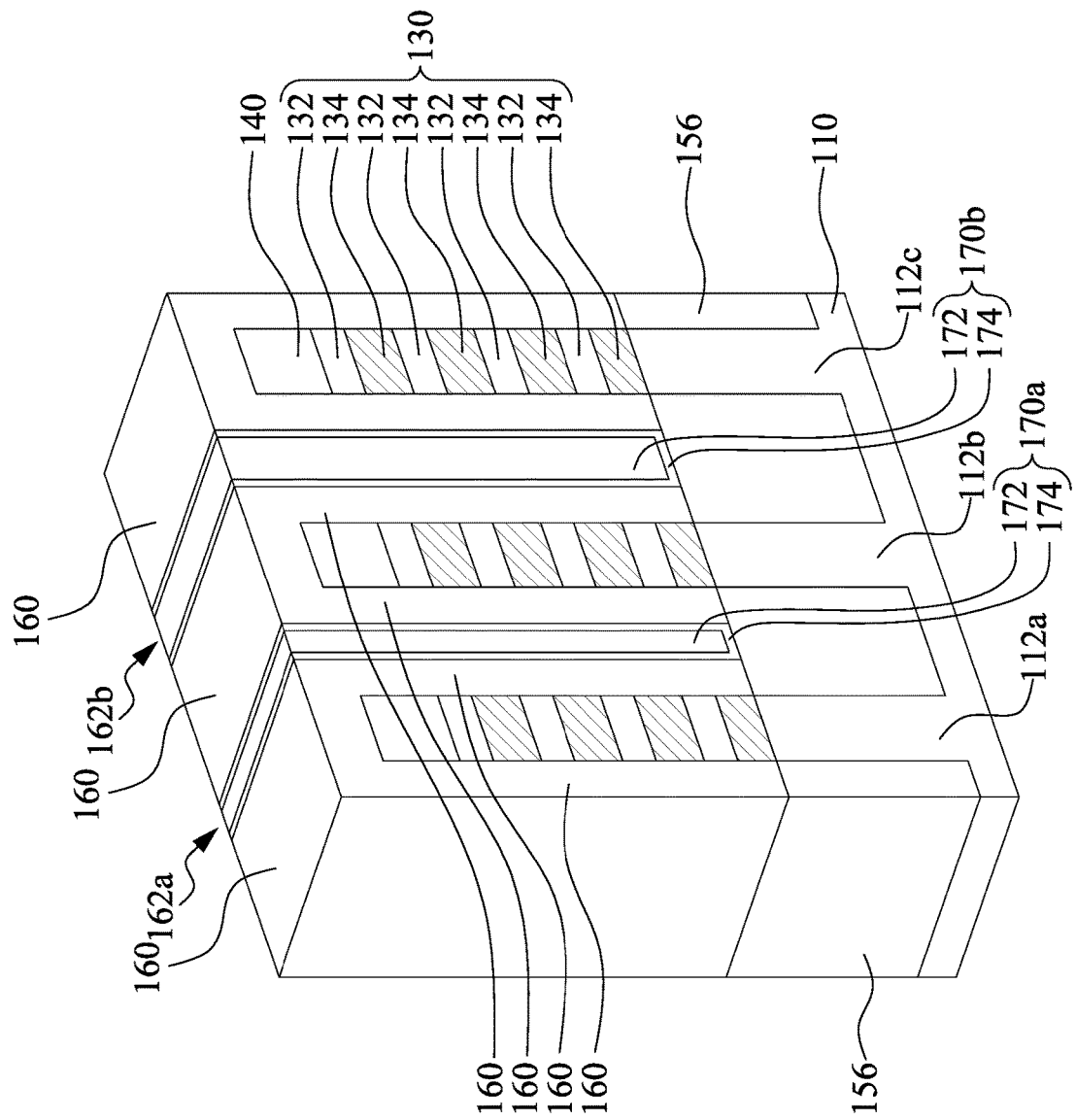

Returning to FIG. 1A, the method M then proceeds to block S104 where a dummy fin structure is formed in the trench. With reference to FIG. 5, in some embodiments of block S104, a plurality of dummy fin structures 170a and 170b are respectively formed in the trenches 162a and 162b (see FIG. 4). In some embodiments, a dielectric layer is conformally formed above the structure in FIG. 4, and a filling material is filled in the trenches 162a and 162b. A planarization (e.g., CMP) process is then performed to remove excess portions of the dielectric layer and the filling material to form the dummy fin structures 170a and 170b respectively in the trenches 162a and 162b. As such, each of the dummy fin structures 170a and 170b includes a dielectric layer 172 and a dummy fin 174 above the dielectric layer 172. In FIG. 5, the dummy fin structure 170b has a greater width than the dummy fin structure 170a. In some embodiments, the dummy fin structure 170b has a width substantially the same as the dummy fin structure 170a. In some embodiments, the dielectric layer 172 is deposited with an ALD process or other suitable processes. In some embodiments, the dielectric layer 172 and the dummy fin 174 include silicon nitride, silicon oxide, silicon oxynitride, SiCN, SiCON, SiOC, or other suitable materials. For example, the dielectric layer 172 includes silicon nitride, and the dummy fin includes silicon dioxide.

Figure 6:
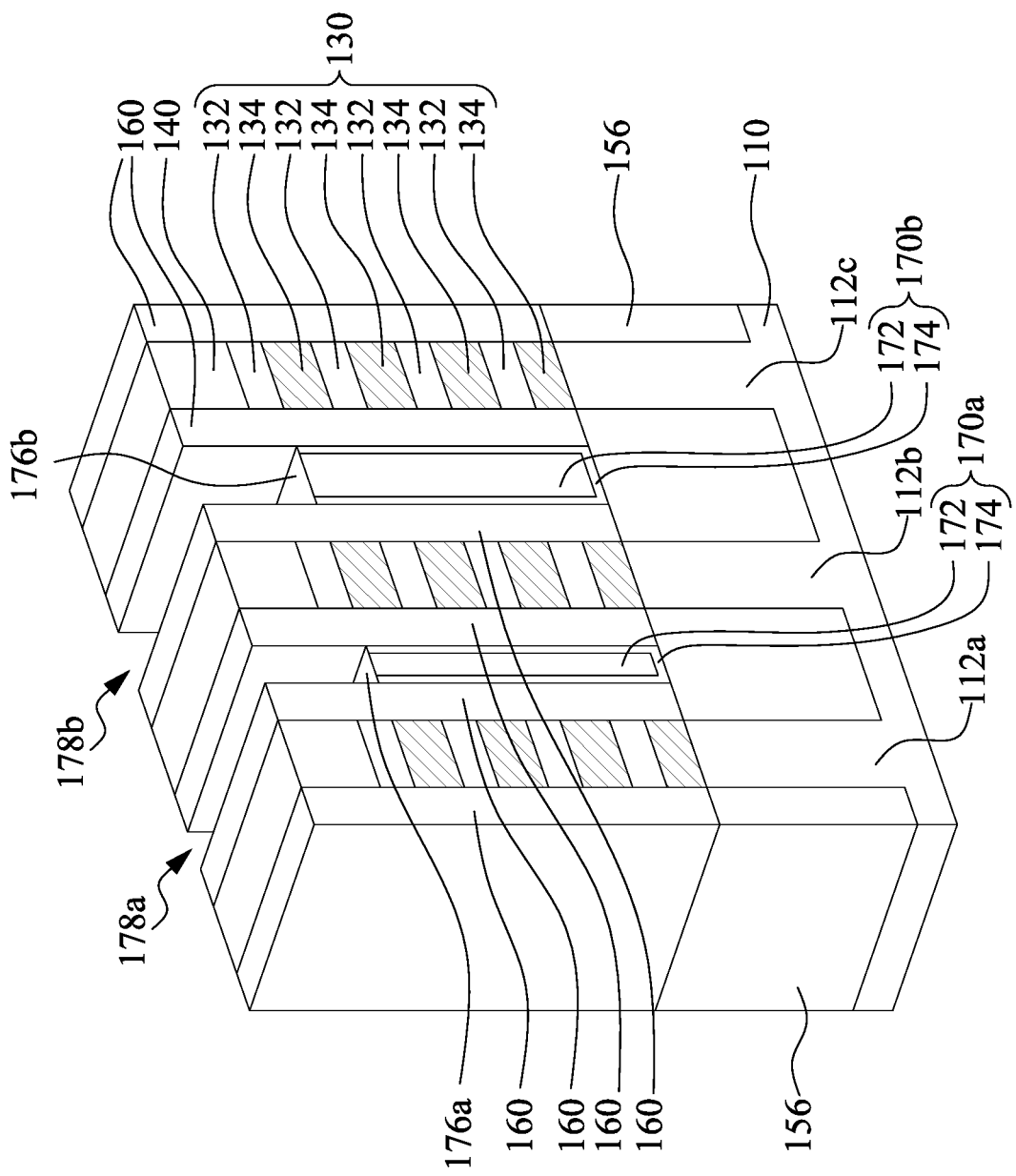

Returning to FIG. 1A, the method M then proceeds to block S105 where the dummy fin structure is recessed to form a recess thereon. With reference to FIG. 6, in some embodiments of block S105, the dummy fin structures 170a and 170b are recessed to form recesses 178a and 178b thereon. In some embodiments, multiple etching processes are performed to recess the dummy fin structures 170a and 170b. The etching processes include dry etching process, wet etching process, or combinations thereof. In some embodiments, during the recessing of the dummy fin structures 170a and 170b, top portions of the cladding layers 160 are removed to expose the hard mask 140. In some embodiments, top surfaces 176a and 176b of the dummy fin structures 170a and 170b are substantially level with the top surface of the topmost semiconductor layer 134, or may be at an intermediate level between the top surface and the bottom surface of the topmost semiconductor layer 132.

Figure 12A:
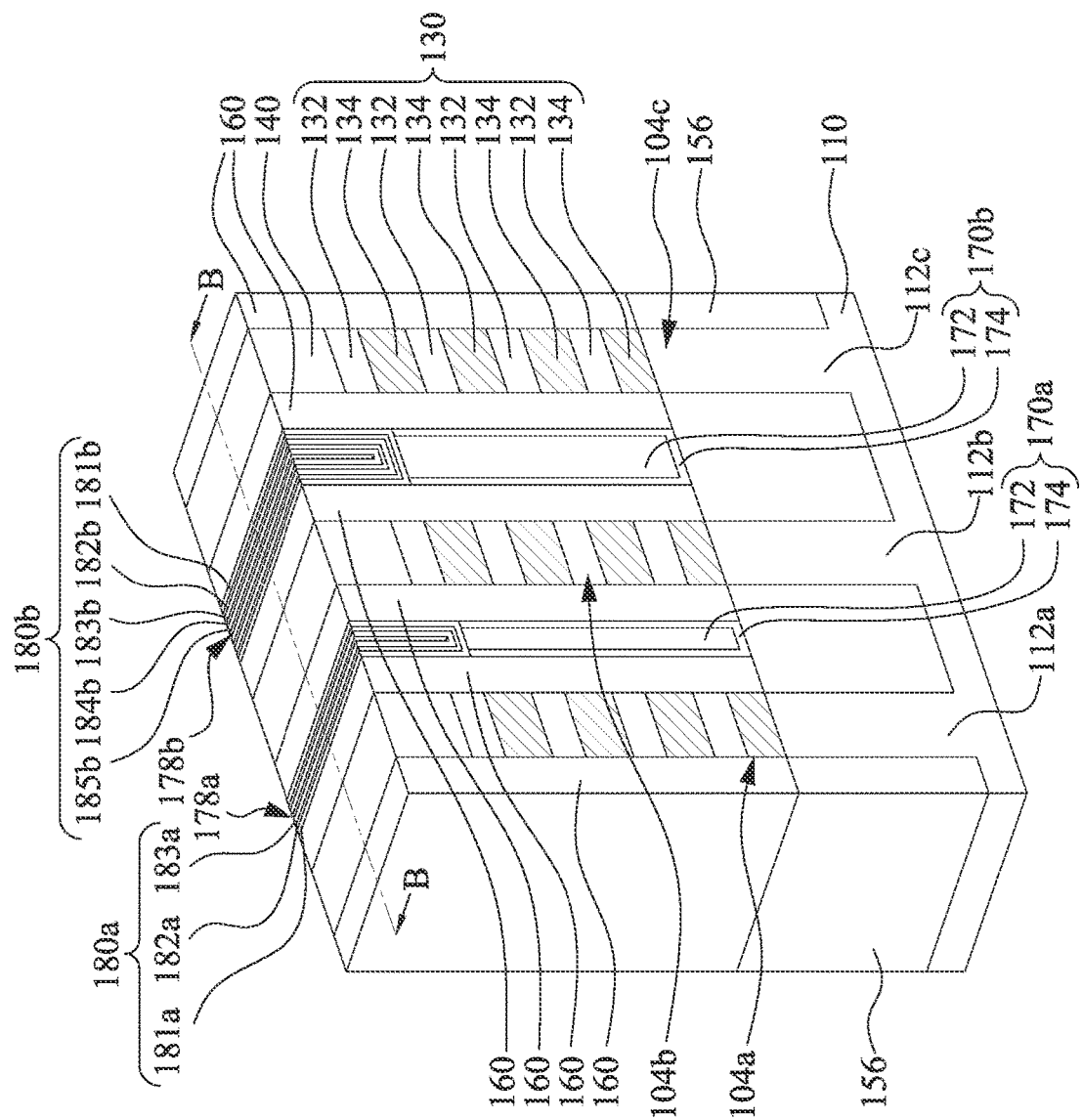
Figure 12B:
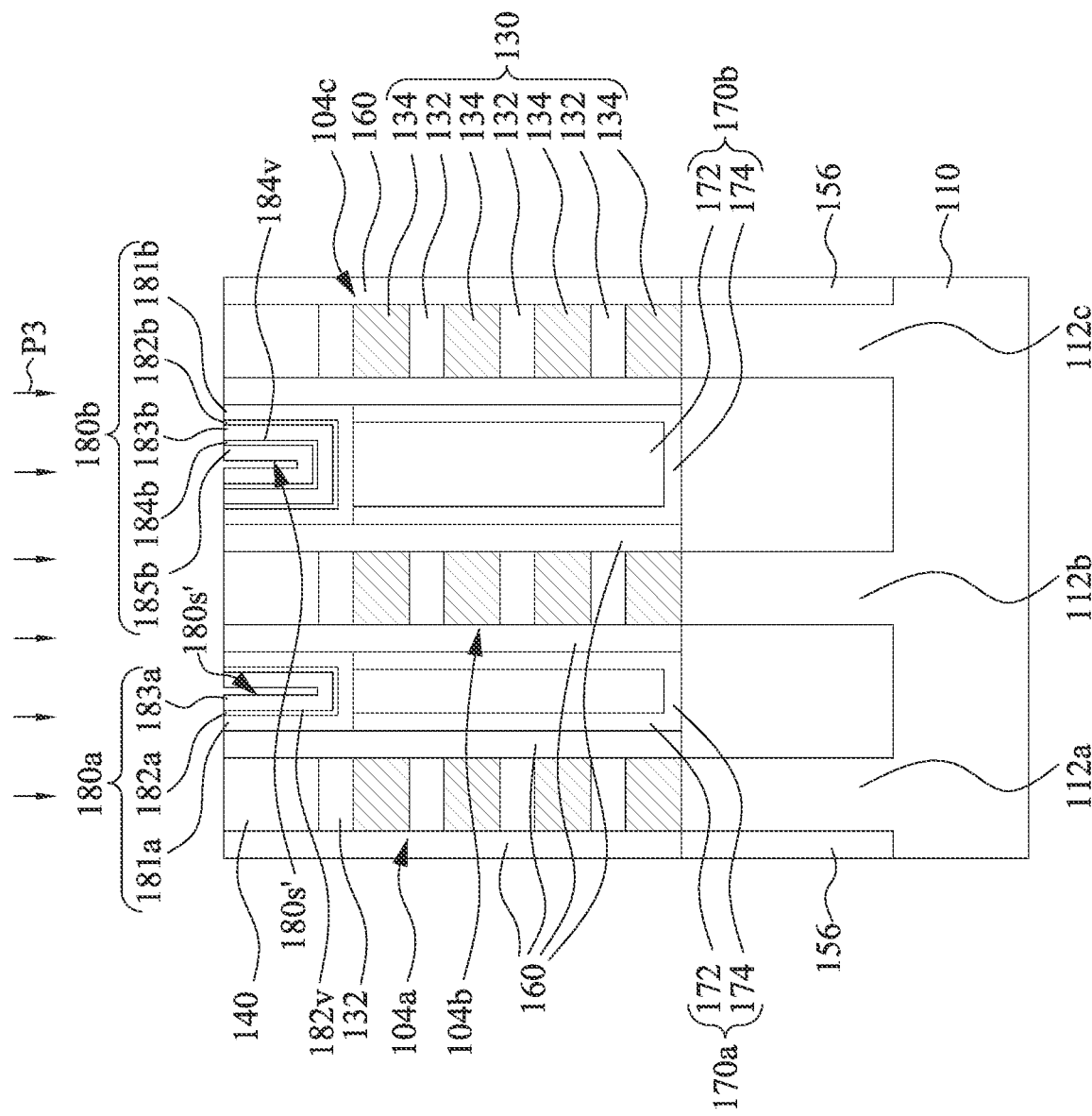

Returning to FIG. 1A, the method M then proceeds to block S106 where a hard mask structure is formed over the dummy fin structure in the recess. With reference to FIGS. 12A and 12B, hard mask structures 180a and 180b are formed over the dummy fin structures 170a and 170b in the recesses 178a and 178b (see FIG. 6). Each of the hard mask structures 180a and 180b has a higher etching resistance than the semiconductor strips 104a, 104b, and 104c, and thus the hard mask structures 180a and 180b can be used to prevent damage to the dummy fin structures 170a and 170b therebelow by subsequent processing (e.g., subsequent etching of the semiconductor strips 104a, 104b, and 104c in block S110 with reference to FIGS. 16 and 20).

As shown in FIGS. 12A and 12B, the hard mask structure 180a includes a hard mask layer 181a formed over the dummy fin structure 170a, a hard mask layer 182a formed over the hard mask layer 181a, and a hard mask layer 183a formed over the hard mask layer 182a. The same or similar configurations and/or materials as described with hard mask structure 180a may be employed in the hard mask structure 180b, and the detailed explanation may be omitted. In FIGS. 12A and 12B, hard mask layers 181b, 182b, and 183b of the hard mask structure 180b may be substantially the same as or comparable to that of the hard mask layers 181a, 182a, and 183a of the hard mask structure 180a. The difference between the hard mask structure 180a and the hard mask structure 180b is that the hard mask structure 180b further includes a hard mask layer 184b formed over the hard mask layer 183b and a hard mask layer 185b formed over the hard mask layer 184b. In FIGS. 12A and 12B, the hard mask structure 180b has a greater width than the hard mask structure 180a and more layers than the hard mask structure 180a. In some embodiment, the hard mask structure 180b has a width substantially the same as the hard mask structure 180a and the same layers as the hard mask structure 180a, by way of example and not limitation. In some embodiment, the hard mask structure 180b has a narrower width than the hard mask structure 180a and fewer layers than the hard mask structure 180a, by way of example and not limitation.

The hard mask layers 181a, 183a, 181b, 183b, and 185b of the hard mask structures 180a and 180b are in a crystalline state and the hard mask layer 182a, 182b, and 184b of the hard mask structures 180a and 180b are in an amorphous state. Therefore, each of the hard mask layers 181a, 183a, 181b, 183b, and 185b may also be interchangeably referred to as a crystalline mask layer and each of the hard mask layers 182a, 182b, and 184b may also be interchangeably referred to as an amorphous hard mask layer in this context. That is, each one of the hard mask structures 180a and 180b includes at least one crystalline layer and at least one amorphous layer stacked alternatively, and numbers of the crystalline layer and the amorphous layer in this context are merely examples and are not intended to be limiting.

The as-deposited hard mask layers 181a, 183a, 181b, 183b, and 185b are to be crystallized (e.g., by using a thermal crystallization process) to have a higher etching resistance than the semiconductor strips 104a, 104b, and 104c. In some cases, during the crystallization and grain growth of the as-deposited hard mask layers 181a, 183a, 181b, 183b, and 185b, profile distortion may occur in the crystalline hard mask layers 181a, 183a, 181b, 183b, and 185b, thereby forming void formation in the hard mask structures 180a and 180b. In some embodiments, an unwanted electrical connection may be in the hard mask structures 180a and 180b associated with the void formation. More particularly, in a subsequent gate replacement operation, as a space between gate spacers having the hard mask structures 180a and 180b therein will be filled with a conductive material to form gate electrodes, the conductive material fills the void formation as well, and thus the conductive material in the void formation forms the unwanted electrical connection.

In FIGS. 12A and 12B, the amorphous hard mask layers 182a, 182b, and 184b are used to act as grain growth boundaries, which in turn allows for limiting the profile distortion of the crystalline hard mask layers 181a, 183a, 181b, 183b, and 185b during crystallization, so as to avoid the formation of voids inside the hard mask structures 180a and 180b, and thereby improving electrical performance of the semiconductor device. In some embodiments, the amorphous hard mask layers 182a, 182b, and 184b may have an etching resistance higher than the semiconductor strips 104a, 104b, and 104c and lower than the crystalline hard mask layers 181a, 183a, 181b, 183b, and 185b during etching the semiconductor strips 104a, 104b, and 104c in block S110 with reference to FIGS. 16 and 20. Also, the amorphous hard mask layers 182a, 182b, and 184b can be used to prevent damage to the dummy fin structures 170a and 170b therebelow by subsequent processing (e.g., subsequent etching of the semiconductor strips 104a, 104b, and 104c in block S110 with reference to FIGS. 16 and 20).

As shown in FIGS. 12A and 12B, each of the crystalline hard mask layers 181a, 183a, 181b, 183b, and 185b and each of the amorphous hard mask layers 182a, 182b, and 184b in the hard mask structures 180a and 180b has an U-shaped cross section. In the hard mask structure 180a, each of vertical portions 182v of the amorphous hard mask layer 182a has a straight sidewall. The crystalline hard mask layers 181a and 183a form to extend along vertical portions 182v of the amorphous hard mask layer 182a without profile distortion and form a straight seam 180s in the hard mask structure 180a. Similarly, in the hard mask structure 180b, each of vertical portions 184v of the amorphous hard mask layer 184b has a straight sidewall. The crystalline hard mask layers 183b and 185b form to extend along vertical portions 184v of the amorphous hard mask layer 184b without profile distortion and form a straight seam 180s' in the hard mask structure 180b. By way of example and not limitation, the seam 180s and/or 180s' may have an aspect ratio about 1:20 to about 1:100. By way of example but not limitation, the seam 180s may have a width in a range about 0.5 nm to about 2 nm and the seam 180s may have a depth in a range about 40 nm to about 50 nm.

In some embodiments, the amorphous hard mask layer 182a has a thinner thickness than the crystalline hard mask layers 181a and 183a. In some embodiments, any one of the amorphous hard mask layers 182b and 184b has a thinner thickness than the crystalline hard mask layers 181b, 183b, and 185b. By way of example and not limitation, the hard mask layers 181a, 183a, 181b, 183b, and/or 185b has a thickness in a range from about 0.1 Å to about 400 Å. By way of example and not limitation, the hard mask layers 182a, 182b, and/or 184b has a thickness in a range from about 0.1 Å to about 30 Å.

The hard mask layers 182a, 182b, and 184b in the hard mask structures 180a and 180b are formed by materials that have higher crystallization temperatures than the hard mask layers 181a, 183a, 181b, 183b, and 185b. Therefore, the as-deposited hard mask layers 182a, 182b, and 184b are amorphous and remain amorphous after annealing the hard mask layers 181a, 183a, 181b, 183b, and 185b to crystallize. The hard mask layers 182a, 182b, and 184b can be used to limit the profile distortion of the hard mask layers 181a, 183a, 181b, 183b, and 185b during crystallization to avoid the formation of voids inside the hard mask structures 180a and 180b. If the as-deposited hard mask layers 182a, 182b, and 184b have crystallization temperatures lower than the hard mask layers 181a, 183a, 181b, 183b, and 185b, the as-deposited hard mask layers 182a, 182b, and 184b may be crystallized after annealing the hard mask layers 181a, 183a, 181b, 183b, and 185b to crystallize, which in turn not allows for limiting the profile distortion of the crystalline hard mask layers 181a, 183a, 181b, 183b, and 185b during crystallization, and then the formation of voids may form in the hard mask structures 180a and 180b.

In some embodiments, the hard mask layers 181a, 183a, 181b, 183b, and/or 185b may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HMO), hafnium zirconium oxide (HfZrO), zirconium oxide ($ZrO_2$), titanium oxide, aluminum oxide, hafnium dioxide-alumina ($HfO_2$—$Al_2O_3$) alloy, or other applicable dielectric materials. In some embodiments, the hard mask layers 182a, 182b, and/or 184b may be made of a silicon-containing material (e.g., $SiO_2$), a nitride-containing material (e.g., SiN, SiCN), an metal-containing material, such as an aluminum-containing material (e.g., AlO, AlN), a carbon-containing material (e.g., SiC, SiCN). In some embodiments, the hard mask layers 181a, 183a, 181b, 183b, and/or 185b may be made of a first metal oxide material and the hard mask layers 182a, 182b, and/or 184b may be made of a second metal oxide material that has a higher crystallization temperature than the first metal oxide material. By way of example but not limitation, the hard mask layers 181a, 183a, 181b, 183b, and/or 185b may be made of $HfO_2$ and the hard mask layers 182a, 182b, and/or 184b may be made of $SiO_2$. In some embodiments, the hard mask layers 181a, 183a, 181b, 183b, 185b may be made of the same material as each other. In some embodiments, the hard mask layers 181a in the hard mask structure 180a may be made of a material different than the hard mask layers 183a in the hard mask structure 180a. In some embodiments, at least two of the hard mask layers 181b, 183b, and 185b have materials that are different from each other. In various examples, the hard mask layers 181a, 182a, 183a, 181b, 182b, 183b, 184b, and/or 185b may be deposited by an ALD process, a CVD process, a subatmospheric CVD (SACVD) process, a flowable CVD process, a PVD process, or other suitable process.

In certain embodiments of block S106, with reference to FIGS. 7A-12B, the forming of the hard mask structures 180a and 180b may be a cyclic process including at least one repetition of a crystalline hard mask layer forming step and an amorphous hard mask layer forming step. For example, it may perform a crystalline hard mask layer forming step (e.g., FIGS. 7A and 7B) followed by an amorphous hard mask layer forming step (e.g., FIGS. 8A and 8B), and repeats another crystalline hard mask layer forming step (e.g., FIGS. 9A and 9B) followed by another amorphous hard mask layer forming step (e.g., FIGS. 10A and 10B).

Figure 7A:
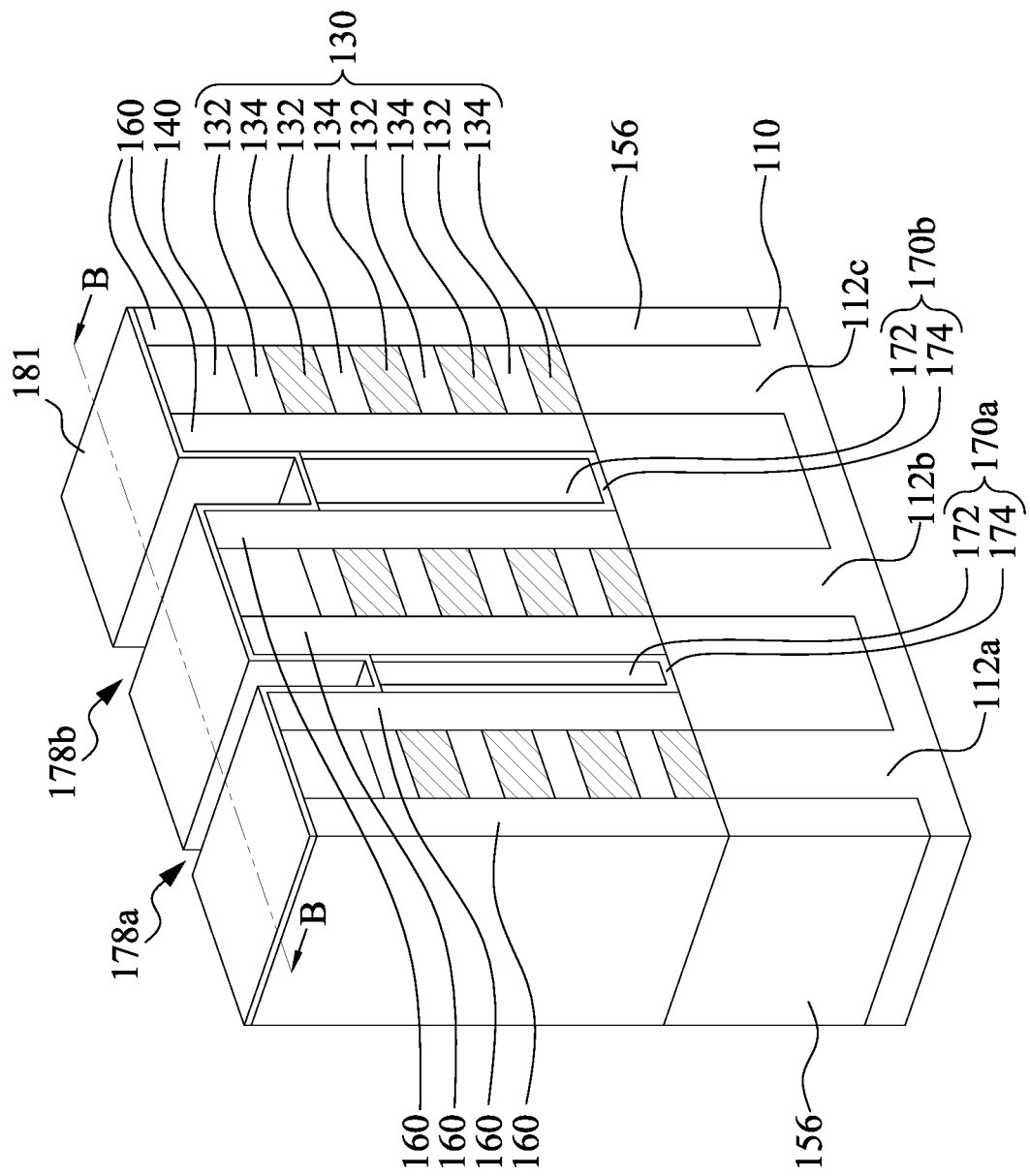
Figure 7B:
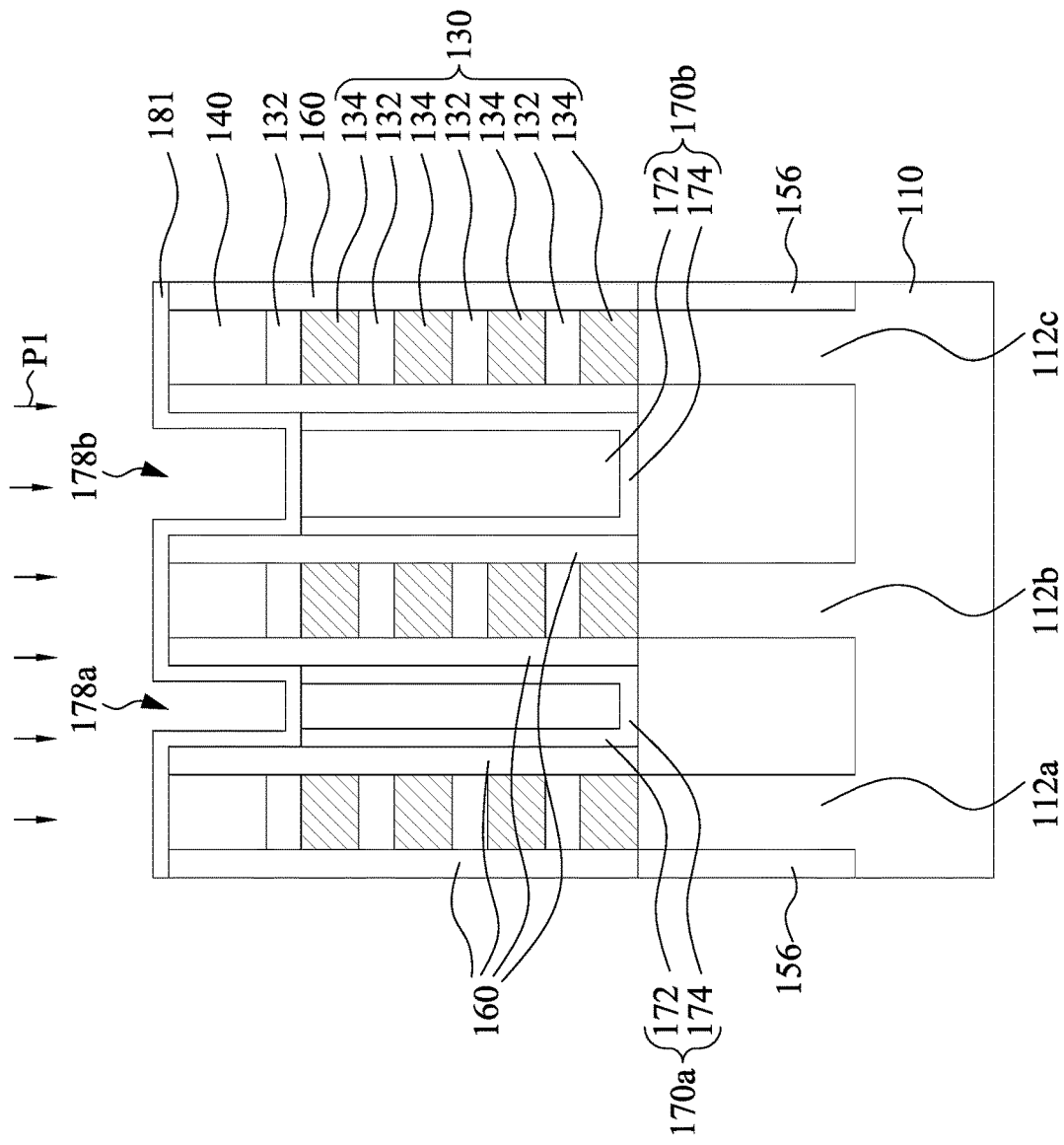
FIGS. 7B, 8B, 9B, 10B, 11B, and 12B are side views of FIGS. 7A, 8A, 9A, 10A, 11A, and 12A.

Reference is made to FIGS. 7A and 7B. The hard mask material 181 is conformally formed over the hard masks 140, the cladding layers 160, and the dummy fin structures 170a and 170b. In some embodiments, an atomic layer deposition (ALD) process P1 is employed to form the hard mask material 181. As a result, the thickness of the hard mask material 181 can be controlled using cycle times of the ALD process P1. In some embodiments, the ALD process P1 may include a plurality of cycles (e.g., about 30 cycles to about 150 cycles) to form the hard mask material 181 with a thickness ranging from about 2 nm to about 8 nm, by way of example but not limitation. For example, the ALD process P1 may include about 64 cycles.

In some embodiments, the hard mask material 181 may be made of $HfO_2$. By way of example but not limitation, the ALD process P1 is performed using a hafnium precursor and an oxidant co-precursor to deposit the hard mask material 181. By way of example but not limitation, the hafnium precursor may include tetrakis (ethylmethylamino) hafnium (TEMAH), tetrakis-diethylamido hafnium (i.e., Hf[N($C_2H_5$)$_2$]$_4$, TDEAHf), Hf(OC($CH_3$)$_3$)$_4$ (i.e., Hf-t-butoxide), $HfCl_4$, or any other suitable hafnium precursor. The oxidant co-precursor may include $H_2O$, $O_3$ and $O_2$ plasma, or any other suitable oxidant co-precursor.

In a case where the ALD process P1 may implement $HfCl_4$ and $H_2O$ as the precursors. The dose of $HfCl_4$ introduces to the substrate 110 before making contact with the hard masks 140, the cladding layers 160, and the dummy fin structures 170a and 170b. The OH groups on the hard masks 140, the cladding layers 160, and the dummy fin structures 170a and 170b represent surface sites that can react with incoming HfCl$_4$ molecules. Then, the HfCl$_4$ molecules have reacted with surface sites on the hard masks 140, the cladding layers 160, and the dummy fin structures 170a and 170b and left a monolayer of Hf atoms which still have part of the ligand structure connected to them. The incoming HfCl$_4$ molecule exchanges one, or more, of its ligand branches for species on the surface bonded to oxygen (hydrogen atoms). The reaction evolves 4HCl which is removed from the substrate 110 in an inert purge leaving surface species that the oxidant dose can react with. Then, a dose of H$_2$O is introduced to the substrate 110 and reacts with the surface species from the previous step. Then, the substrate 110 is purged removing more evolved HCl and leaving alternative surface species so that further reaction steps can take place. In a binary deposition process these steps are repeated to build the hard mask material 181 conformally formed on the hard masks 140, the cladding layers 160, and the dummy fin structures 170a and 170b.

By way of example but not limitation, with increasing the temperature from about 600 to about 800° C., the crystal quality of HfO$_2$ film is gradually enhanced. In FIGS. 7A and 7B, the ALD process P1 is performed at a temperature prevents the hard mask material 181 from crystallizing. In other words, the ALD process P1 is performed at a lower than a crystallization temperature of the hard mask material 181. By way of example but not limitation, the ALD process P1 is performed at a lower temperature than about 600° C. to prevent the hard mask material 181 from crystallizing. In some embodiments, the ALD process P1 is performed at a temperature lower than about 600, 650, 700, 750, or 800° C. On the other hand, the ALD process P1 may be performed at a temperature in a range from about 250 to about 600° C., such as about 250, 300, 350, 400, 450, 500, 550, or 600° C.

Figure 8A:
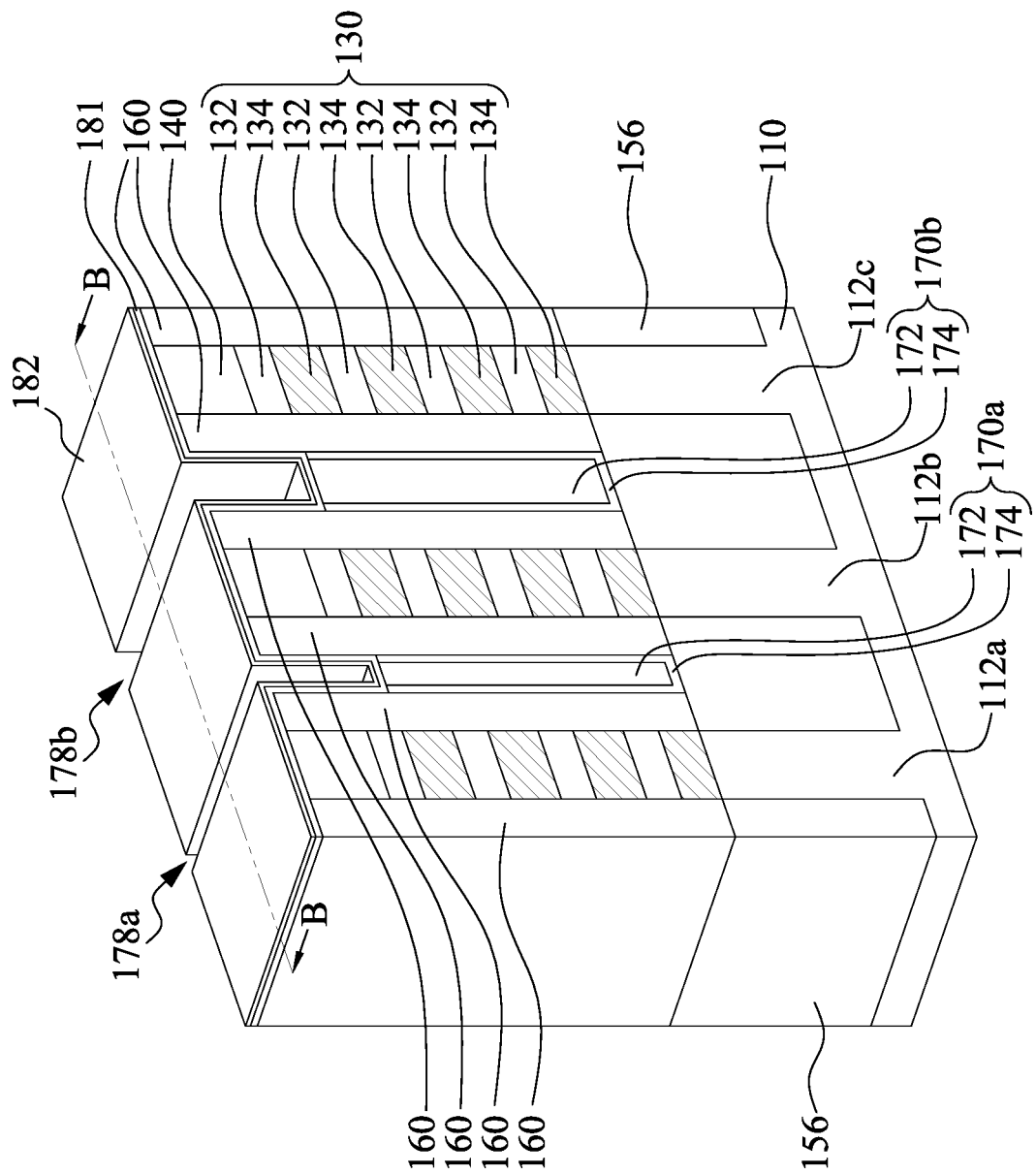
Figure 8B:
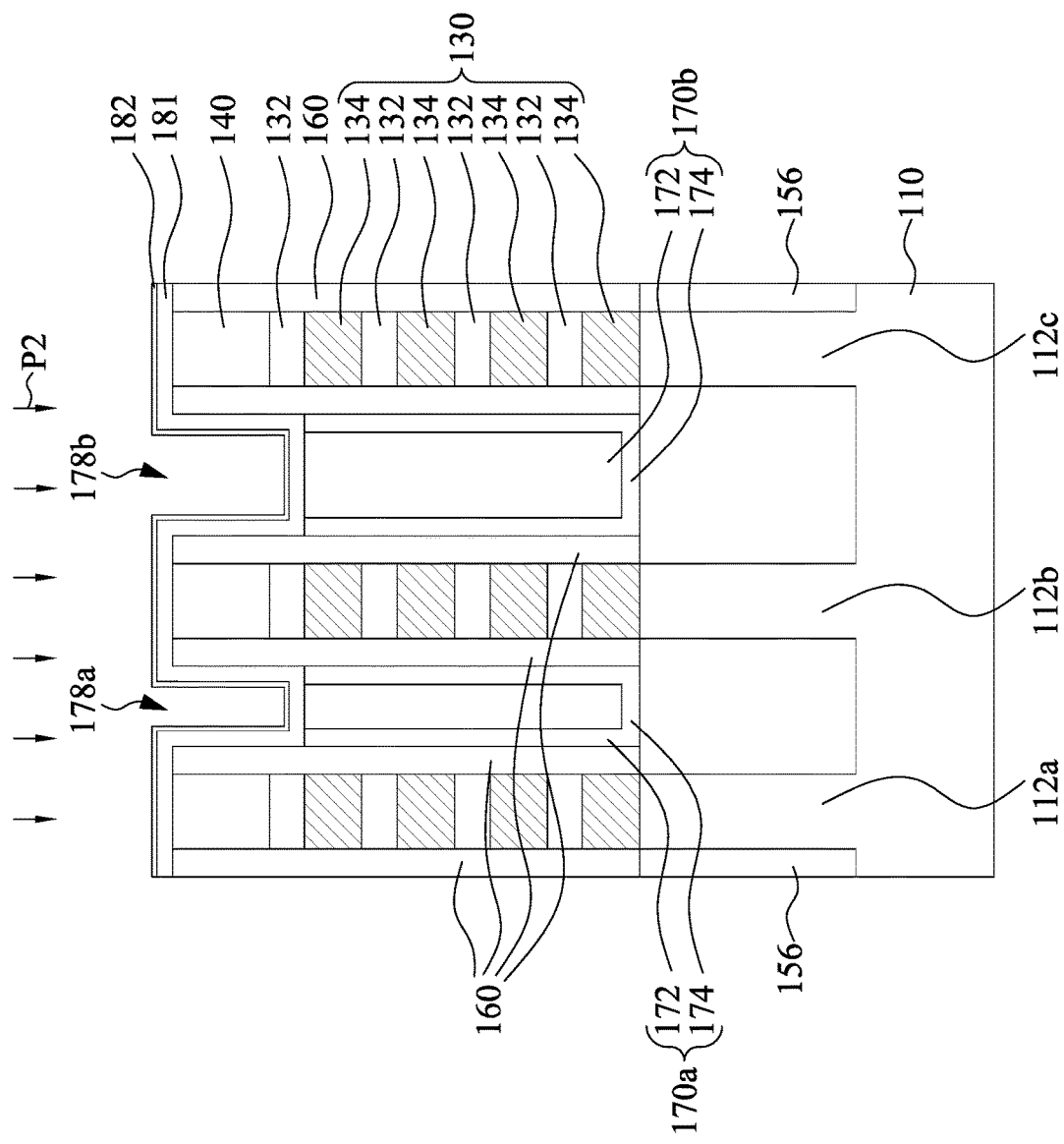

Reference is made to FIGS. 8A and 8B. The hard mask material 182 is conformally formed over the hard mask material 181 and in the recesses 178a and 178b. In some embodiments, the hard mask material 182 has a higher crystallization temperature than the hard mask material 181. If the hard mask material 182 has a crystallization temperature lower than the hard mask material 181, the deposited hard mask material 181 may become crystalline after annealing the hard mask layer 182 to crystallize, thereby forming void formation in the hard mask structures 180a and 180b to form the unwanted electrical connection by subsequent processing.

The ALD process P2 is performed at a temperature that prevents the hard mask layer 181a from crystallizing. In other words, the ALD process P2 is performed at a lower temperature than the crystallization temperature of the hard mask layer 181a. By way of example but not limitation, the ALD process P2 is performed at a temperature lower than about 600° C. to prevent the hard mask layer 181a from crystallizing. In some embodiments, the ALD process P2 is performed at a temperature lower than about 600, 650, 700, 750, or 800° C. On the other hand, the ALD process P2 may be performed at a temperature in a range from about 250 to about 600° C., such as about 250, 300, 350, 400, 450, 500, 550, or 600° C. Therefore, the as-deposited hard mask material 182 is amorphous and remains amorphous after annealing the hard mask layer 181a to crystallize.

In some embodiments, the thickness of the hard mask material 182 can be controlled using cycle times of the ALD process P2. In some embodiments, the ALD process P2 may include a plurality of cycles (e.g., about 30 cycles to about 150 cycles) to form the hard mask material 182 with a thickness ranging from about 2 nm to about 8 nm, by way of example but not limitation. For example, the ALD process P2 may include about 64 cycles.

In some embodiments, the hard mask materials 181 and 182 are in-situ deposited in the same process apparatus (i.e., performed in the same ALD chamber). In some embodiments, the hard mask layers 181 and 182 are ex-situ formed in different process apparatuses (i.e., performed in different ALD chambers).

Figure 9A:
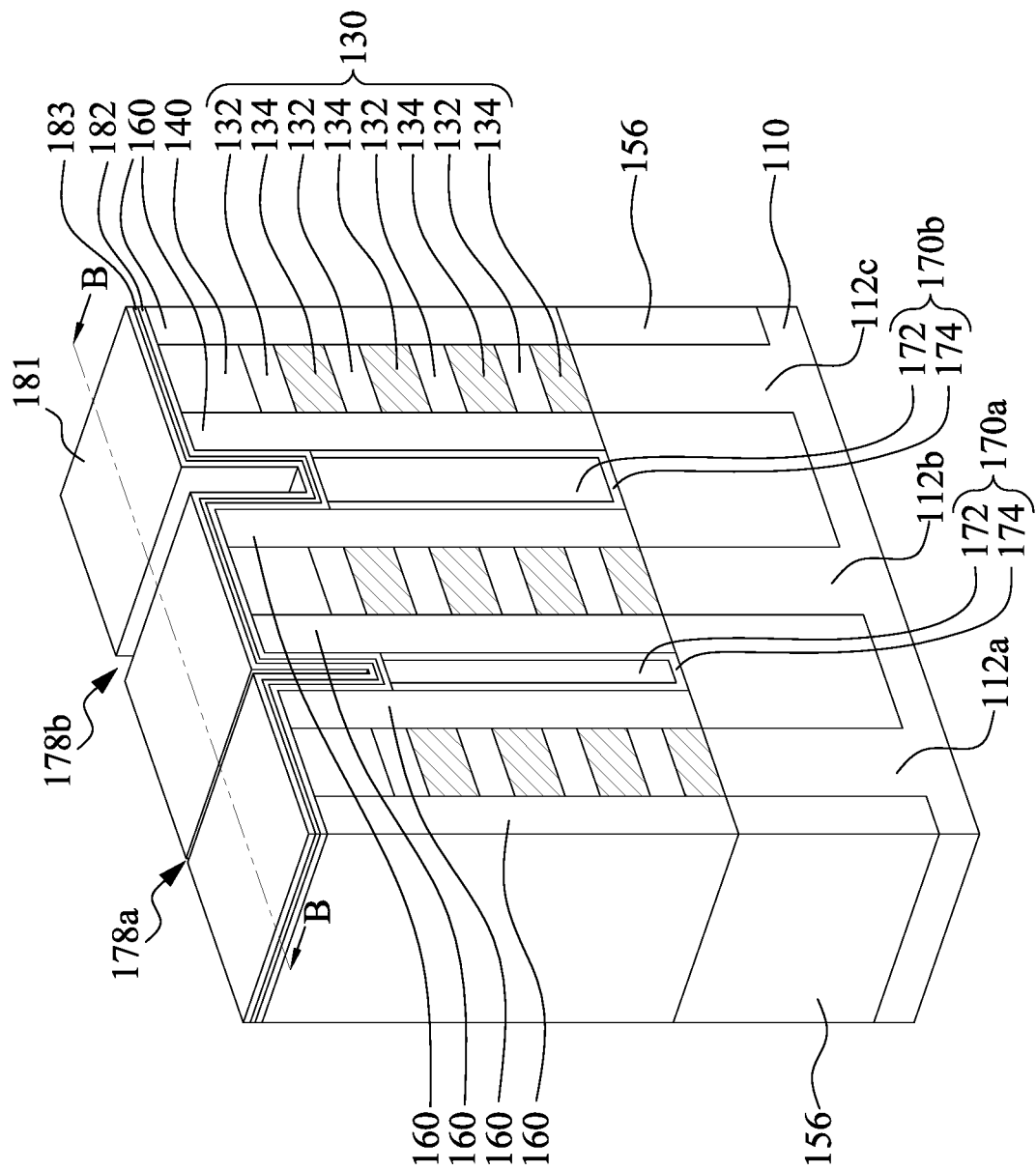
Figure 9B:
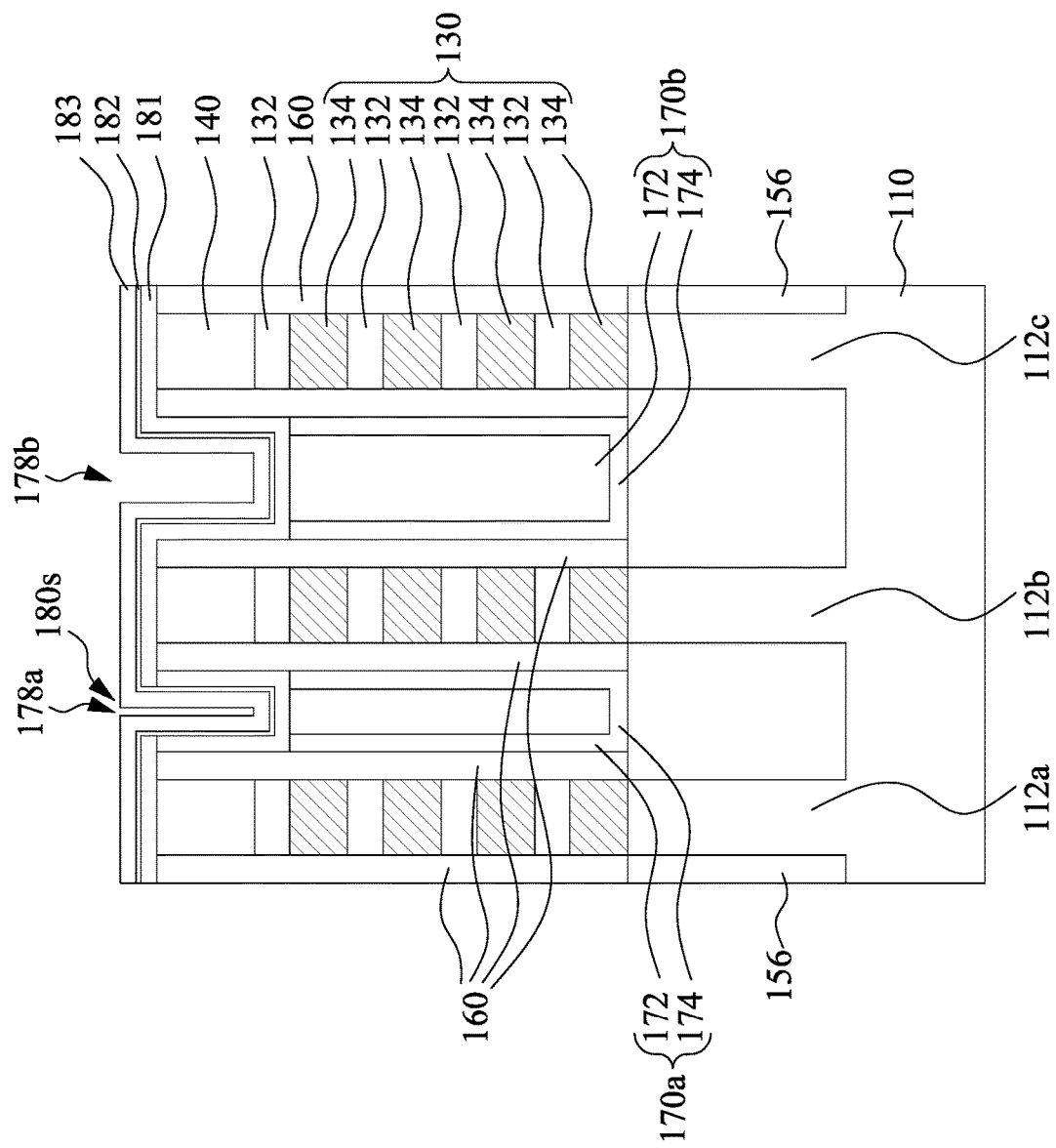

Reference is made to FIGS. 9A and 9B. The hard mask material 183 is conformally formed over the hard mask material 182 and in the recesses 178a and 178b. Configurations and/or materials of the hard mask material 183 may be substantially the same as or comparable to that of the hard mask material 181, and the related detailed descriptions are not described again herein. After the forming of the hard mask material 183, the recesses 178a may be filled by the hard mask materials 181, 182, and 183 and form a seam 180s therein.

Figure 10A:
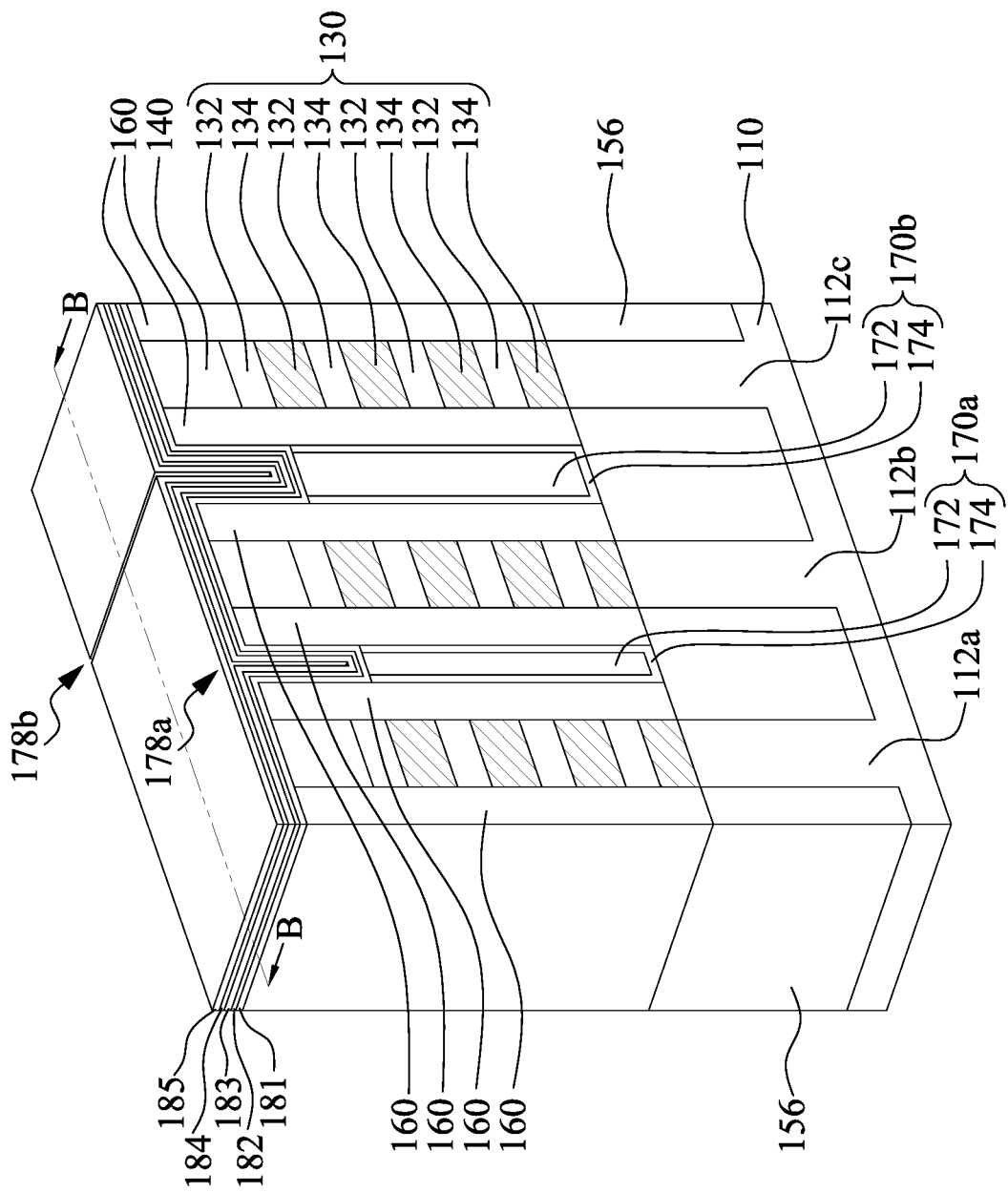
Figure 10B:
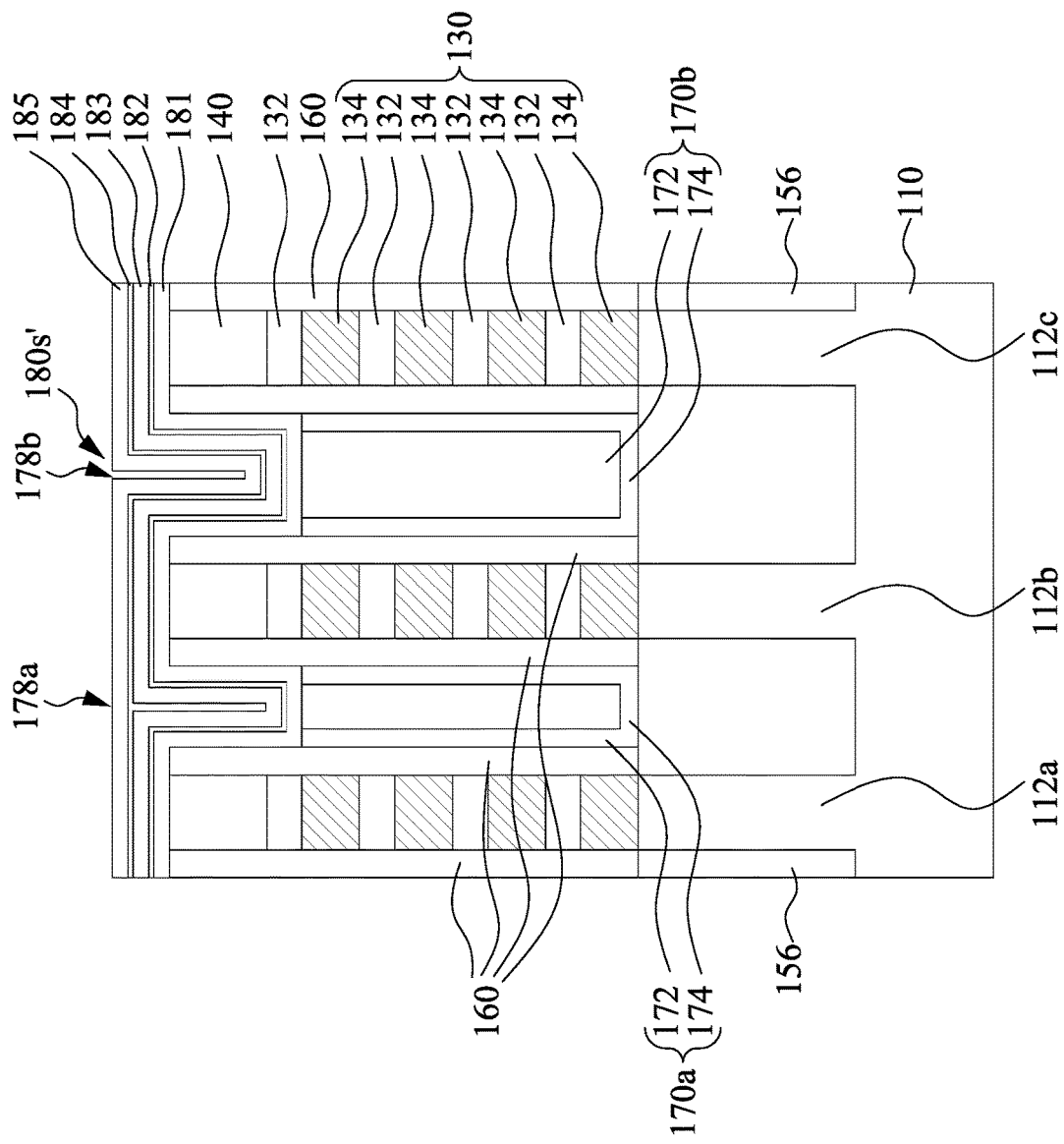

Reference is made to FIGS. 10A and 10B. The hard mask materials 184 and 185 are conformally formed over the hard mask material 183 and in the recesses 178a and 178b in sequence. Configurations and/or materials of the hard mask material 184 may be substantially the same as or comparable to that of the hard mask material 182, and the related detailed descriptions are not described again herein. Configurations and/or materials of the hard mask material 185 may be substantially the same as or comparable to that of the hard mask materials 181 and/or 183, and the related detailed descriptions are not described again herein. After the forming of the hard mask materials 184 and 185, the recesses 178b may be filled by the hard mask materials 181-185 and form a seam 180s' therein.

Figure 11A:
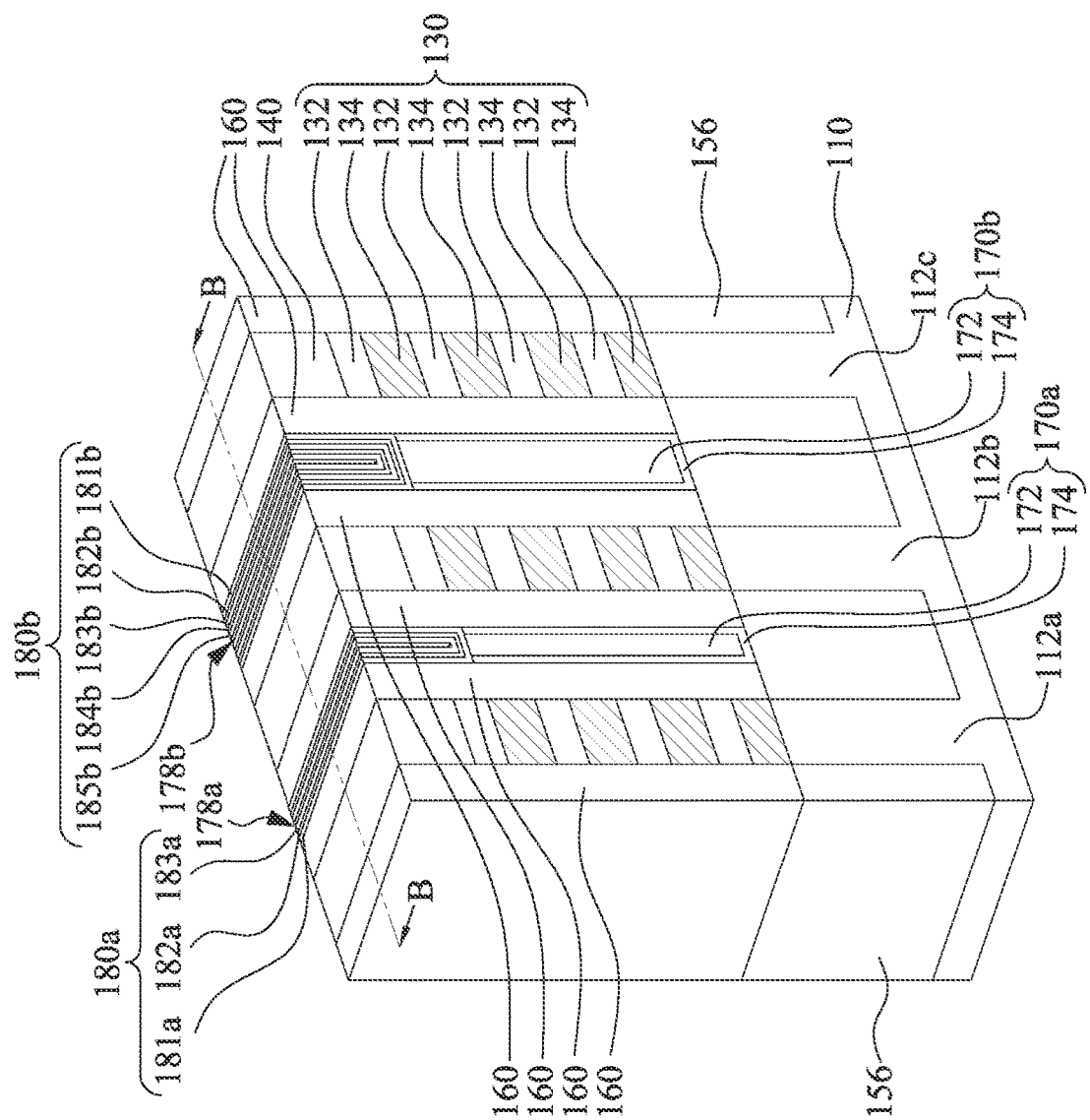
Figure 11B:
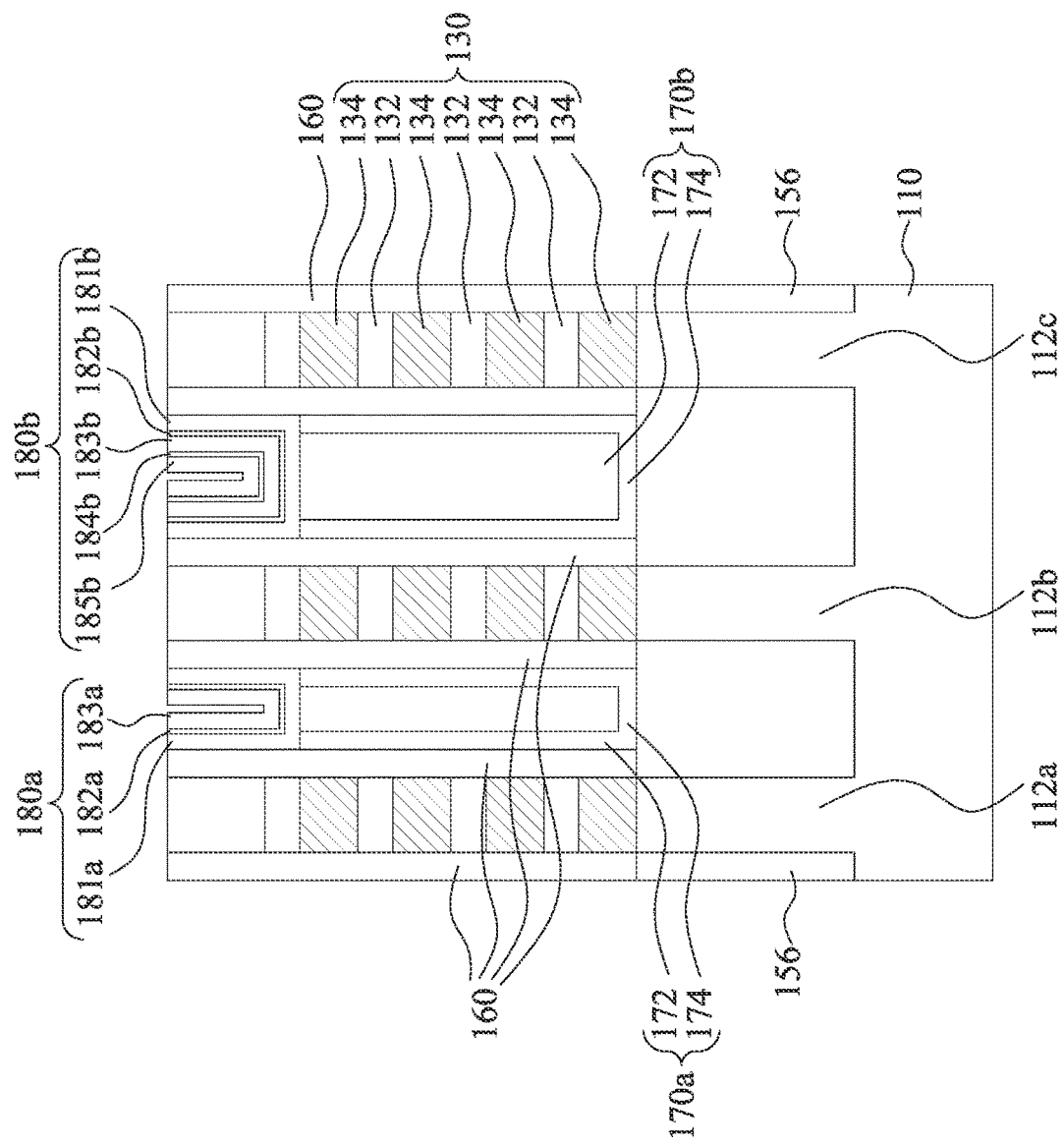

Reference is made to FIGS. 11A and 11B. A planarization (e.g., CMP) process is performed to remove excess portion of the first and second hard mask materials 181-185 until the hard masks 140 and the cladding layers 160 are exposed to form the hard mask structures 180a and 180b. The hard mask structure 180a includes the hard mask layer 181a, 182a, and 183a that are stacked in sequence in the recess 178a and have U-shaped cross sections conformal to each other. The hard mask structure 180b includes the hard mask layer 181b, 182b, 183b, 184b, and 185b that are stacked in sequence in the recess 178b and each has U-shaped cross sections conformal to each.

Reference is made to FIGS. 12A and 12B. An annealing process P3 is performed on the substrate 110 to crystallize the as-deposited hard mask layer 181a, 183a, 181b, 183b, and 185b in the hard mask structures 180s and 180b. The as-deposited hard mask layers 182a, 182b, and 184b have higher crystallization temperatures than the as-deposited hard mask layer 183a, 181b, 183b, and 185b. Thus, the annealing process P3 is performed such that the as-deposited hard mask layers 182a, 182b, and 184b are amorphous and remain amorphous after annealing the hard mask layer 181a, 183a, 181b, 183b, and 185b to crystallize. In other words, the annealing process P3 is performed at a higher temperature than the crystallization temperatures of the hard mask layers 183a, 181b, 183b, and 185b and lower than the crystallization temperatures of the hard mask layers 182a, 182b, and 184b. In some embodiments, with increasing the annealing temperature from about 500 to about 1000° C., the crystal quality of the as-deposited hard mask layers 183a, 181b, 183b, and 185b made of HfO$_2$ is gradually enhanced to improve the etching resistance thereof. In some embodiments, the main lattice arrangements of the hard mask layers 183a, 181b, 183b, and 185b may include monoclinic HfO$_2$ (−111), monoclinic HfO$_2$ (200), and orthorhombic HfO$_2$ (111). Further increasing the annealing temperature, the lattice structure of orthorhombic HfO$_2$ (111) may dominate the crystalline structure.

In some embodiments, the annealing process P3 may be a rapid thermal annealing performed in N$_2$ ambient. By way of example but not limitation, the annealing temperature may be higher than 600° C. to crystallize the hard mask layer 182. The annealing temperature may be in a range from about 600 to about 800° C., such as about 600, about 650, about 700, about 750, or about 800° C. Therefore, after the annealing process P3 is complete, the as-deposited hard mask layers 183a, 181b, 183b, and 185b is crystalline and the as-deposited hard mask layers 183a, 181b, 183b, and 185b remain amorphous to limit the profile distortion of the crystalline hard mask layers 183a, 181b, 183b, and 185b during crystallization.

Figure 13:
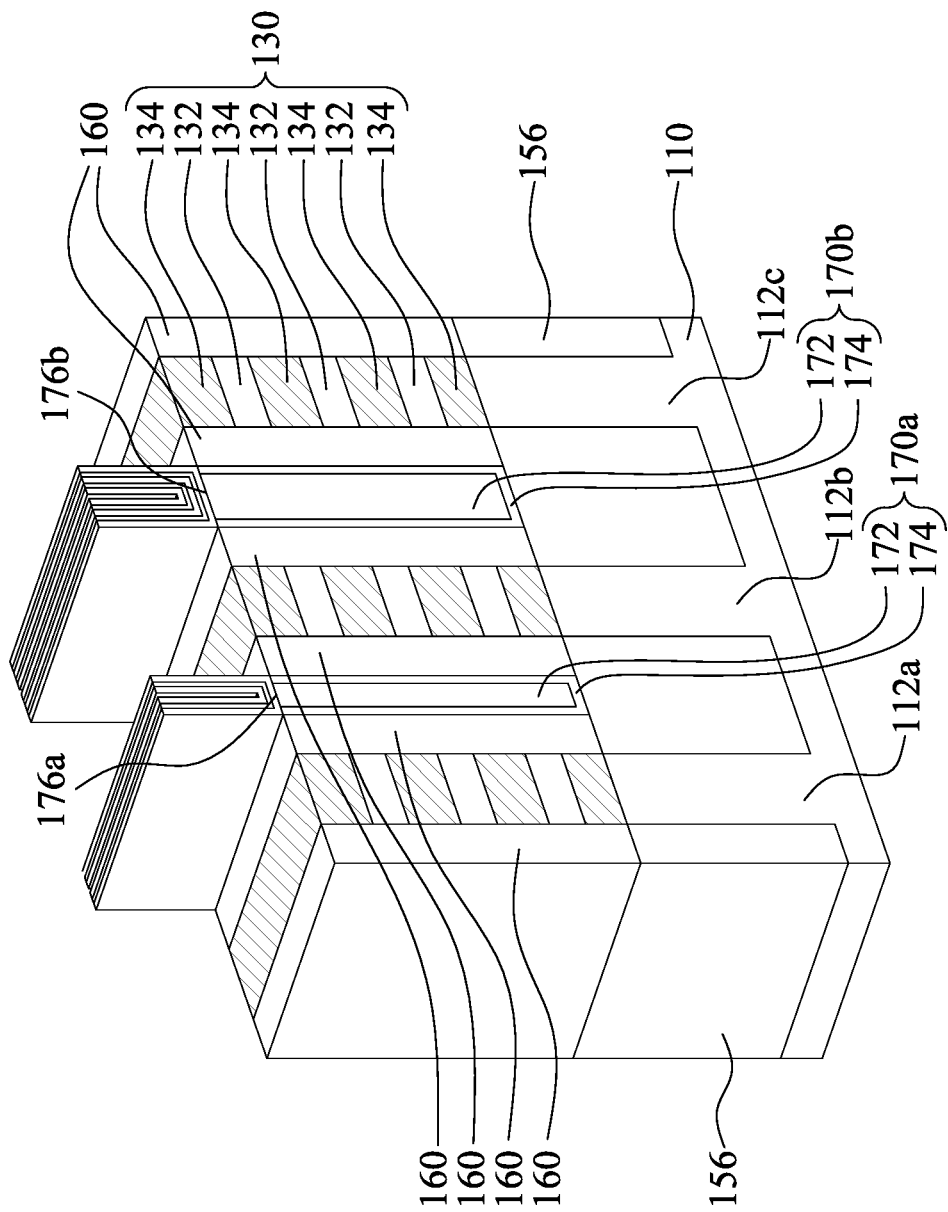

Returning to FIG. 1A, the method M then proceeds to block S107 where the patterned hard masks are removed. With reference to FIG. 13, in some embodiments of block S107, the patterned hard masks 140 (see FIGS. 12A and 12B) are removed, and then the topmost semiconductor layer 132 and portions of the cladding layers 160 above top surfaces of the topmost semiconductor layer 134 are removed. As such, top surfaces of the cladding layers 160 are substantially level with the top surfaces 176a and 176b of the dummy fin structures 170a and 170b. In some embodiments, multiple etching processes are performed to etch back the cladding layers 160 and remove the hard masks 140 and the topmost semiconductor layer 132. The etching processes include dry etching process, wet etching process, or combinations thereof.

Figure 14:
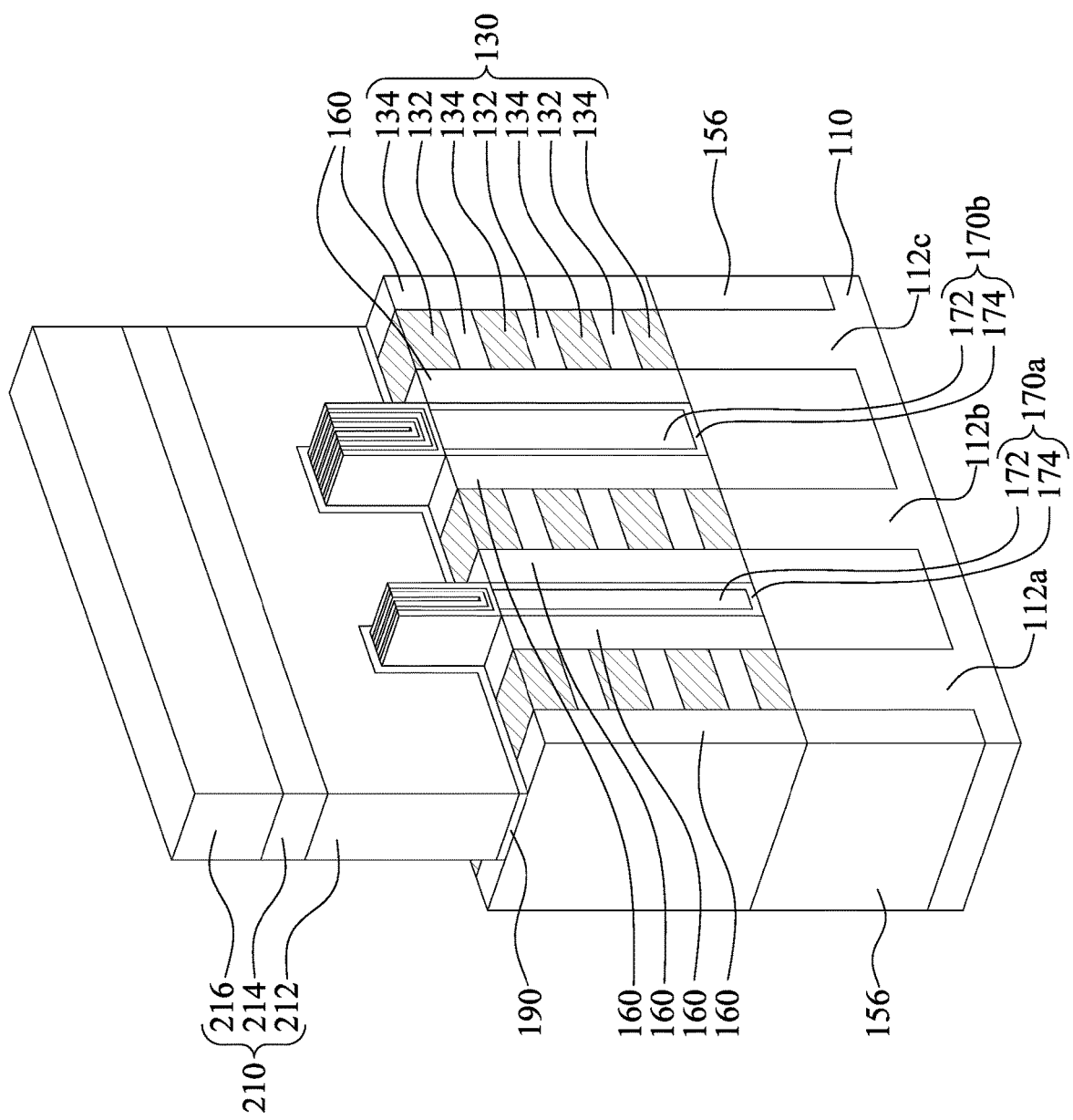

Returning to FIG. 1A, the method M then proceeds to block S108 where an interfacial layer and a dummy gate structure are formed above the semiconductor stack, the dummy fin structure, and the hard mask structure. With reference to FIG. 14, in some embodiments of block S108, an interfacial layer 190 is conformally formed above the structure of FIG. 13. In some embodiments, the interfacial layer 190 may include silicon dioxide, silicon nitride, a high-κ dielectric material or other suitable material. In various examples, the interfacial layer 190 may be deposited by an ALD process, a CVD process, a subatmospheric CVD (SACVD) process, a flowable CVD process, a PVD process, or other suitable process. By way of example, the interfacial layer 190 may be used to prevent damage to the semiconductor strips 130 by subsequent processing (e.g., subsequent formation of the dummy gate structure).

Subsequently, at least one dummy gate structure 210 is formed above the interfacial layer 190. The dummy gate structure 210 includes a dummy gate layer 212a, a pad layer 214 formed over the dummy gate layer 212, and a mask layer 216 formed over the pad layer 214. In some embodiments, a dummy gate layer (not shown) may be formed over the interfacial layer 190, and the pad layer 214 and the mask layer 216 are formed over the dummy gate layer. The dummy gate layer is then patterned using the pad layer 214 and the mask layer 216 as masks to form the dummy gate layer 212. As such, the dummy gate layer 212, the pad layer 214, and the mask layer 216 are referred to as the dummy gate structure 210. In some embodiments, the dummy gate layer 212 may be made of polycrystalline-silicon (poly-Si), poly-crystalline silicon-germanium (poly-SiGe), or other suitable materials. The pad layer 214 may be made of silicon nitride or other suitable materials, and the mask layer 216 may be made of silicon dioxide or other suitable materials.

Figure 15:
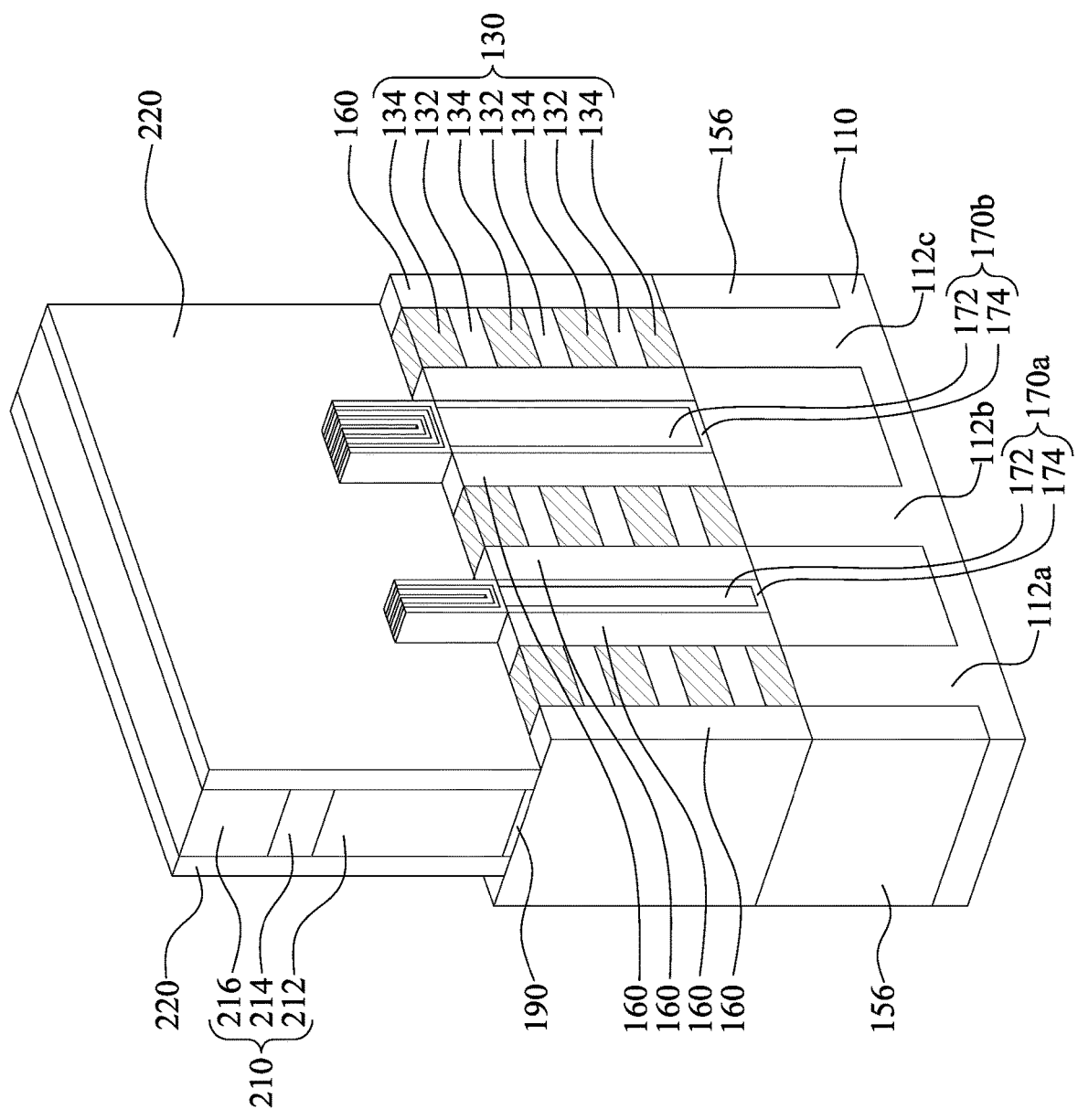

Returning to FIG. 1A, the method M then proceeds to block S109 where gate spacers are respectively formed on sidewalls of the dummy gate structure. With reference to FIG. 15, in some embodiments of block S109, gate spacers 220 are respectively formed on sidewalls of the dummy gate structure 210. The gate spacers 220 may include a seal spacer and a main spacer (not shown). The gate spacers 220 include one or more dielectric materials, such as silicon oxide, silicon nitride, silicon oxynitride, SiCN, SiCxOyNz, or combinations thereof. The seal spacers are formed on sidewalls of the dummy gate structure 210 and the main spacers are formed on the seal spacers. The gate spacers 220 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 220 may include blanket forming spacer layers, and then performing etching operations to remove the horizontal portions of the spacer layers. The remaining vertical portions of the gate spacer layers form the gate spacers 220.

Figure 16:
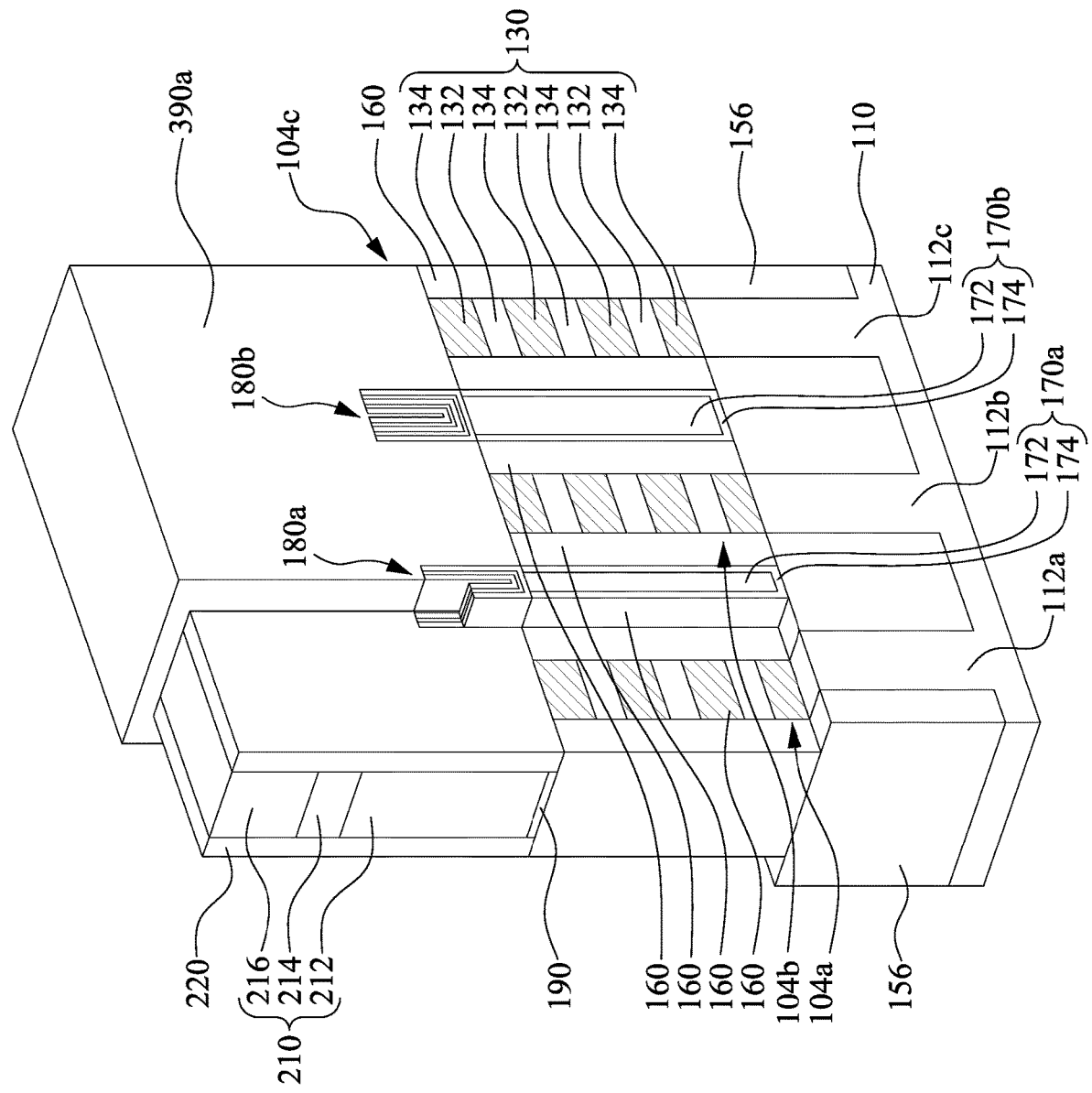

Returning to FIG. 1A, the method M then proceeds to block S110 where the semiconductor strips and the cladding layers are patterned using the dummy gate structure and the gate spacers as masks, such that portions of the isolation structures and the base portions of the substrate are exposed, and then epitaxial structures are formed on the base portions. With reference to FIG. 16, in some embodiments of block S110, a patterned mask layer 390a is formed over the semiconductor strips 104b and 104c. The semiconductor strip 104a and a portion of the semiconductor layers 160 are further patterned through the patterned mask layer 390a and using the dummy gate structure 210 and the gate spacers 220 as masks, such that portions of the isolation structures 156 and the base portion 112a of the substrate 110 are exposed. During this etching process, a portion of the hard mask structure 180a is recessed at the areas not covered by the patterned mask layer 390a, the dummy gate structure 210, and the gate spacers 220. In some embodiments, the patterning process is performed with an anisotropic dry etch process. In some embodiments, the dry etch process etches the semiconductor strip 104a and the exposed cladding layers 160 (e.g., Si and SiGe) much faster than etching the hard mask structure 180a (e.g., metal oxides, SiON, and SiOCN). Due to this etch selectivity, the dry etch process patterns the semiconductor strip 104a and the cladding layers 160 vertically without complete etching the hard mask structure 180a. In FIG. 16, a portion of the hard mask structure 180a covered by patterned mask layer 390a, the dummy gate structure 210, and the gate spacers 220 has a height greater than a height of the recessed portion of the hard mask structure 180a.

Figure 17:
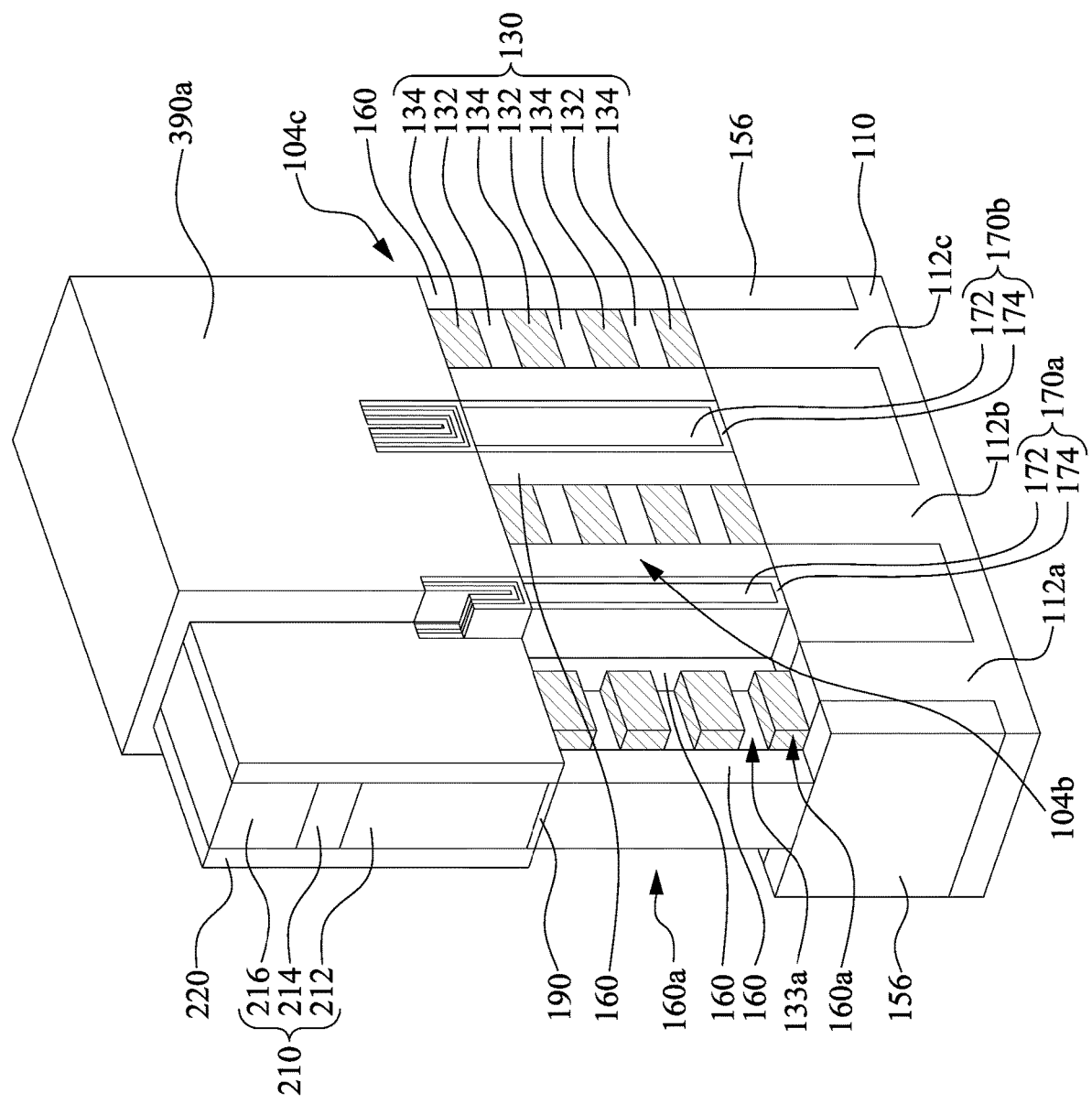

Reference is made to FIG. 17. The semiconductor layers 132 of the semiconductor strip 104a and the cladding layers 160 adjacent to the semiconductor strip 104a are horizontally recessed (etched) so that edges of the semiconductor layers 132 of the semiconductor strip 104a and the cladding layers 160 adjacent to the semiconductor strip 104a are located substantially below the gate spacers 220 and recesses 133a and 160a are formed. The etching of the semiconductor layers 132 and the cladding layers 160 includes wet etching and/or dry etching. A wet etchant such as a tetramethylammonium hydroxide (TMAH) solution can be used to selectively etch the semiconductor layers 132 and the cladding layers 160.

Figure 18:
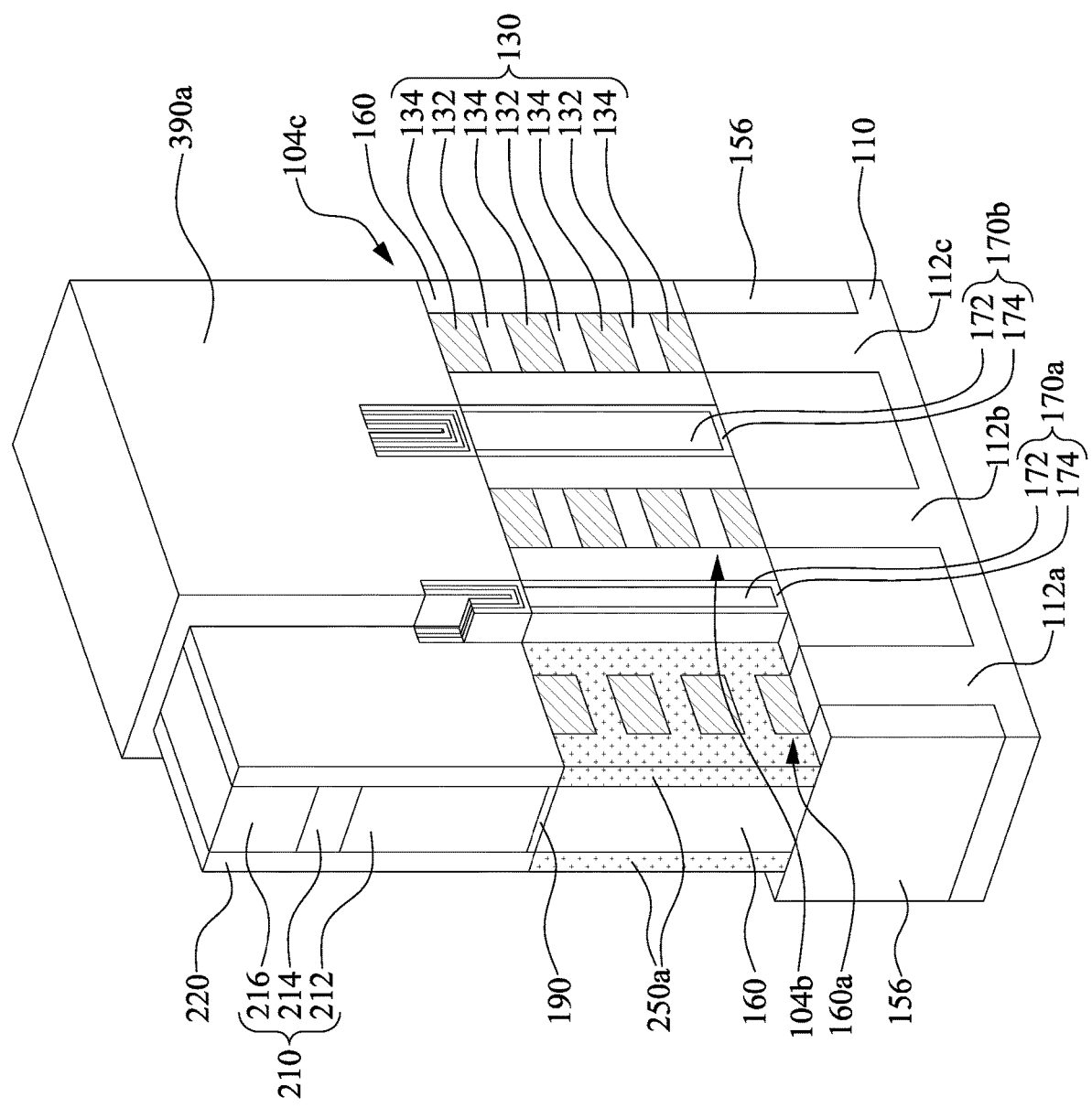

Reference is made to FIG. 18. Inner sidewall spacers 250a are respectively formed in the recesses 133a and 160a (see FIG. 17) of the semiconductor layers 132 of the semiconductor strip 104a and the cladding layers 160 adjacent to the semiconductor strip 104a. For example, a dielectric material layer is formed over the structure of FIG. 17, and one or more etching operations are performed to form the inner sidewall spacers 250a. In some embodiments, the inner sidewall spacers 250a includes a silicon nitride-based material, such as SiN, SiON, SiOCN or SiCN and combinations thereof and is different from the material of the gate spacers 220. In some embodiments, the inner sidewall spacers 250a are silicon nitride. The inner sidewall spacers 250a may fully fill the recesses 133a and 160a as shown in FIG. 18. The dielectric material layer can be formed using CVD, including LPCVD and PECVD, PVD, ALD, or other suitable processes. The etching operations include one or more wet and/or dry etching operations. In some embodiments, the etching is an isotropic etching in some embodiments. Subsequently, a cleaning process is performed on the semiconductor layers 134 of the semiconductor strip 104a to remove native oxide formed thereon. During the cleaning process. In some embodiments, the etchant used in the cleaning process is dilute HF wet solution, or HF/NH$_3$ gas.

Figure 19:
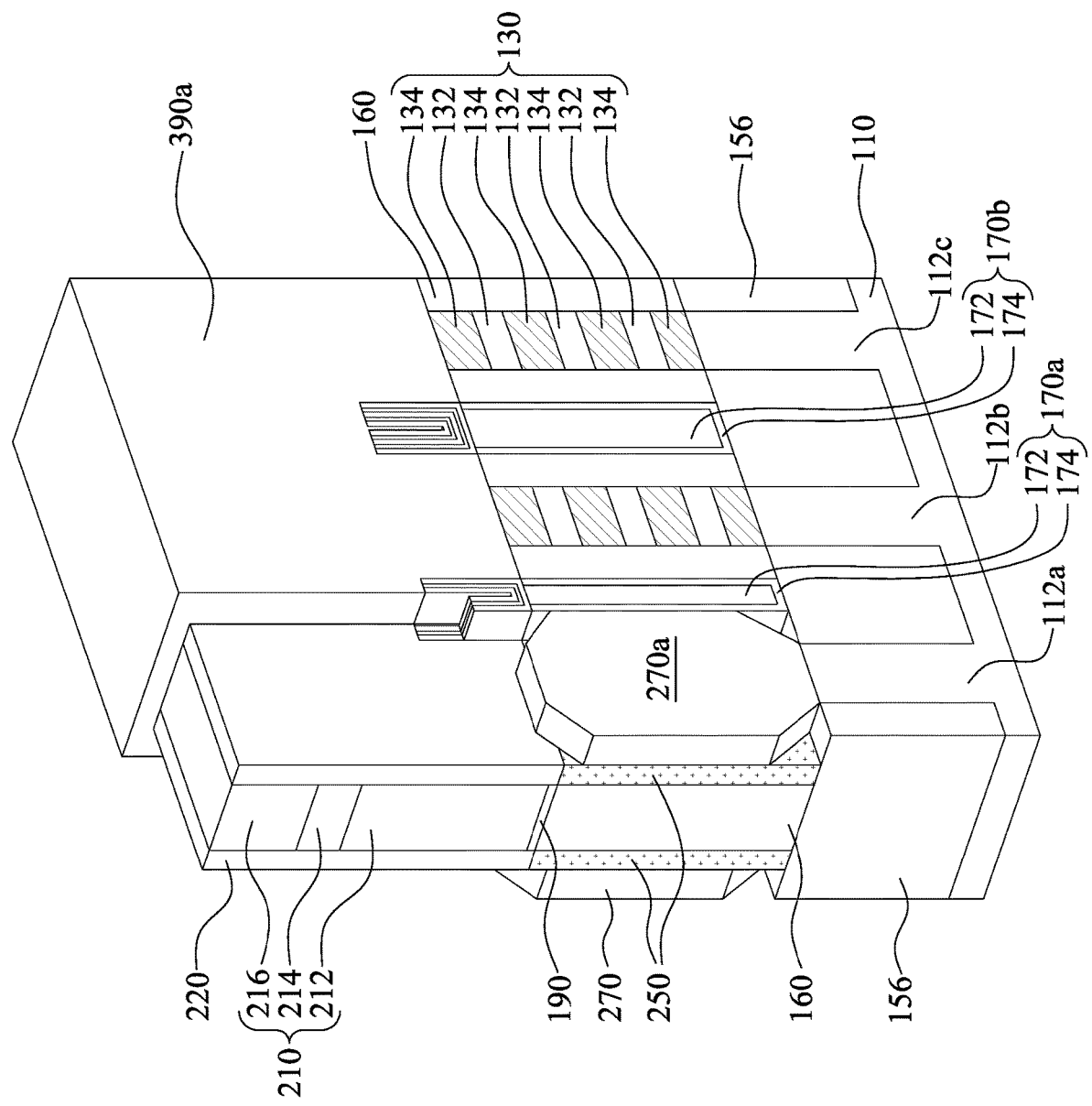

Reference is made to FIG. 19. Epitaxial structures 270a are respectively formed on the base portion 112a of the substrate 110. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). The epitaxial structures 270a have suitable crystallographic orientations (e.g., a (100), (110), or (111) crystallographic orientation). In some embodiments, the epitaxial structures 270a include source/drain epitaxial structures. In some embodiments, where an N-type device is desired, the epitaxial structures 270a may include an epitaxially grown silicon phosphorus (SiP) or silicon carbon (SiC). In some embodiments, where a P-type device is desired, the epitaxial structures 270a may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation (PIII) process, gas and/or solid source diffusion process, other suitable process, or combinations thereof. Then, the patterned mask layer 390a is removed.

Figure 20:
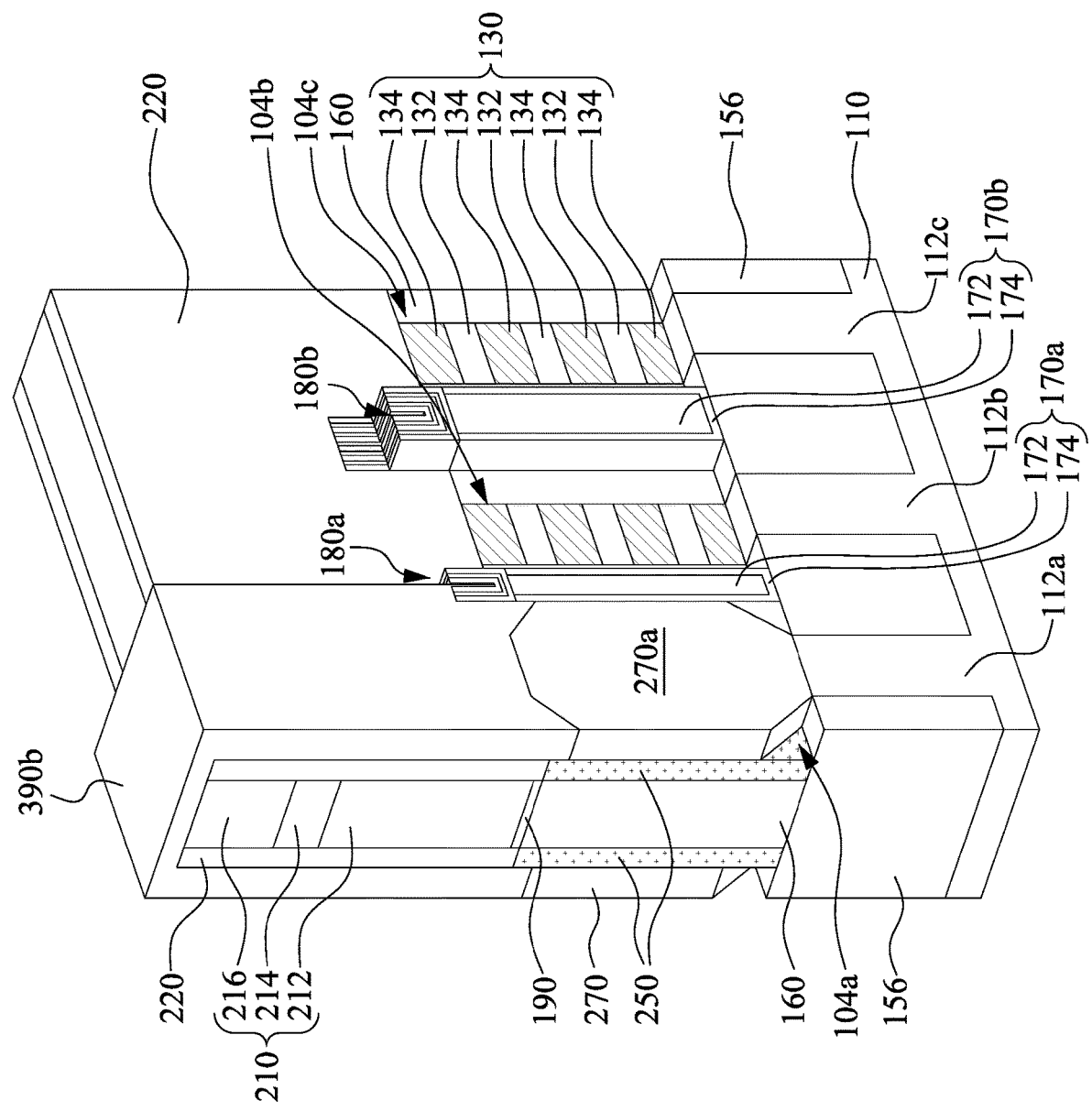

Reference is made to FIG. 20. A patterned mask layer 390b is formed over the semiconductor strip 104a and the epitaxial structures 270a. The semiconductor strips 104b and 104c and the another portion of the semiconductor layers 160 are further patterned through the patterned mask layer 390b and using the dummy gate structure 210 and the gate spacers 220 as masks, such that portions of the isolation structures 156 and the base portions 112b and 112c of the substrate 110 are exposed. During this etching process, portion of the hard mask structure 180b are recessed at the areas not covered by the patterned mask layer 390b, the dummy gate structure 210, and the gate spacers 220. In some embodiments, the patterning process is performed with an anisotropic dry etch process. In some embodiments, the dry etch process etches the semiconductor strips 104b and 104c and the exposed cladding layers 160 (e.g., Si and SiGe) much faster than etching the hard mask structure 180b (e.g., metal oxides, SiON, and SiOCN). Due to this etch selectivity, the dry etch process patterns the semiconductor strips 104b and 104c and the exposed cladding layers 160 vertically without complete etching the hard mask structure 180b. In FIG. 20, portions of the hard mask structure 180b covered by patterned mask layer 390b, the dummy gate structure 210, and the gate spacers 220 have heights greater than heights of the recessed portion of the hard mask structure 180b.

Figure 21:
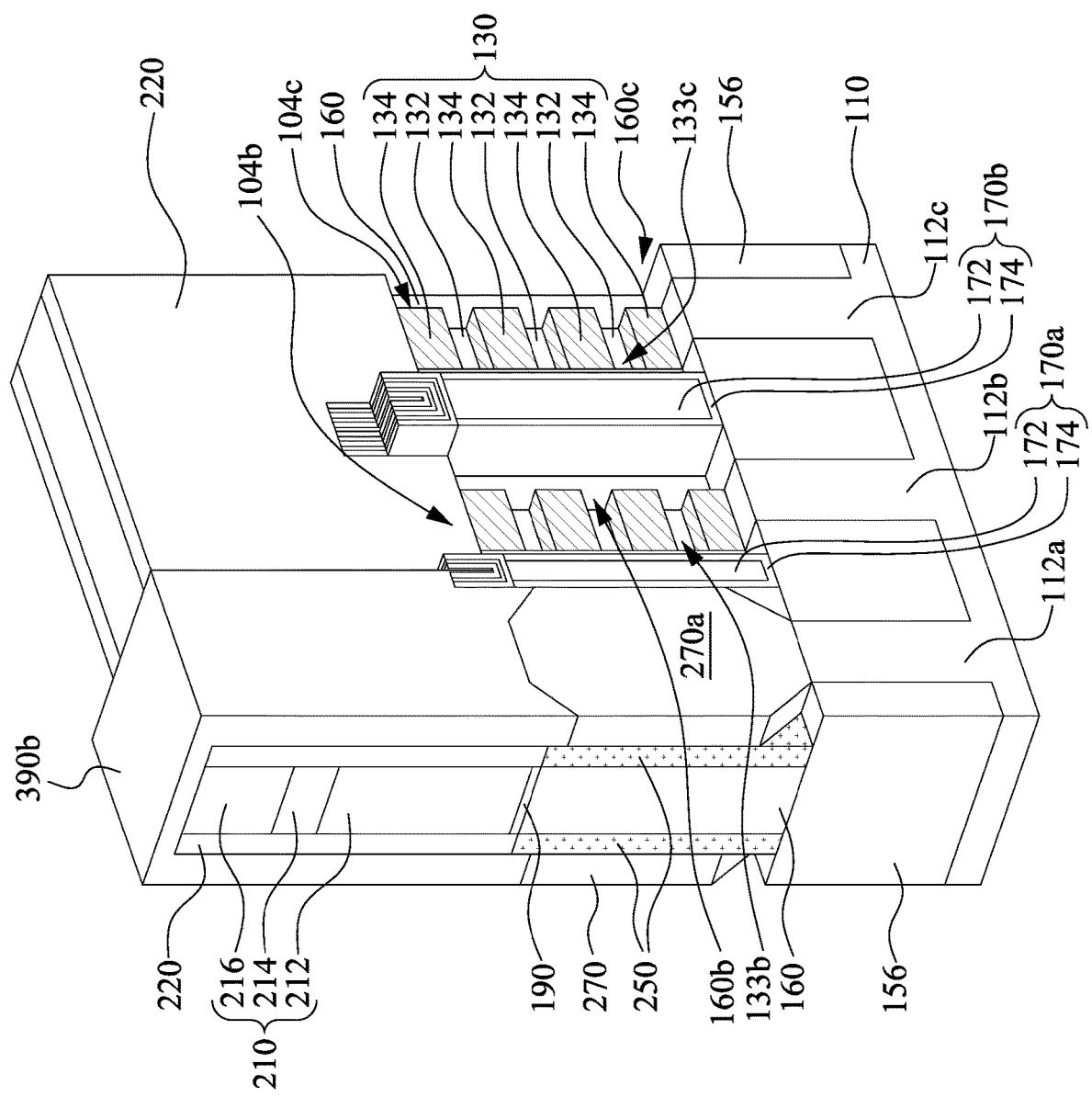

Reference is made to FIG. 21. The semiconductor layers 132 of the semiconductor strips 104b and 104c and the cladding layers 160 adjacent to the semiconductor strips 104b and 104c are horizontally recessed (etched) so that edges of the semiconductor layers 132 of the semiconductor strips 104b and 104c and the cladding layers 160 adjacent to the semiconductor strips 104b and 104c are located substantially below the gate spacers 220 and recesses 133b, 133c, 160b, and 160c are formed. The etching of the semiconductor layers 132 and the cladding layers 160 includes wet etching and/or dry etching. A wet etchant such as a tetramethylammonium hydroxide (TMAH) solution can be used to selectively etch the semiconductor layers 132 and the cladding layers 160.

Figure 22:
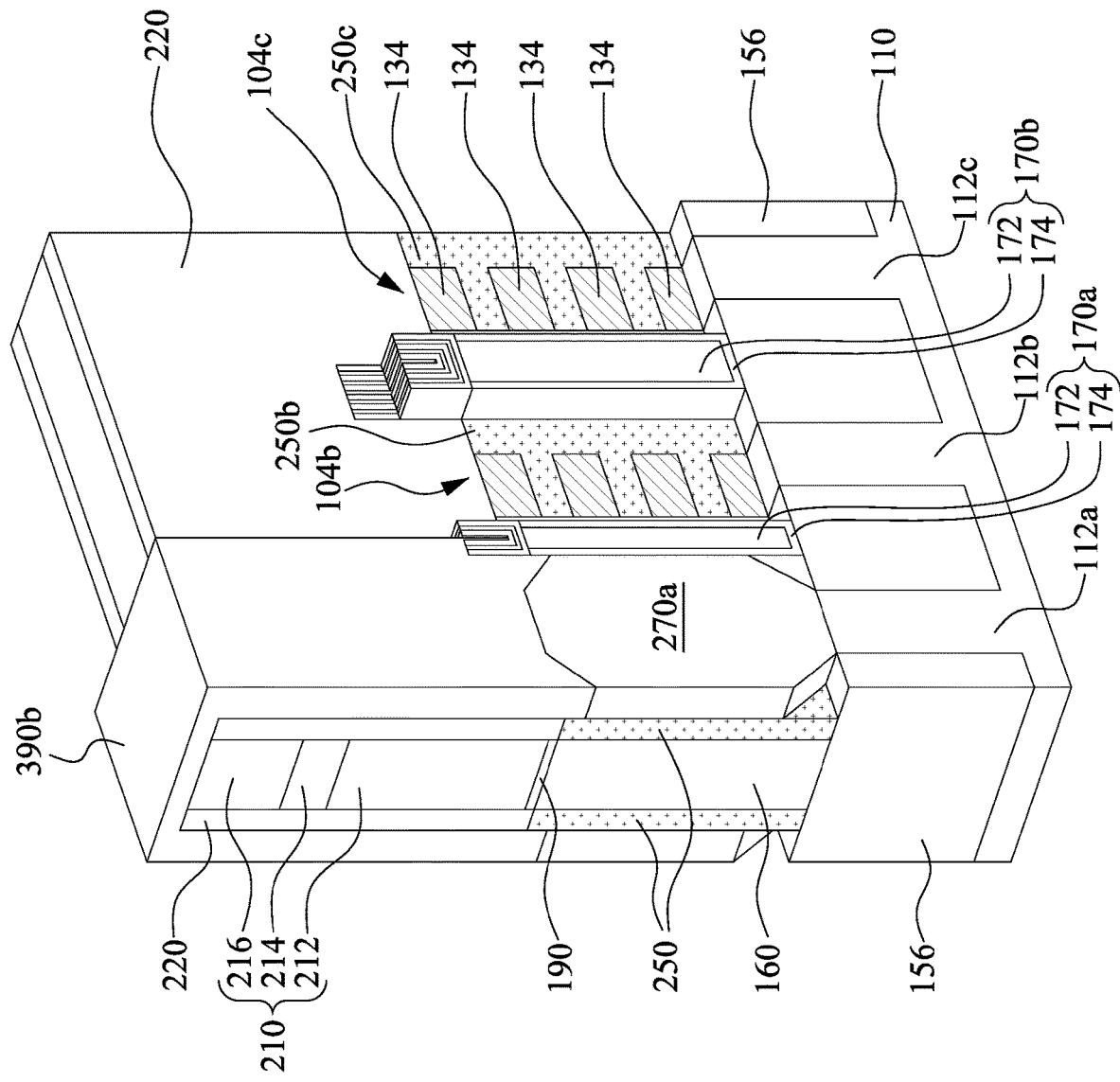

Reference is made to FIG. 22. Inner sidewall spacers 250c and 250c are respectively formed in the recesses 133b, 133c, 160b, and 160c (see FIG. 21) of the semiconductor layers 132 of the semiconductor strips 104b and 104c and the cladding layers 160 adjacent to the semiconductor strips 104b and 104c. For example, a dielectric material layer is formed over the structure of FIG. 17, and one or more etching operations are performed to form the inner sidewall spacers 250b and 250c. In some embodiments, the inner sidewall spacers 250b and 250c includes a silicon nitride-based material, such as SiN, SiON, SiOCN or SiCN and combinations thereof and is different from the material of the gate spacers 220. In some embodiments, the inner sidewall spacers 250b and 250c are silicon nitride. The inner sidewall spacers 250b and 250c may fully fill the recesses 133b, 133c, 160b, and 160c as shown in FIG. 21. The dielectric material layer can be formed using CVD, including LPCVD and PECVD, PVD, ALD, or other suitable processes. The etching operations include one or more wet and/or dry etching operations. In some embodiments, the etching is an isotropic etching in some embodiments. Subsequently, a cleaning process is performed on the semiconductor layers 134 of the semiconductor strips 104b and 104c to remove native oxide formed thereon. During the cleaning process. In some embodiments, the etchant used in the cleaning process is dilute HF wet solution, or HF/NH$_3$ gas.

Figure 23:
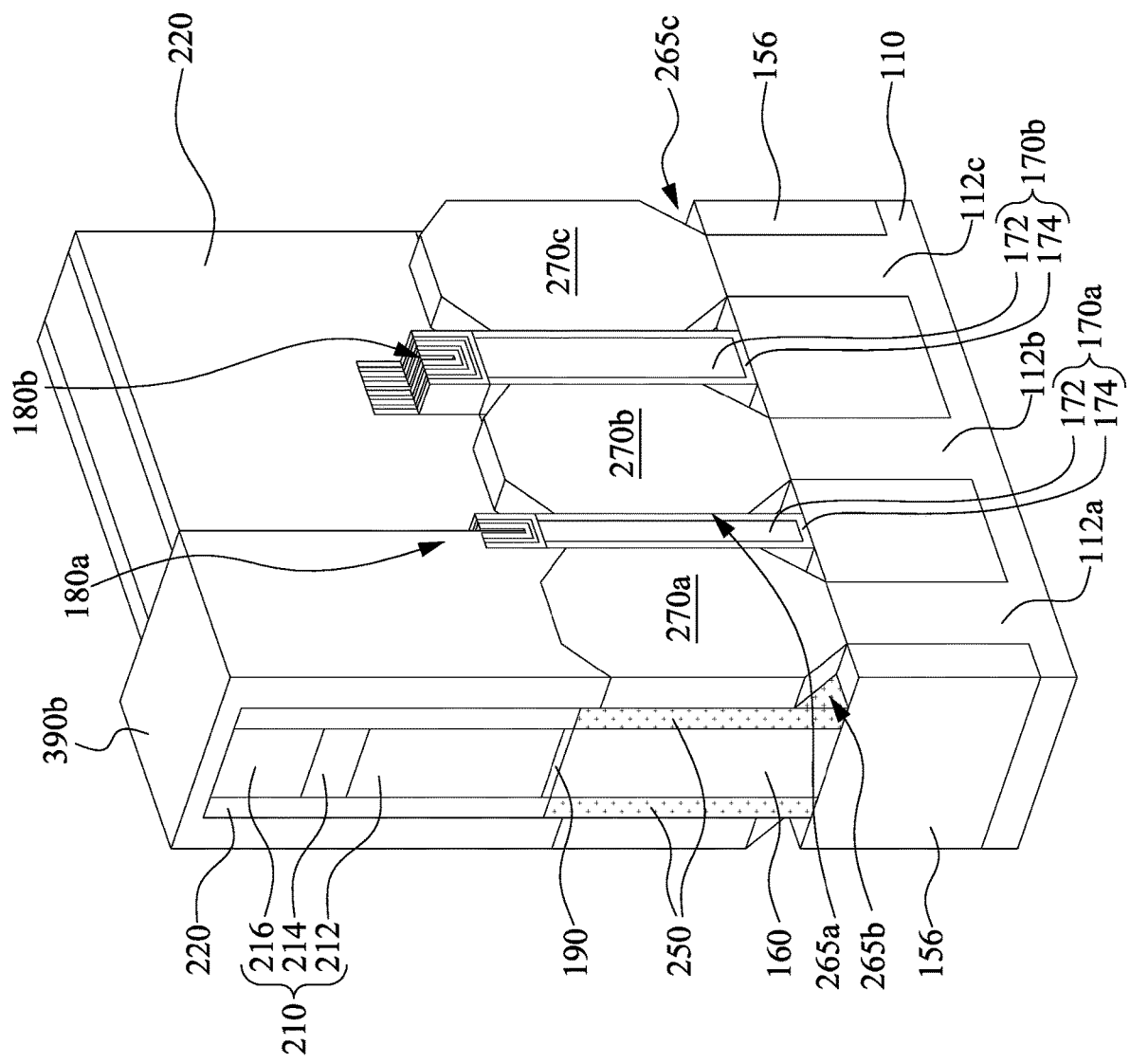

Reference is made to FIG. 23. Epitaxial structures 270b and 270c are respectively formed on the base portions 112b and 112c of the substrate 110. The semiconductor materials include a single element semiconductor material, such as germanium (Ge) or silicon (Si), compound semiconductor materials, such as gallium arsenide (GaAs) or aluminum gallium arsenide (AlGaAs), or a semiconductor alloy, such as silicon germanium (SiGe) or gallium arsenide phosphide (GaAsP). The epitaxial structures 270b and 270c have suitable crystallographic orientations (e.g., a (100), (110), or (111) crystallographic orientation). In some embodiments, the epitaxial structures 270b and/or the epitaxial structures 270c include source/drain epitaxial structures. In some embodiments, where an N-type device is desired, the epitaxial structures 270b and/or the epitaxial structures 270c may include an epitaxially grown silicon phosphorus (SiP) or silicon carbon (SiC). In some embodiments, where a P-type device is desired, the epitaxial structures 270a may include an epitaxially grown silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes. Desired p-type or n-type impurities may be, or may not be, doped while the epitaxial process. The doping may be achieved by an ion implantation process, plasma immersion ion implantation (PIII) process, gas and/or solid source diffusion process, other suitable process, or combinations thereof. Then, the patterned mask layer 390a is removed.

The dummy fin structures 170a and 170b are configured to limit the space for epitaxially growing the epitaxial structures 270a, 270b, and 270c. As a result, the epitaxial structures 270a, 270b, and 270c are confined through the dummy fin structures 170a and 170b. This can be used to produce any desirable size of the epitaxial structures 270a, 270b, and 270c, particularly small epitaxial structures 270a, 270b, and 270c for reducing parasitic capacitances. Further, air gaps 265a may be formed under the epitaxial structures 270a, 270b, and 270c. For example, the air gap 265a, 265b, and 265c is defined by the epitaxial structure 270a, 270b, and 270c, the dummy fin structures 170a and 170b, and the isolation structure 156. In some embodiments, the epitaxial structures 270a, 270b, and 270c are in contact with the dummy fin structures 170a and 170b.

Figure 24:
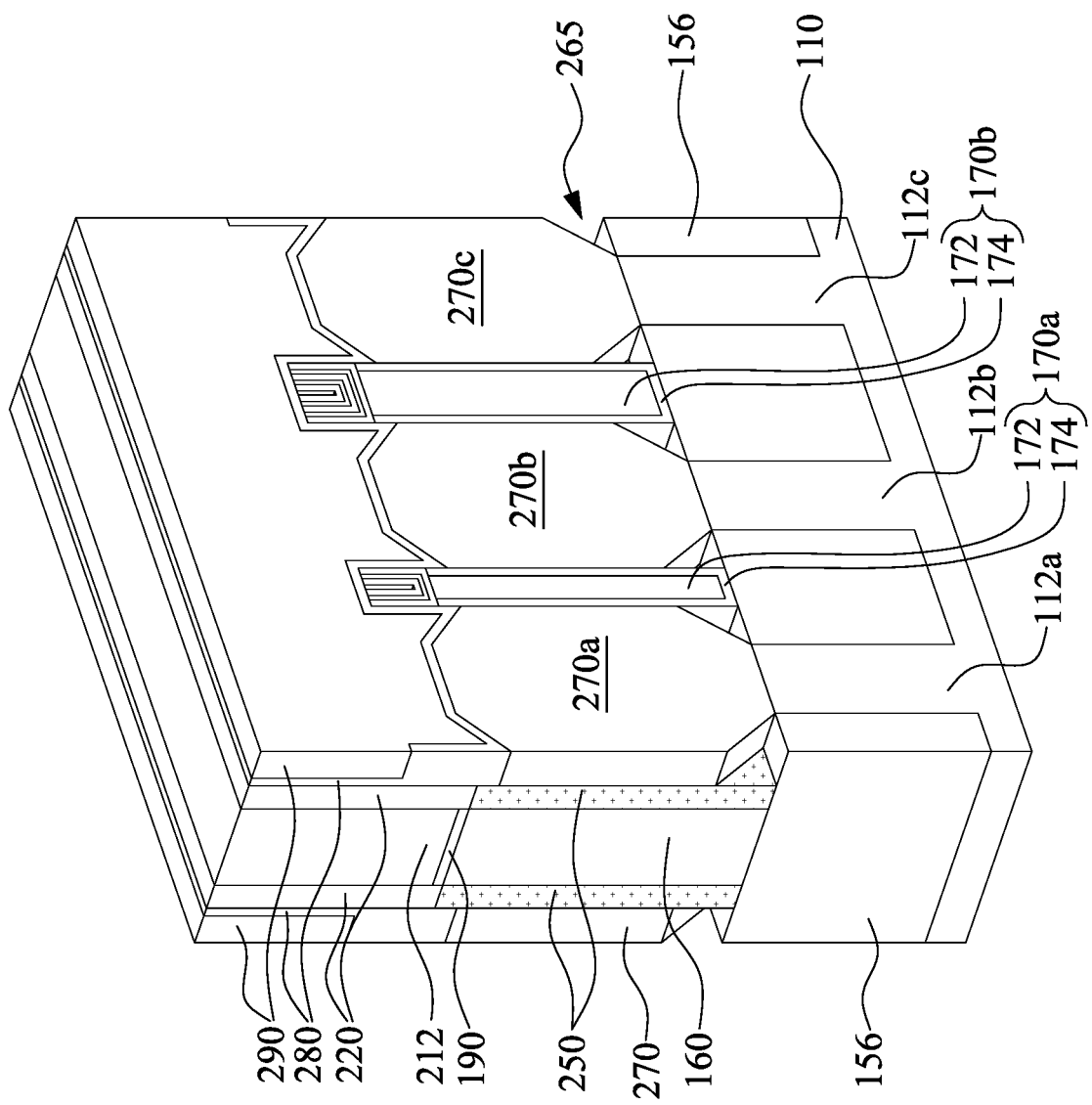

Returning to FIG. 1B, the method M then proceeds to block S111 where a contact etch stop layer (CESL) is conformally formed over the substrate and an interlayer dielectric (ILD) is then formed on the CESL. With reference to FIG. 24, in some embodiments of block S111, a contact etch stop layer (CESL) 280 is conformally formed over the structure of FIG. 23. In some embodiments, the CESL 280 can be a stressed layer or layers. In some embodiments, the CESL 280 has a tensile stress and is formed of $Si_3N_4$. In some other embodiments, the CESL 280 includes materials such as oxynitrides. In yet some other embodiments, the CESL 280 may have a composite structure including a plurality of layers, such as a silicon nitride layer overlying a silicon oxide layer. The CESL 280 can be formed using plasma enhanced CVD (PECVD), however, other suitable methods, such as low pressure CVD (LPCVD), atomic layer deposition (ALD), and the like, can also be used.

An interlayer dielectric (ILD) 290 is then formed on the CESL 280. The ILD 290 may be formed by chemical vapor deposition (CVD), high-density plasma CVD, spin-on, sputtering, or other suitable methods. In some embodiments, the ILD 290 includes silicon oxide. In some other embodiments, the ILD 290 may include silicon oxy-nitride, silicon nitride, compounds including Si, O, C and/or H (e.g., silicon oxide, SiCOH and SiOC), a low-k material, or organic materials (e.g., polymers). After the ILD 290 is formed, a planarization operation, such as CMP, is performed, so that the pad layer 214 and the mask layer 216 (see FIG. 23) are removed and the dummy gate layer 212 is exposed.

Figure 25A:
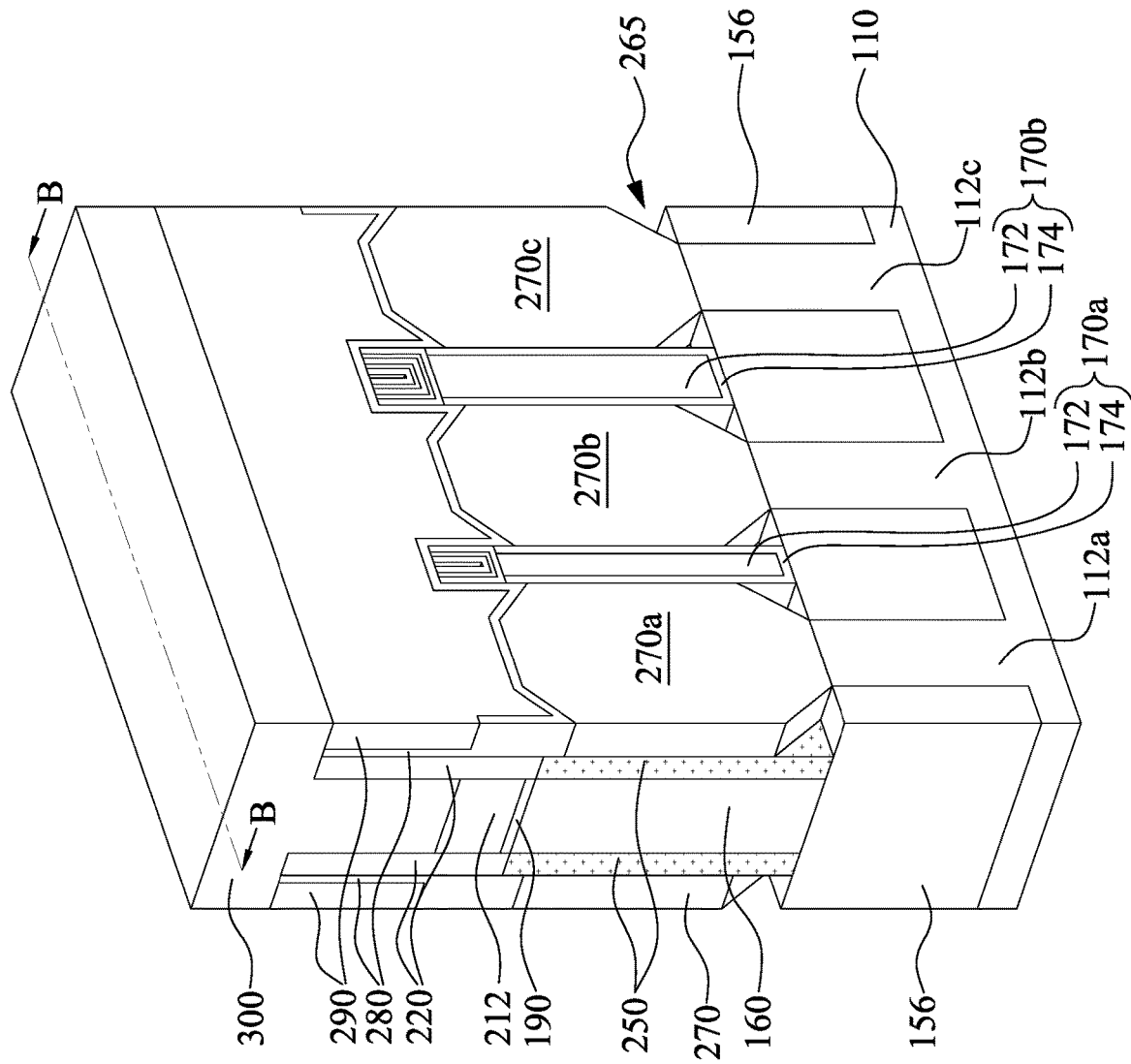
Figure 25B:
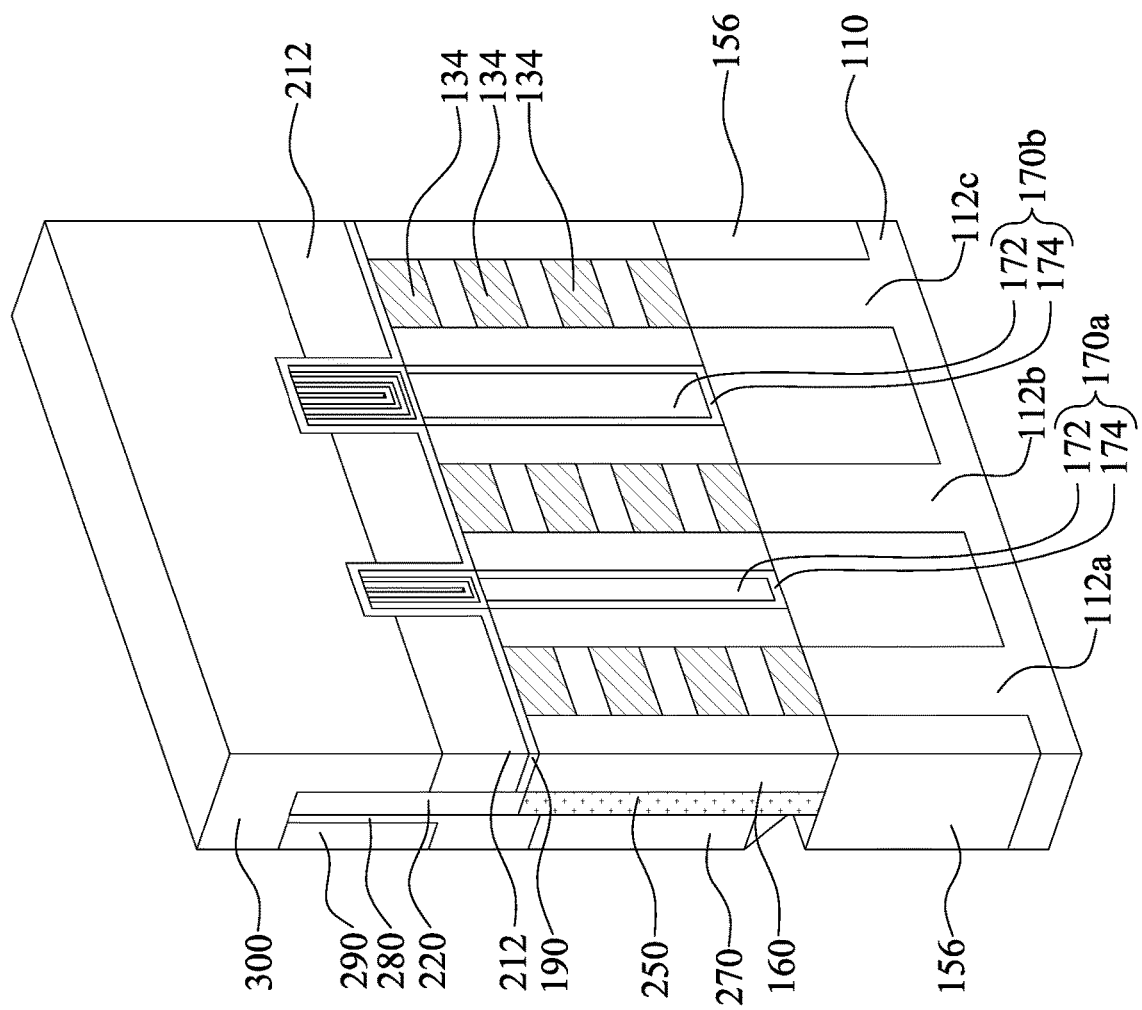
FIGS. 25B, 26B, 27B, 28B, 29B, and 30B are cross-sectional views taken along line B-B in FIGS. 25A, 26A, 27A, 28A, 29A, and 30A.

Returning to FIG. 1B, the method M then proceeds to block S112 where the dummy gate layer is etched back to expose portions of the interfacial layer above the mask layers, and then a resist layer is formed above the etched back dummy gate layer. With reference to FIGS. 25A and 25B, in some embodiments of block S112, the dummy gate layer 212 is etched back to expose portions of the interfacial layer 190 above the hard mask structure 180a and 180b. Subsequently, a resist layer 300 is formed above the etched back dummy gate layer 212. The resist layer 300 covers the dummy gate layer 212, the interfacial layer 190, the CESL 280, and the ILD 290. In some embodiments, the resist layer 300.

Figure 26A:
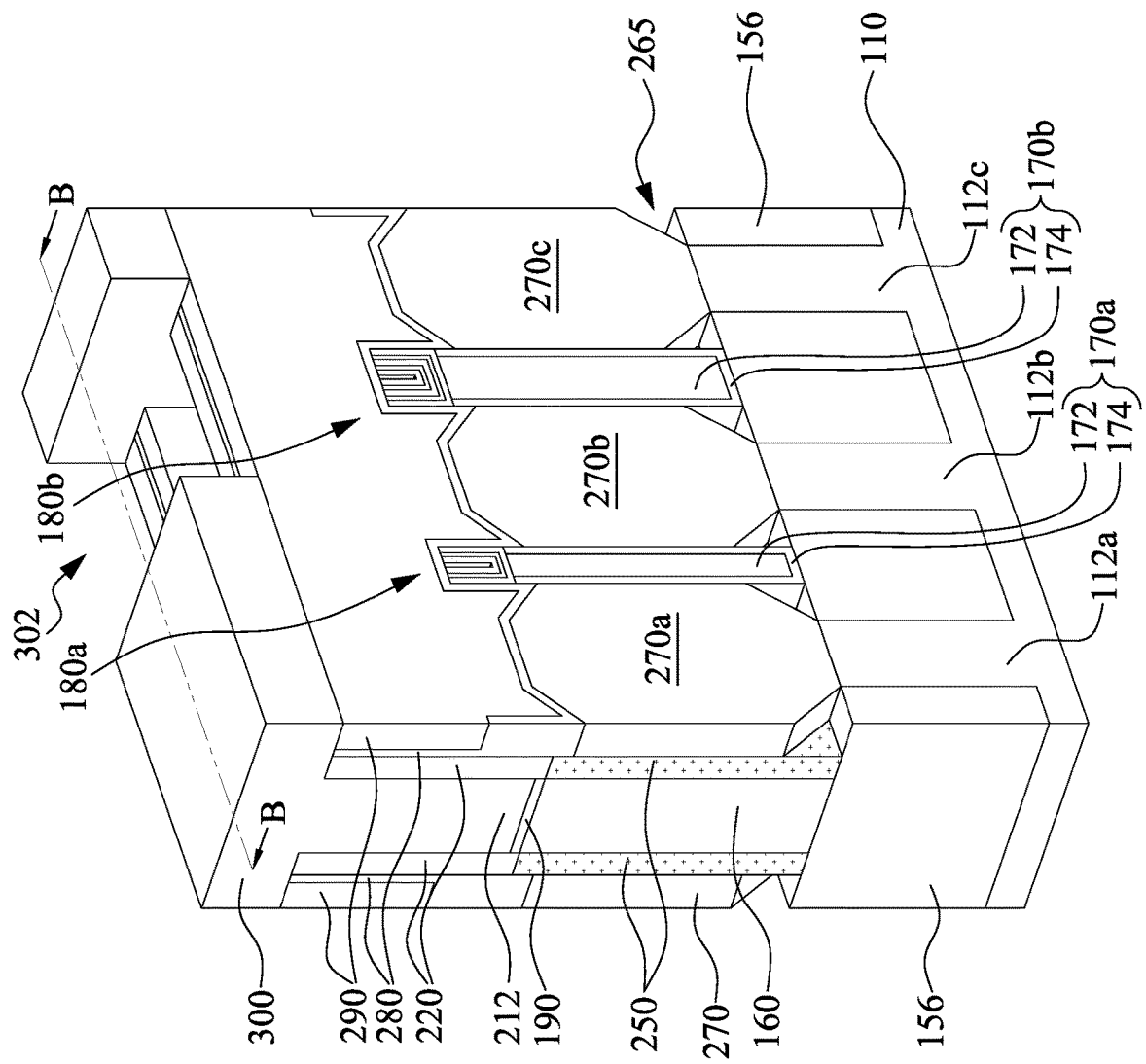
Figure 26B:
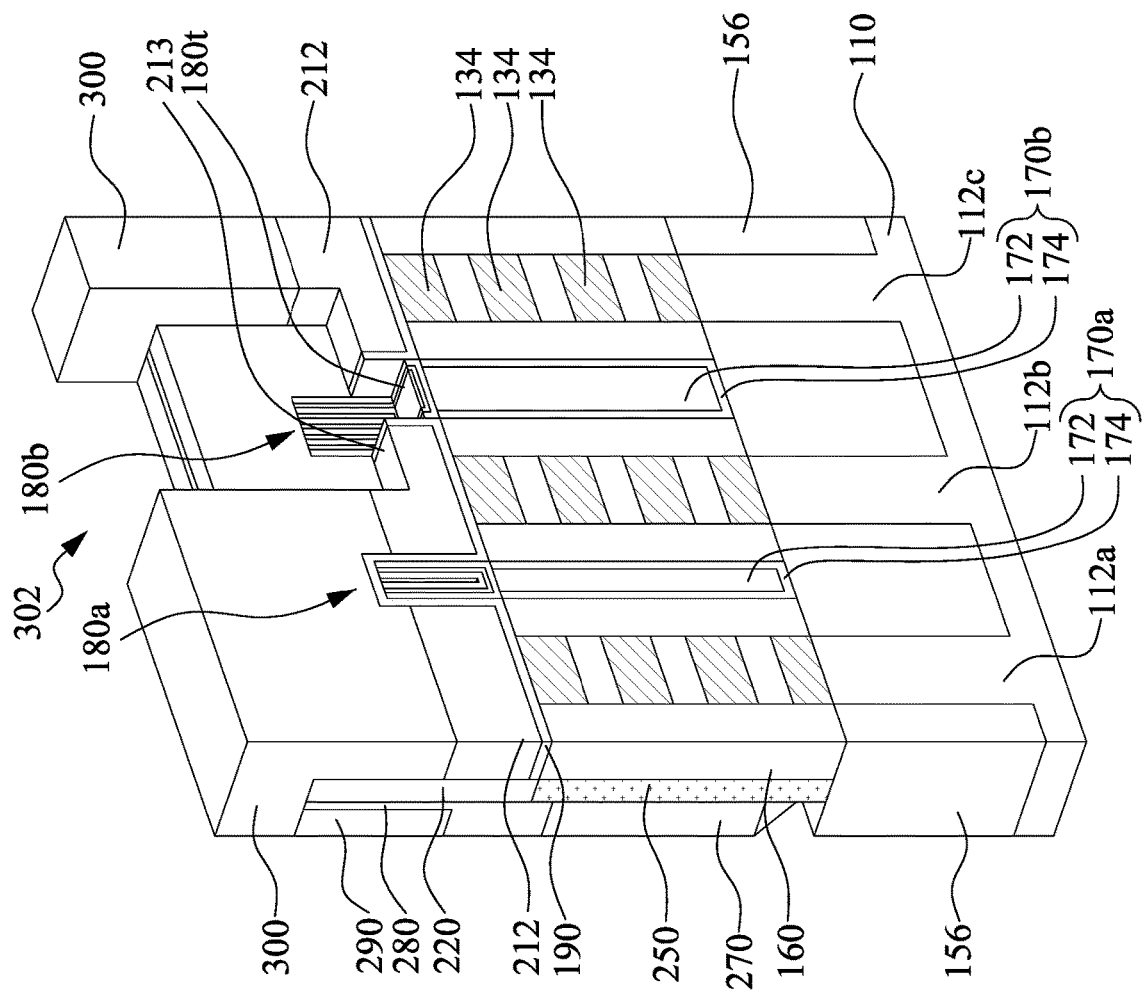

Returning to FIG. 1B, the method M then proceeds to block S113 where the hard mask structure is recessed. With reference to FIGS. 26A and 26B, in some embodiments of block S113, the resist layer 300 is patterned to form an opening 302 therein, and the opening 302 exposes a portion of the interfacial layer 190 above the hard mask structure 180b and a portion of the dummy gate layer 212. Another of the hard mask structure 180a is still covered by the resist layer 300. Next, one or more etching processes are performed to recess the hard mask structure 180b and the exposed portion of the dummy gate layer 212. For example, the exposed portion of the interfacial layer 190 is etched to expose the hard mask structure 180b, and the exposed hard mask structure 180b is further recessed. During the etching processes, the exposed portion of the dummy gate layer 212 is also recessed as shown in FIG. 26B. Due to the difference etching rate among the materials, the top surface 213 of the recessed portion of the dummy gate layer 212 is not level with the top surface 180t of the recessed portion of the hard mask structure 180b. For example, the top surface 213 is higher than the top surface 180t.

Figure 27A:
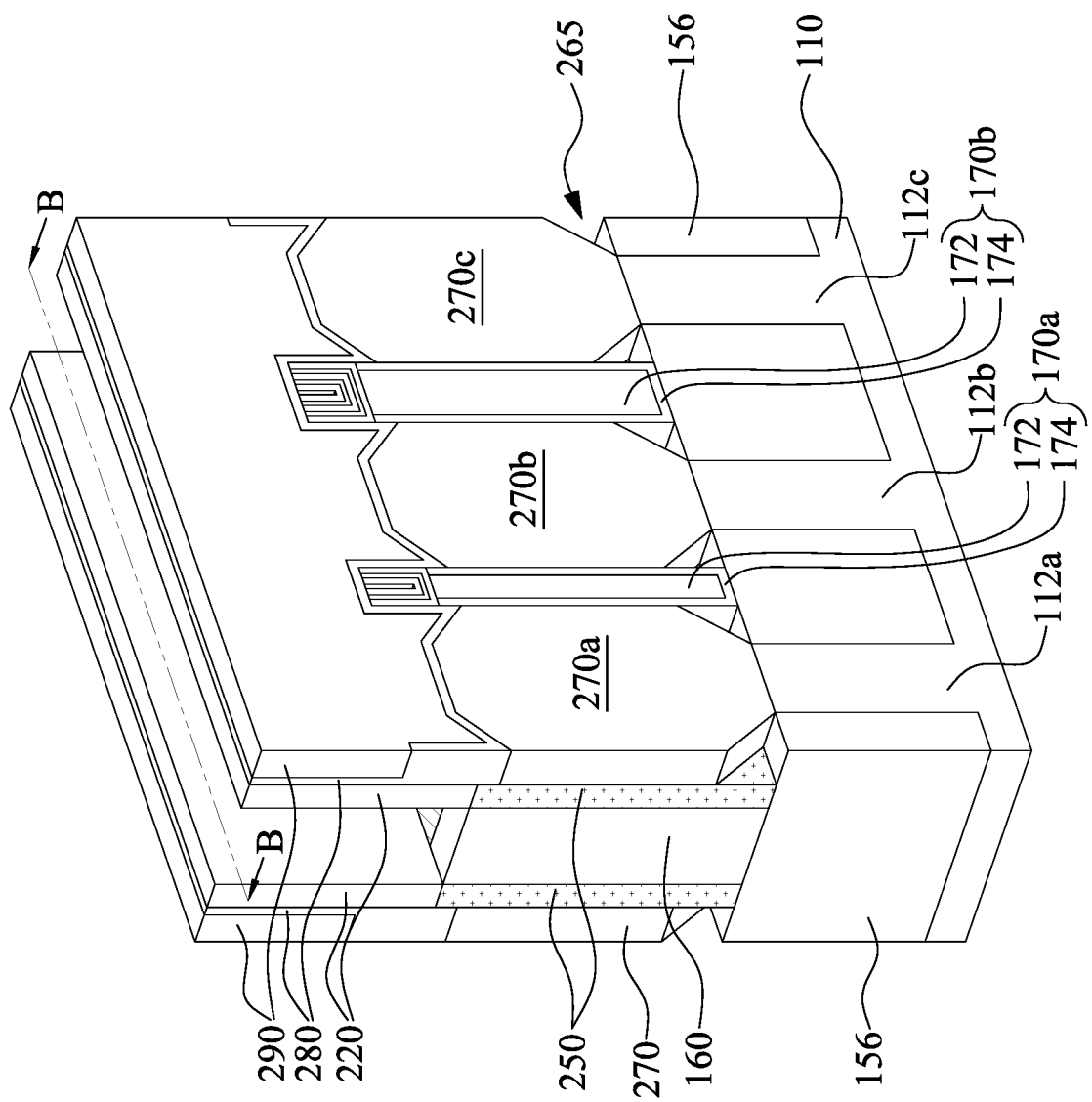
Figure 27B:
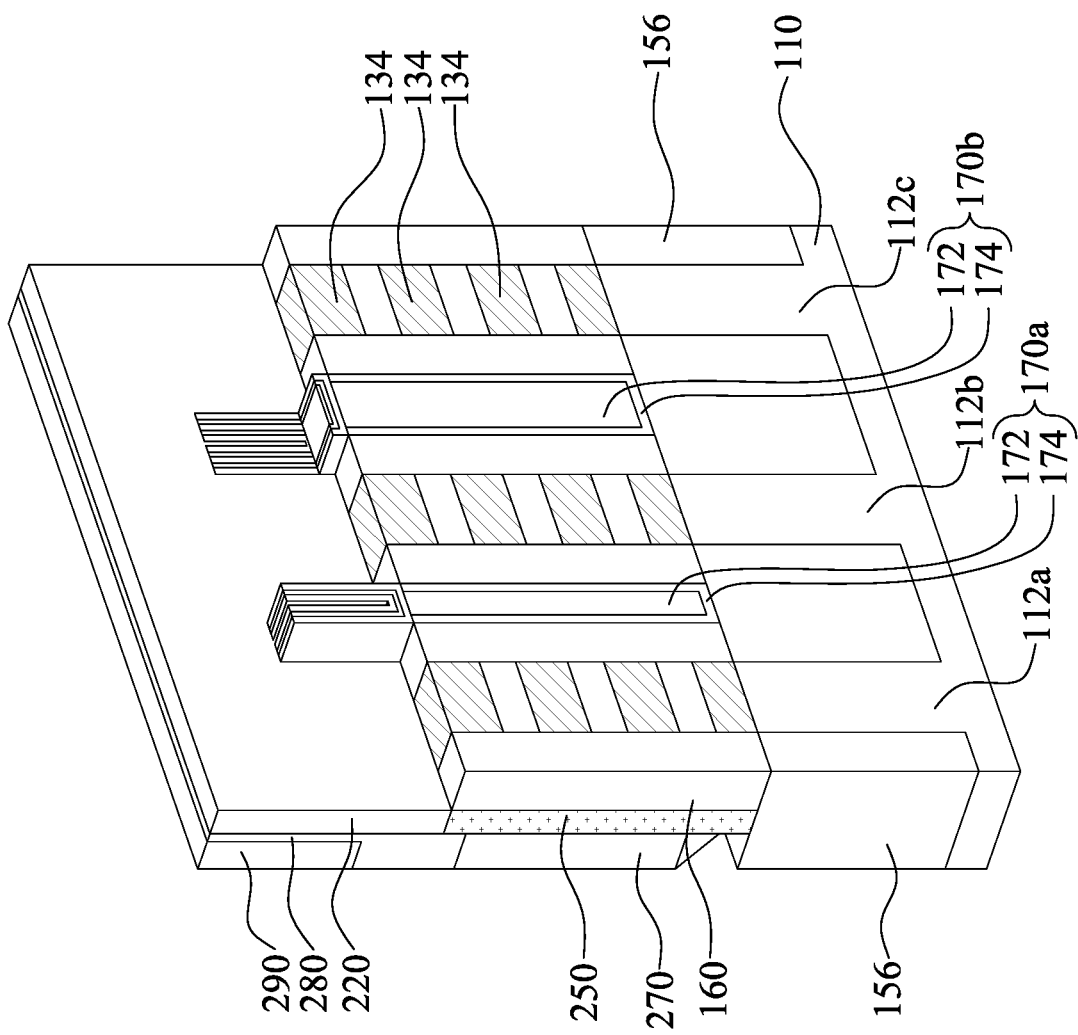

Returning to FIG. 1B, the method M then proceeds to block S114 where the resist layer, the dummy gate layer, and the interfacial layer are removed. With reference to FIGS. 27A and 27B, in some embodiments of block S114, the resist layer 300 (see FIGS. 26A and 26B) may be stripped by, for example, an ashing process, such as a plasma ashing process using $O_2$ or another stripping process, and a cleaning process, such as a wet dip in dilute hydrofluoric acid or an organic chemical, may be performed to remove any contaminants from the surface of the dummy gate layer 212. The dummy gate layer 212 and the interfacial layer 190 (see FIG. 26B) are then removed, thereby exposing the semiconductor layers 134 and the cladding layers 160. The ILD 290 protects the epitaxial structures 270a, 270b, and 270c during the removal of the dummy gate layer 212. The dummy gate layer 212 can be removed using plasma dry etching and/or wet etching. When the dummy gate layer 212 is polysilicon and the ILD 290 is silicon oxide, a wet etchant such as a TMAH solution can be used to selectively remove the dummy gate layer 212. The dummy gate layer 212 is thereafter removed using plasma dry etching and/or wet etching. Subsequently, the interfacial layer 190 is removed as well. As such, the cladding layers 160 and the topmost semiconductor layers 134 are exposed.

Figure 28A:
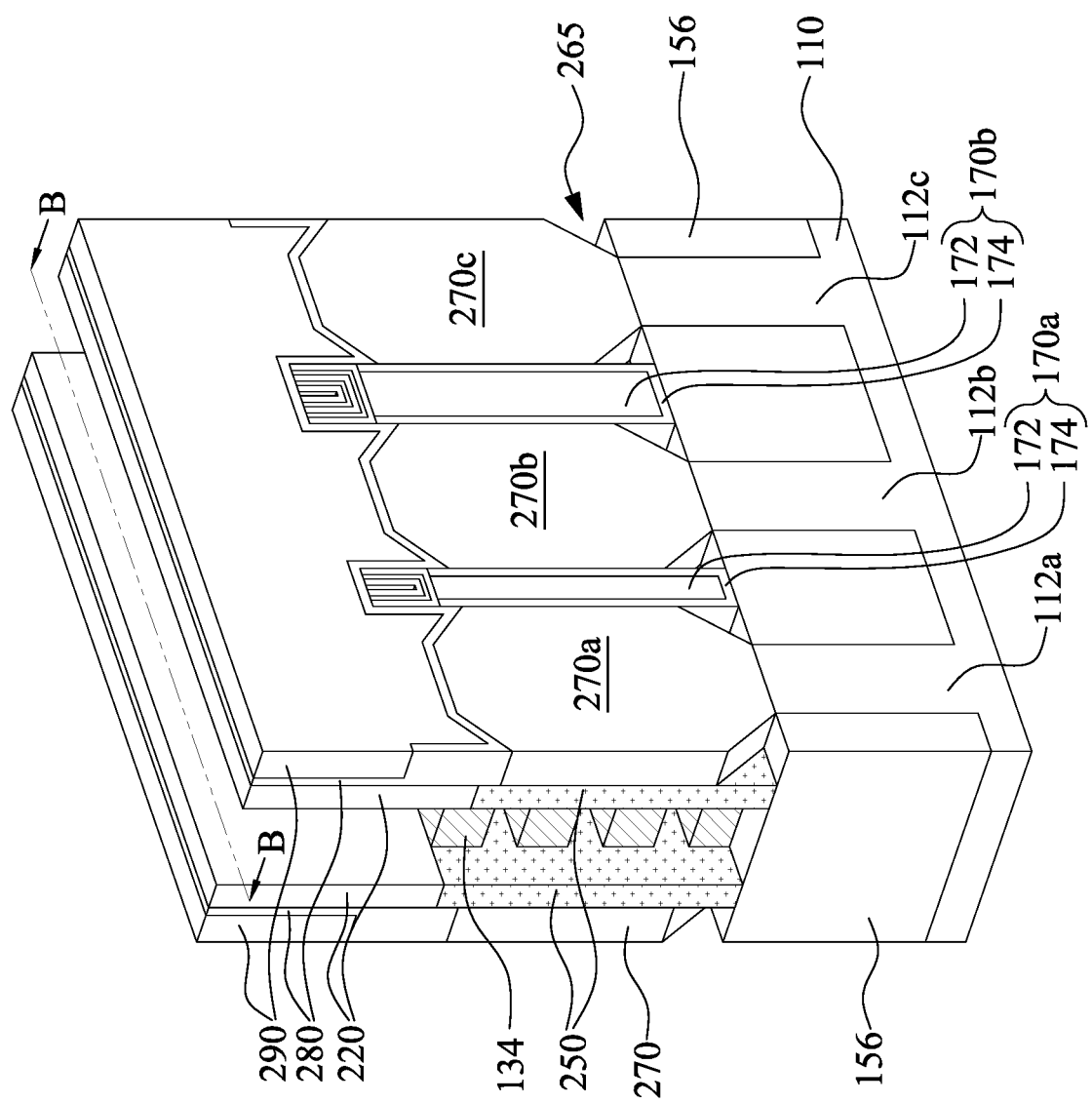
Figure 28B:
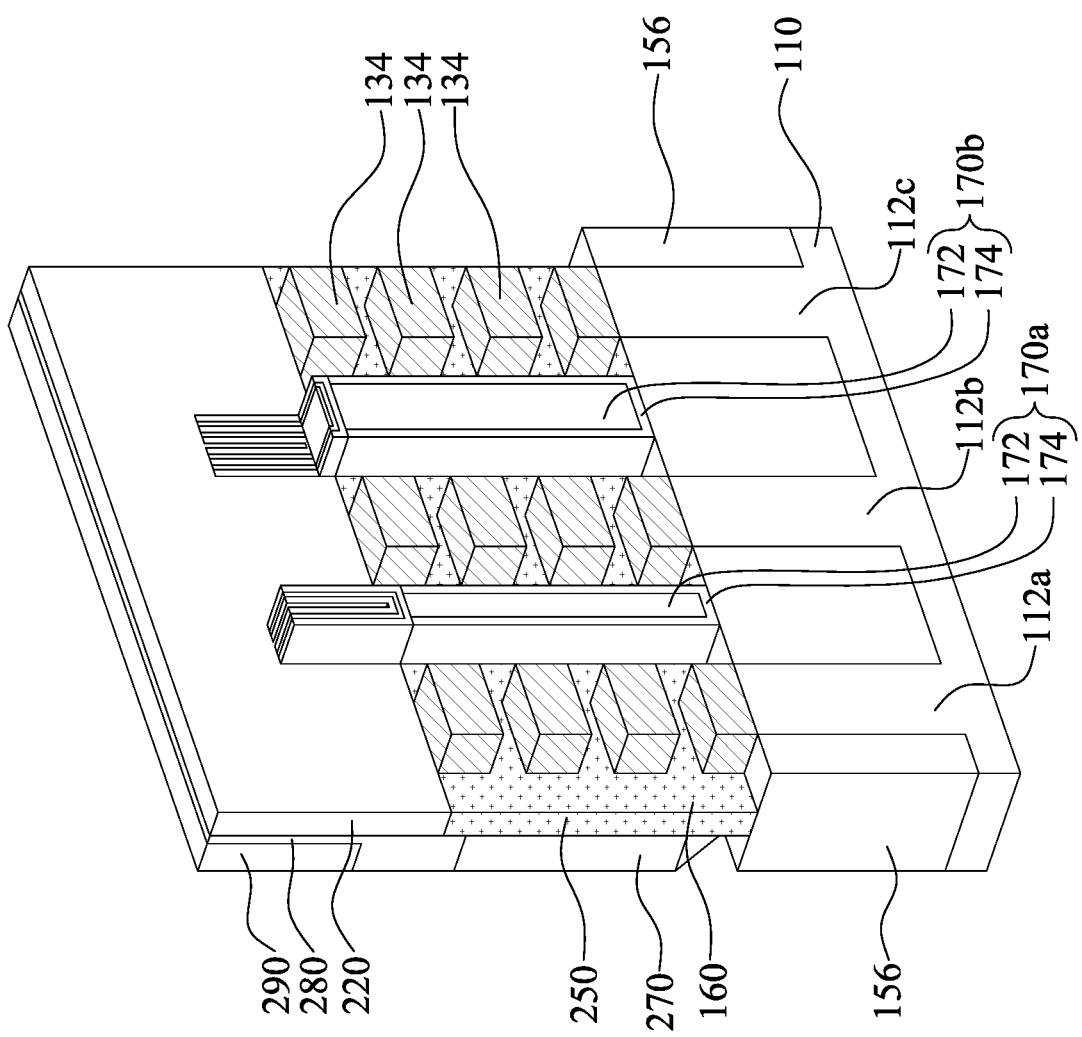

Returning to FIG. 1B, the method M then proceeds to block S115 where the remaining semiconductor layers and the cladding layers are removed. With reference to FIGS. 28A and 28B, in some embodiments of block S115, the remaining semiconductor layers 132 and the cladding layers 160 (see FIGS. 27A and 27B) are removed, thereby forming sheets (or wires or rods or columns) of the semiconductor layers 134. The semiconductor layers 132 and the cladding layers 160 can be removed or etched using an etchant that can selectively etch the semiconductor layers 132 and the cladding layers 160. In some embodiments, the etchant for removing the semiconductor layers 132 and the cladding layers 160 is $F_2$ (Fluorine).

Figure 29A:
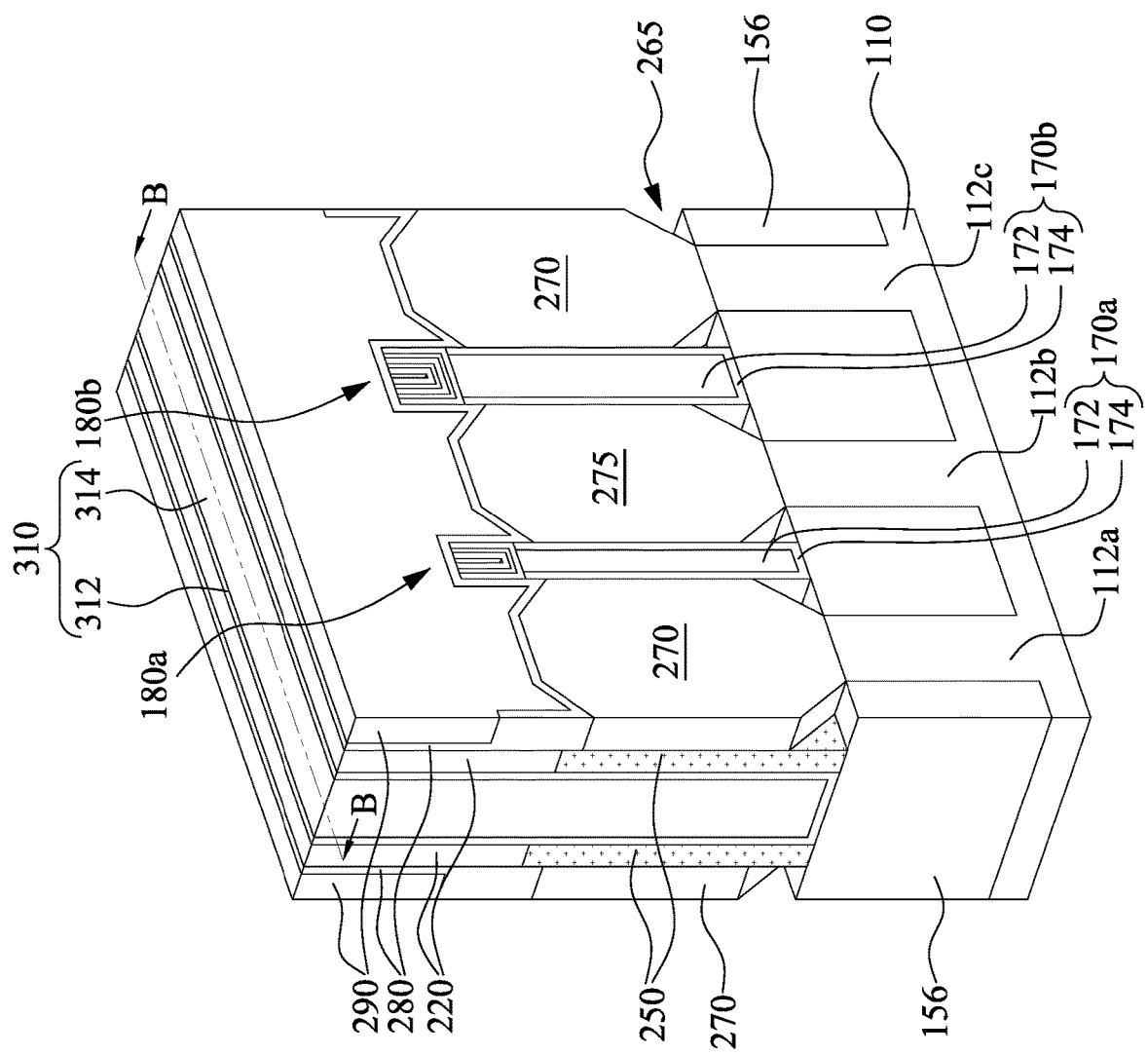
Figure 29B:
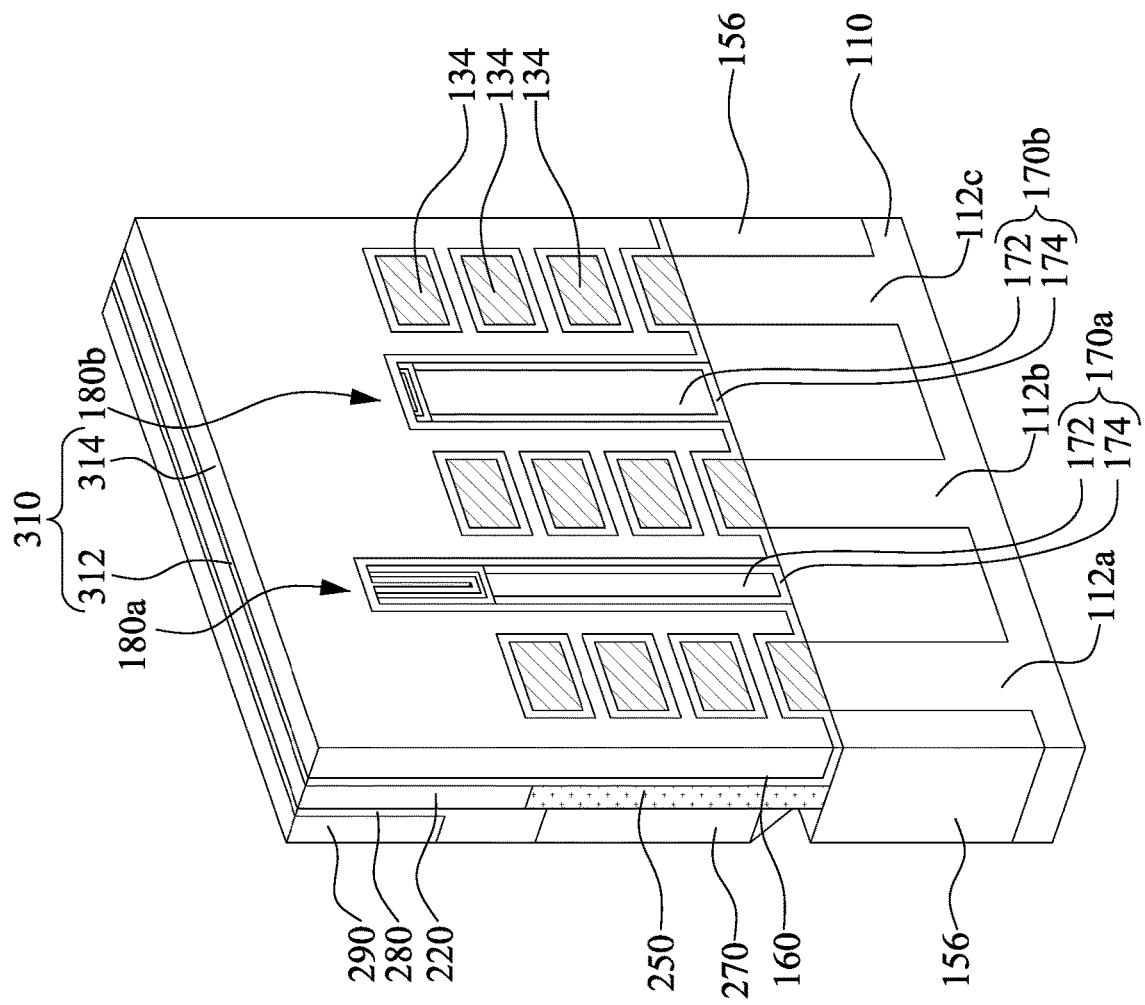

Returning to FIG. 1B, the method M then proceeds to block S116 where a gate structure is formed and/or filled between the gate spacers or the inner sidewall spacers. With reference to FIGS. 29A and 29B, in some embodiments of block S116, a gate structure 310 is formed and/or filled between the gate spacers 220 or the inner sidewall spacers 250. That is, the gate structure 310 encircles (wraps) the semiconductor layers 134. The gate spacers 220 are disposed on opposite sides of the gate structure 310. The gate structure 310 includes a gate dielectric layer 312 and a gate electrode 314. The gate electrode 314 includes one or more work function metal layer (s) and a filling metal. The gate dielectric layer 312 is conformally formed. That is, the gate dielectric layer 312 is in contact with the isolation structures 156, the semiconductor layers 134, the dummy fin structures 170a and 170b, and the hard mask structures 180a and 180b. Furthermore, the gate dielectric layer 312 surrounds the semiconductor layers 134, and spaces between the semiconductor layers 134 are still left after the deposition of the gate dielectric layer 312. In some embodiments, the gate dielectric layer 312 includes a high-k material (k is greater than 7) such as hafnium oxide ($HfO_2$), zirconium oxide ($ZrO_2$), lanthanum oxide ($La_2O_3$), hafnium aluminum oxide ($HfAlO_2$), hafnium silicon oxide ($HfSiO_2$), aluminum oxide ($Al_2O_3$), or other suitable materials. In some embodiments, the gate dielectric layer 312 may be formed by performing an ALD process or other suitable process. In some embodiments, the thickness of the gate dielectric layer 312 is in a range of about 10 nm to about 30 nm.

The work function metal layer is conformally formed on the gate dielectric layer 312, and the work function metal layer surrounds the semiconductor layers 134 in some embodiments. The work function metal layer may include materials such as TiN, TaN, TiAlSi, TiSiN, TiAl, TaAl, or other suitable materials. In some embodiments, the work function metal layer may be formed by performing an ALD process or other suitable process.

The filling metal fills the remained space between the gate spacers 220 and between the inner sidewall spacers 250. That is, the work function metal layer(s) is in contact with and between the gate dielectric layer 312 and the filling metal. The filling metal may include material such as tungsten or aluminum. After the deposition of the gate dielectric layer 312 and the gate electrode 314, a planarization process, such as a CMP process, may be then performed to remove excess portions of the gate dielectric layer 312 and the gate electrode 314 to form the gate structure 310.

Figure 30A:
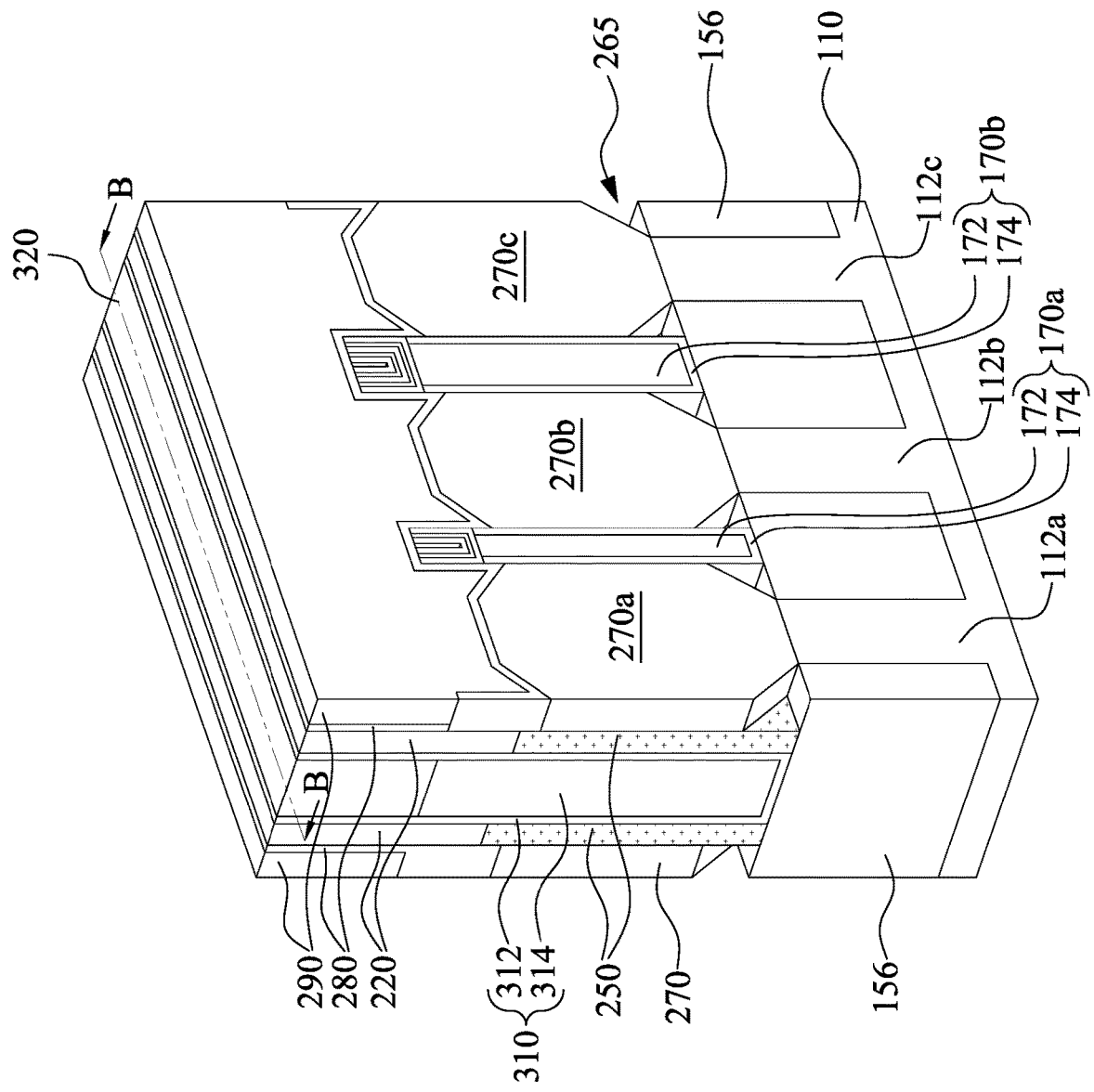
Figure 30B:
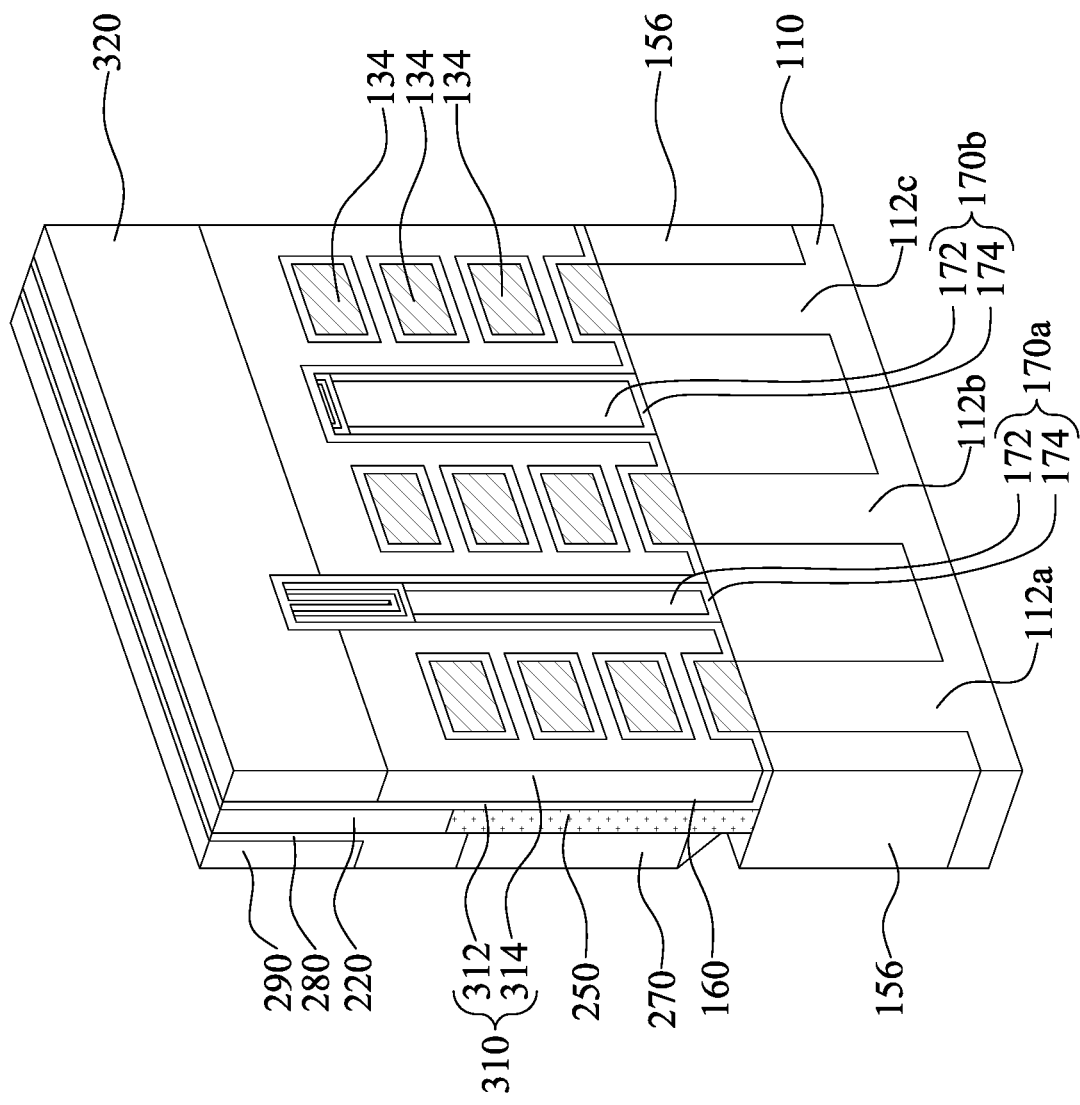

Returning to FIG. 1B, the method M then proceeds to block S117 where a gate electrode of the gate structure is etched back, and then a capping layer is formed over the etched gate electrode. With reference to FIGS. 30A and 30B, in some embodiments of block S117, the gate electrode 314 of the gate structure 310 is etched back to a predetermined level and form a gate trench thereon. As such, a portion of the hard mask structure 180a protrudes from the gate electrode 314 while the hard mask structure 180b is embedded in the gate electrode 314. Then, a capping layer 320 is formed over the etched gate electrode 314 using, for example, a deposition process to deposit a dielectric material over the substrate 110, followed by a CMP process to remove excess dielectric material outside the gate trenches. In some embodiments, the capping layer 320 includes silicon nitride, silicon oxide, silicon oxynitride, SiCN, SiCON, SiOC, or other suitable dielectric material. By way of example, if the capping layer 320 is SiN, the spacer structures 220 and/or the ILD 290 are dielectric materials different from SiN. The capping layer 320 can be used to define self-aligned contact region and thus referred to as SAC structures or a SAC layer. The capping layer 320 is in contact with the gate dielectric layer 312, and a portion of the hard mask structure 180a is embedded in the capping layer 320.

Figure 31:
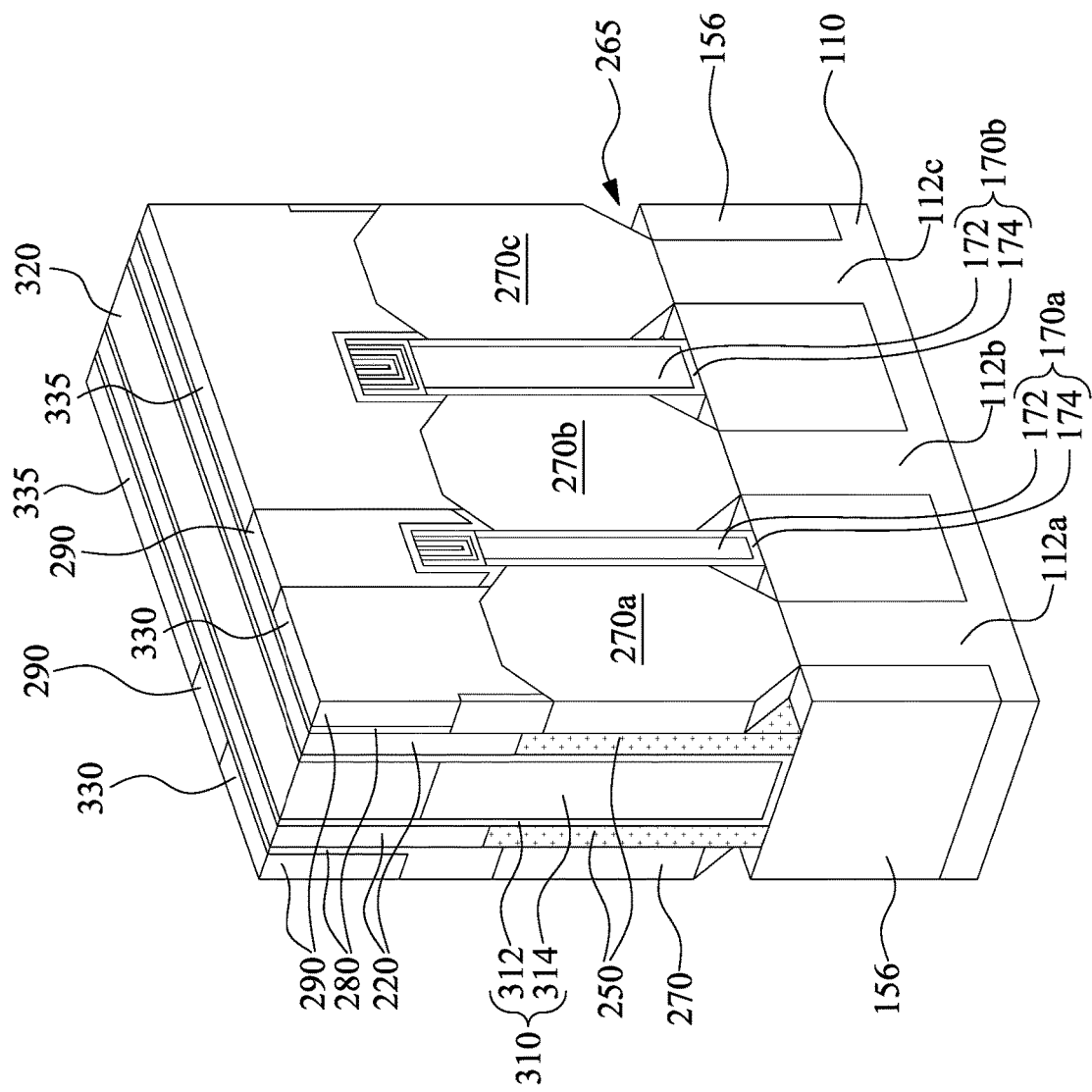

Returning to FIG. 1B, the method M then proceeds to block S118 where contacts are formed to pass through the ILD and land on the epitaxial structures. With reference to FIG. 31, in some embodiments of block S118, the ILD 290 is patterned to form trenches on opposite sides of the gate structure 310 and the capping layer 320, and then the CESL 280 is patterned to expose the epitaxial structures 270a, 270b, and 270c. In some embodiments, multiple etching processes are performed to pattern the ILD 290 and the CESL 280. The etching processes include dry etching process, wet etching process, or combinations thereof. Contacts 330 and 335 are formed in the trenches. As such, the contacts 330 are respectively in contact with the epitaxial structures 270, and the contacts 335 are in contact with the epitaxial structures 270a, 270b, and 270c. As such, the contact 335 interconnects the adjacent epitaxial structures 270a, 270b, and 270c. In some embodiments, the contacts 330 and 335 may be made of metal, such as W, Co, Ru, Al, Cu, or other suitable materials. After the deposition of the contacts 330 and 335, a planarization process, such as a chemical mechanical planarization (CMP) process, may be then performed. As such, a top surface of the contacts 330 and a top surface of the contacts 335 are substantially coplanar. In some embodiments, metal alloy layers (such as silicide) may be formed between the contacts 330 (335) and the epitaxial structures 270 (275). Further, barrier layers may be formed in the trenches 292 before the formation of the contacts 330 and 335. The barrier layers may be made of TiN, TaN, or combinations thereof.

According to the aforementioned embodiments, it can be seen that the present disclosure offers advantages in fabricating semiconductor devices. It is understood, however, that other embodiments may offer additional advantages, and not all advantages are necessarily disclosed herein. The hard mask structure of the present disclosure is formed over the dummy fin structure and has a higher etching resistance than the fin structure having a stack of alternating first and second semiconductor layers. Thus, the hard mask structure can be used to prevent damage to the dummy fin structure therebelow by subsequent processing (e.g., subsequent etching the stack of alternating first and second semiconductor layers to form the epitaxial structures on the etched stack). The hard mask structure includes a crystalline hard mask layer formed over the dummy fin structure and an amorphous hard mask layer formed in the hard mask layer. An advantage of the present disclosure is that the amorphous hard mask layer is used to limit the profile distortion of the crystalline hard mask layer during crystallization to avoid the formation of voids inside the hard mask structure, and thereby improving electrical performance of the semiconductor device.

In some embodiments, a semiconductor device includes a substrate, first and second semiconductor strips, a dummy fin structure, an isolation dielectric, a plurality of first channel layers, a plurality of second channel layers, a gate structure, a plurality of source/drain structures, a crystalline hard mask layer, and a amorphous hard mask layer. The first and second semiconductor strips extend upwardly from the substrate and each has a length extending along a first direction. The dummy fin structure extends upwardly above the substrate and is laterally between the first and second semiconductor strips. The isolation dielectric laterally surrounds the first and second semiconductor strips and a lower portion of the dummy fin structure. The first channel layers extend in the first direction above the first semiconductor strip and are arranged in a second direction substantially perpendicular to the substrate. The second channel layers extend in the first direction above the second semiconductor strip and are arranged in the second direction. The gate structure surrounds each of the first and second channel layers. The source/drain structures are above the first and second semiconductor strips and on either side of the gate structure. The crystalline hard mask layer extends upwardly from the dummy fin structure and has an U-shaped cross section. The amorphous hard mask layer in the crystalline hard mask layer. The amorphous hard mask layer has an U-shaped cross section conformal to the U-shaped cross section of the crystalline hard mask layer.

In some embodiments, a semiconductor device includes a substrate, first and second semiconductor strips, a dummy fin structure, a plurality of first channel layers, a plurality of second channel layers, a gate structure, a plurality of source/drain structures, a first hafnium oxide layer, and a first silicon oxide layer. The first and second semiconductor strips extend upwardly from the substrate and each has a length extending along a first direction. The dummy fin structure extends upwardly above the substrate and is laterally between the first and second semiconductor strips. The first channel layers extend in the first direction above the first semiconductor strip and are arranged in a second direction substantially perpendicular to the substrate. The second channel layers extend in the first direction above the second semiconductor strip and are arranged in the second direction. The gate structure surrounds each of the first and second channel layers. The source/drain structures are above the first and second semiconductor strips and on either side of the gate structure. The first hafnium oxide layer extends upwardly from the dummy fin structure. The first silicon oxide layer is over the dummy fin structure and is laterally surrounded by the first hafnium oxide layer.

In some embodiments, a method for forming a semiconductor device, comprising: forming a pair of fin structures each having a stack of alternating first and second semiconductor layers over a substrate and a hard mark layer over the stack; forming a dummy fin structure laterally between the pair of fin structures and having a top surface in a position lower than the hard mark layers of the stacks; depositing a hafnium oxide layer over the dummy fin structure at a first temperature lower than a first crystallization temperature of the hafnium oxide layer; depositing a silicon oxide layer over the hafnium oxide layer at a second temperature lower than the first crystallization temperature of the hafnium oxide layer; performing a planarization process on the hafnium oxide layer and the silicon oxide layer to expose the hard mark layers of the stacks; annealing the hafnium oxide layer at a third temperature higher than the first crystallization temperature of the hafnium oxide layer and lower than a second crystallization temperature of the silicon oxide layer; after annealing the hafnium oxide layer, removing the hard mark layers of the stacks; removing the first semiconductor layers of the stacks such that the second semiconductor layers of the stacks are suspended over the substrate; and forming a gate structure to surround each of the suspended second semiconductor layers of the stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming a pair of fin structures each having a stack of alternating first and second semiconductor layers over a substrate and a hard mask layer over the stack;
    forming a dummy fin structure laterally between the pair of fin structures and having a top surface in a position lower than the hard mask layers of the stacks;
    depositing a hafnium oxide layer over the dummy fin structure at a first temperature lower than a first crystallization temperature of the hafnium oxide layer;
    depositing a silicon oxide layer over the hafnium oxide layer at a second temperature lower than the first crystallization temperature of the hafnium oxide layer;
    performing a planarization process on the hafnium oxide layer and the silicon oxide layer to expose the hard mask layers of the stacks;
    annealing the hafnium oxide layer at a third temperature higher than the first crystallization temperature of the hafnium oxide layer and lower than a second crystallization temperature of the silicon oxide layer;
    after annealing the hafnium oxide layer, removing the hard mask layers of the stacks;
    removing the first semiconductor layers of the stacks such that the second semiconductor layers of the stacks are suspended over the substrate; and
    forming a gate structure to surround each of the suspended second semiconductor layers of the stacks.

2. The method of claim 1, wherein the hafnium oxide layer and the silicon oxide layer are in-situ deposited.

3. The method of claim 1, wherein the silicon oxide layer has a thinner thickness than the hafnium oxide layer.

4. A method, comprising:
    forming first and second semiconductor strips extending upwardly from a substrate, the first and second semiconductor strips each having a length extending along a first direction;
    forming a dummy fin structure extending upwardly above the substrate and laterally between the first and second semiconductor strips;
    forming an isolation dielectric laterally surrounding the first and second semiconductor strips and a lower portion of the dummy fin structure;
    forming a plurality of first channel layers extending in the first direction above the first semiconductor strip and arranged in a second direction substantially perpendicular to the substrate;
    forming a plurality of second channel layers extending in the first direction above the second semiconductor strip and arranged in the second direction;
    forming a gate structure surrounding each of the first and second channel layers;
    forming a plurality of source/drain structures above the first and second semiconductor strips and on either side of the gate structure;
    forming a first crystalline hard mask layer extending upwardly from the dummy fin structure and having a U-shaped cross section; and
    forming a first amorphous hard mask layer on the first crystalline hard mask layer, wherein the first amorphous hard mask layer has having a U-shaped cross section conformal to the U-shaped cross section of the first crystalline hard mask layer.

5. The method of claim 4, further comprising:
    forming a second crystalline hard mask layer on the first amorphous hard mask layer, wherein the second crystalline hard mask layer has a U-shaped cross section conformal to the U-shaped cross section of the first amorphous hard mask layer.

6. The method of claim 5, further comprising:
forming a second amorphous hard mask layer on the second crystalline hard mask layer, wherein the second amorphous hard mask layer has a U-shaped cross section conformal to the U-shaped cross section of the second crystalline hard mask layer.

7. The method of claim 4, wherein the first crystalline hard mask layer is made of a high-k dielectric material.

8. The method of claim 4, wherein the first crystalline hard mask layer is made of a metal oxide.

9. The method of claim 4, wherein the first amorphous hard mask layer is made of a silicon-containing material.

10. The method of claim 4, wherein the first amorphous hard mask layer is made of $HfO_2$ and the first amorphous hard mask layer is made of $SiO_2$.

11. The method of claim 4, wherein the first amorphous hard mask layer is made of a carbon-containing material.

12. The method of claim 4, wherein the first amorphous hard mask layer is made of an aluminum-containing material.

13. The method of claim 4, wherein the gate structure comprises a high-k dielectric layer extending across and in contact with the first crystalline hard mask layer and the first amorphous hard mask layer.

14. A method, comprising:
forming first and second semiconductor strips extending upwardly from a substrate, the first and second semiconductor strips each having a length extending along a first direction;
forming a dummy fin structure extending upwardly above the substrate and laterally between the first and second semiconductor strips;
forming a plurality of first channel layers extending in the first direction above the first semiconductor strip and arranged in a second direction substantially perpendicular to the substrate;
forming a plurality of second channel layers extending in the first direction above the second semiconductor strip and arranged in the second direction;
forming a gate structure surrounding each of the first and second channel layers;
forming a plurality of source/drain structures above the first and second semiconductor strips and on either side of the gate structure;
forming a first hafnium oxide layer extending upwardly from the dummy fin structure; and
forming a first silicon oxide layer over the dummy fin structure and laterally surrounded by the first hafnium oxide layer, wherein the first hafnium oxide layer is in a crystalline state and the first silicon oxide layer is in an amorphous state.

15. The method of claim 14, wherein the first hafnium oxide layer has a U-shaped cross section and the first silicon oxide layer has a U-shaped cross section conformal to the U-shaped cross section of the first hafnium oxide layer.

16. The method of claim 14, further comprising:
forming a second hafnium oxide layer over the dummy fin structure and laterally surrounded by the first silicon oxide layer.

17. The method of claim 14, further comprising:
prior to forming the first hafnium oxide layer, forming a second silicon oxide layer over the dummy fin structure, the second silicon oxide layer laterally surrounding the first hafnium oxide layer.

18. The method of claim 14, wherein the gate structure comprises a high-k dielectric layer extending across and in contact with the first hafnium oxide layer and the first silicon oxide layer.

19. The method of claim 14, further comprising:
forming a contact etch stop layer over the plurality of source/drain structures and in contact with the first hafnium oxide layer and the first silicon oxide layer.

20. The method of claim 16, wherein the second hafnium oxide layer has a U-shaped cross section conformal to the U-shaped cross section of the first silicon oxide layer.

* * * * *